(12) United States Patent
Mizutani et al.

(10) Patent No.: US 7,521,168 B2
(45) Date of Patent: Apr. 21, 2009

(54) RESIST COMPOSITION FOR ELECTRON BEAM, EUV OR X-RAY

(75) Inventors: Kazuyoshi Mizutani, Shizuoka (JP); Hyou Takahashi, Shizuoka (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 10/361,505

(22) Filed: Feb. 11, 2003

(65) Prior Publication Data

US 2003/0198894 A1 Oct. 23, 2003

(30) Foreign Application Priority Data

Feb. 13, 2002 (JP) .......................... P.2002-035685
Feb. 15, 2002 (JP) .......................... P.2002-038494

(51) Int. Cl.
*G03C 1/73* (2006.01)
*G03F 7/029* (2006.01)
*G03F 7/039* (2006.01)
*G03F 7/20* (2006.01)
*G03F 7/30* (2006.01)

(52) U.S. Cl. ............... 430/270.1; 430/905; 430/922; 430/921; 430/925; 430/325; 430/326; 430/919; 430/920; 430/942; 430/966

(58) Field of Classification Search .............. 430/270.1, 430/325, 326, 945, 966, 905, 921, 922, 925, 430/910, 919, 920

See application file for complete search history.

(56) References Cited

U.S. PATENT DOCUMENTS

| | | | |
|---|---|---|---|
| 5,670,299 A * | 9/1997 | Urano et al. ................ | 430/326 |
| 5,863,699 A * | 1/1999 | Asakawa et al. ......... | 430/270.1 |
| 6,074,801 A | 6/2000 | Iwasa et al. | |
| 6,265,135 B1 * | 7/2001 | Kodama et al. .......... | 430/286.1 |
| 6,521,393 B1 | 2/2003 | Kishimura et al. | |
| 6,656,660 B1 * | 12/2003 | Urano et al. ............. | 430/270.1 |
| 6,673,512 B1 * | 1/2004 | Uenishi et al. .......... | 430/270.1 |
| 2003/0054287 A1 * | 3/2003 | Yasunami et al. ........ | 430/270.1 |

FOREIGN PATENT DOCUMENTS

| | | | |
|---|---|---|---|
| EP | 0 898 201 A1 * | 2/1999 | |
| EP | 1 096 319 A | 5/2001 | |
| EP | 1 109 066 A | 6/2001 | |
| EP | 1 267 210 A2 * | 12/2002 | |
| JP | 2-150848 | 6/1990 | |
| JP | 6-199770 | 7/1994 | |
| JP | 10-97075 | * 4/1998 | |
| JP | 2000-181065 | 6/2000 | |
| JP | 2000-258902 A | 9/2000 | |
| JP | 2001-075283 A | 3/2001 | |
| JP | 2001-235869 A | 8/2001 | |
| JP | 2002-023353 A | 1/2002 | |
| JP | 2002-23376 | * 1/2002 | |
| WO | 02/39186 A | 5/2002 | |
| WO | 02/092559 A1 | 11/2002 | |

OTHER PUBLICATIONS

JPO English abstract for JP 2002-23376.*
Full, formal English translation of JP 2002-23376 (Nakao et al), provided by PTO.*
Derwent English abstract for JP 10-97075 (Uenish et al).*
Machine-assisted English translation of JP 10-97075 (Uenishi et al), provided by JPO.*
Machine-assisted English translation of JP 2001-75283 (Adegawa et al), provided by JPO.*
Machine-assisted English translation for JP 2001-75283 (Adegawa et al), provided by JPO.*

* cited by examiner

*Primary Examiner*—Sin J. Lee
(74) *Attorney, Agent, or Firm*—Sughrue Mion, PLLC

(57) ABSTRACT

A resist composition for an electron beam, EUV or X-ray comprising (A1) a compound that has a reduction potential higher than that of diphenyl iodonium salt and generates an acid upon irradiation of an actinic ray or radiation.

56 Claims, No Drawings

RESIST COMPOSITION FOR ELECTRON BEAM, EUV OR X-RAY

FIELD OF THE INVENTION

The present invention relates to a resist composition suitable for use in an ultra-micro lithographic process, for example, the production of VLSI and high-capacity microchips, and other photofabrication processes. More specifically, the present invention relates to a positive resist composition and negative resist composition capable of forming high precision patterns using an electron beam, EUV or an X-ray.

BACKGROUND OF THE INVENTION

In integrated circuits, the degree of integration has more and more increased and in the production of a semiconductor substrate such as VLSI, processing of super-fine patterns composed of line width having a half-micron or less has been required. In order to satisfy such a requirement, the wavelength of an exposure apparatus used for a photolithography has more and more shortened and at present, the use of a far ultraviolet light and an excimer laser (e.g., XeCl, KrF or ArF) is investigated. Furthermore, the formation of finer patterns by an electron beam or an X-ray has been investigated.

The electron beam lithography is regarded as the next generation pattern formation technique or the pattern formation technique after the next generation, and the development of a positive resist and negative resist having high sensitivity, high resolution and a rectangular profile forming property has been strongly desired.

According to the electron beam lithography, accelerated electron beams collide with atoms constituting a resist material and scatter to supply energy to compounds and as a result, the reaction of resist material occurs, whereby an image is formed. To use highly accelerated electron beams increases the rectilinear propagation of electron beams and decreases the influence of electron scattering so that it makes possible the formation of pattern having high resolution, rectangular profile and excellent edge roughness. On the other hand, however, the transmittance of electron beam increases, resulting in decrease in sensitivity. Thus, a trade off relation between the sensitivity and the resolution, resist profile and edge roughness exists in the electron beam lithography, and it is a problem to be solved to fulfill requirements for both the sensitivity and the resolution, resist profile and edge roughness. EUV lithography and X-ray lithography also have the same problem.

With respect to the positive resist for electron beam or X ray, resist techniques for KrF excimer laser have been mainly diverted and investigated. For instance, the combination use of a compound capable of generating an acid upon electron beam irradiation and an amine compound having a boiling point of not more than 250° C. as described in JP-A-2000-181065 (the term "JP-A" as used herein means an "unexamined published Japanese patent application"), the combination use of a polymer having an acid decomposable group, an acid generator and an electron beam sensitizer as described in European Patent 919, 867, and the combination use of a polymer having an acid decomposable group and an amide compound as described in JP-W-7-508840 (the term "JP-W" as used herein means an "unexamined published international patent application") are known. Further, the use of a maleimide compound as described in JP-A-3-200968, the use of a sulfonamide compound as described in JP-A-7-92680, and the use of a sulfonimide compound including a partial structure of —$SO_2$—NH—$SO_2$— as described in JP-A-11-44950 are known. However, these attempts do not solve the problem to fulfill all requirements of high sensitivity, high resolution, good rectangular resist profile and excellent edge roughness.

On the other hand, with respect to chemical amplification negative resists, various alkali-soluble resins have been proposed. The use of polyvinyl phenol partially alkyl etherized is described in JP-A-8-152717. The use of copolymer of vinyl phenol and styrene is described in JP-A-6-67431 and JP-A-10-10733. The use of novolac resin is described in Japanese Patent 2,505,033. The use of monodispersed polyvinyl phenol is described in JP-A-7-311463 and JP-A-8-292559. However, it could not be achieved to fulfill all characteristics of the sensitivity, resolution, resist profile and edge roughness upon irradiation of electron beam or X-ray by using such alkali-soluble resins.

Also, various compounds capable of generating an acid upon irradiation of electron beam or X-ray have been proposed with respect to the chemical amplification negative resists. The use of organic halogen compound is described in JP-B-8-3635 (the term "JP-B" as used herein means an "examined Japanese patent publication"). The use of iodonium salt or sulfonium salt is described in JP-A-2-150848 and JP-A-6-199770. The use of acid generator containing Cl or Br is described in JP-A-2-52348, JP-A-4-367864 and JP-A-4-367865. The use of diazodisulfone or diazosulfone compound is described in JP-A-4-210960 and JP-A-4-217249. The use of triazine compound is described in JP-A-4-226454. The use of sulfonate compound is described in JP-A-3-87746, JP-A-4-291259, JP-A-6-236024 and U.S. Pat. No. 5,344,742. However, the trade off relation between the sensitivity and the resolution, resist profile and edge roughness upon irradiation of electron beam or X-ray cannot be overcome by using such acid generators.

Further, with respect to a crosslinking agent, for example, methylol melamine, a resole resin, an epoxylated novolac resin or a urea resin has been used. However, these crosslinking agents are unstable to heat and have a problem of preservation stability of a resist solution.

The resist compositions described in Japanese Patent 3,000,740, JP-A-9-166870 and JP-A-2-15270 are also insufficient for meeting characteristic requirements of high sensitivity, high resolution, good rectangular resist profile and excellent edge roughness upon irradiation of electron beam or X-ray.

Therefore, it is difficult to fulfill requirements for sufficiently high sensitivity, sufficiently high resolution, good rectangular resist profile and excellent edge roughness all together in hitherto known techniques and it has been strongly desired to solve the problem.

SUMMARY OF THE INVENTION

An object of the present invention is to provide a resist composition which resolve problems in the techniques for improving the performance in fine processing of semiconductor device using an electron beam, EUV or an X-ray.

Another object of the present invention is to provide a positive resist composition that is excellent in sensitivity and resolution in case of using an electron beam, EUV or an X-ray.

A still another object of the present invention is to provide a positive resist composition that fulfills characteristics of rectangular pattern profile and edge roughness as well as sensitivity and resolution in case of using an electron beam, EUV or an X-ray.

A further object of the present invention is to provide a chemical amplification negative resist composition that satisfies characteristics of sensitivity, resolution, resist profile and edge roughness all together in case of using an electron beam, EUV or an X-ray.

Other objects of the present invention will become apparent from the following description.

As the result of extensive investigations, the inventors have found that the above objects of the present invention can be attained by a resist composition containing a specific acid generator, and completed the present invention.

Specifically, the present invention includes the following resist compositions:

(1) A resist composition for an electron beam, EUV or X-ray comprising (A1) a compound that has a reduction potential higher than that of diphenyl iodonium salt and generates an acid upon irradiation of an actinic ray or radiation.

(2) A positive resist composition for an electron beam, EUV or X-ray comprising (A1) a compound that has a reduction potential higher than that of diphenyl iodonium salt and generates an acid upon irradiation of an actinic ray or radiation and (BP) a polymer that is insoluble or hardly soluble in an aqueous alkali solution but becomes soluble in the aqueous alkali solution by the action of an acid.

(3) The positive resist composition for an electron beam, EUV or X-ray as described in item (2) above, wherein the compound of (A1) that has a reduction potential higher than that of diphenyl iodonium salt and generates an acid upon irradiation of an actinic ray or radiation is a compound represented by formula (1), (2) or (3) shown below.

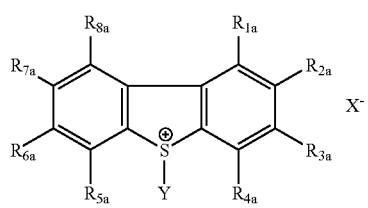

(1)

In formula (1), Y represents an aryl group which may have a substituent or an alkyl group which may have a substituent.

$R_{1a}$ to $R_{8a}$ each independently represent a hydrogen atom, a halogen atom, a nitro group, a cyano group, a carboxy group, an alkyl group which may have a substituent or a cycloalkyl group which may have a substituent.

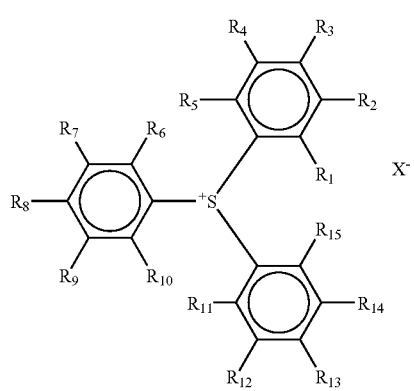

(2)

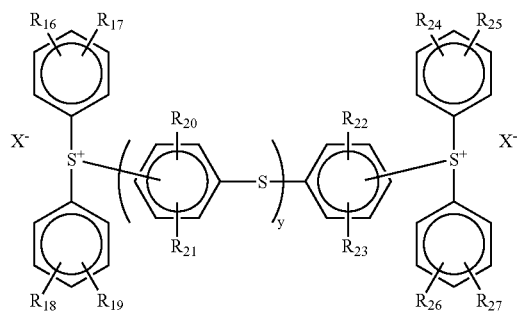

(3)

In formula (2), $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group.

In formula (3), $R_{16}$ to $R_{27}$ each independently represent a hydrogen atom, a nitro group, a cyano group, a trifluoromethyl group or a halogen atom.

y represents 0 or 1.

$X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

(4) The positive resist composition for an electron beam, EUV or X-ray as described in item (2) or (3) above, which further comprises (A2) a compound that generates an acid upon irradiation of an actinic ray or radiation and has a structure represented by any one of formulae (I) to (III) shown below.

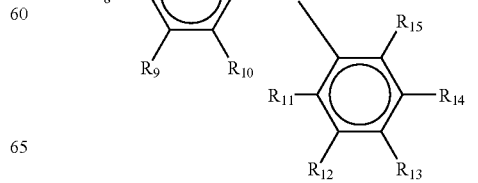

(I)

-continued (II)

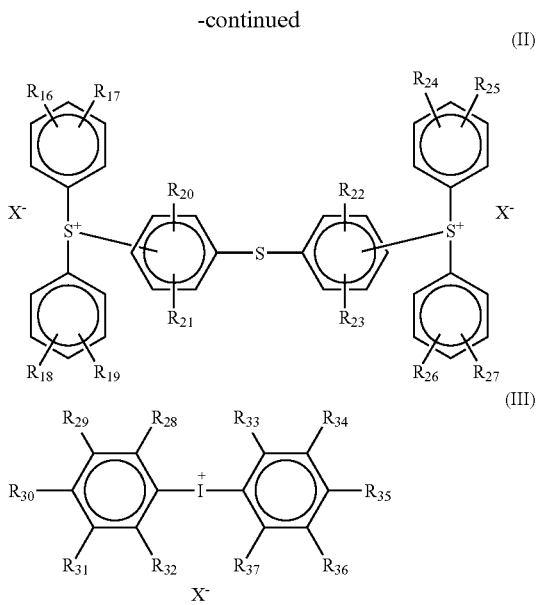

(III)

In formulae (I) to (III), $R_1$ to $R_{37}$, which may be the same or different, each represent a hydrogen atom, an alkyl group, an alkoxy group, a hydroxy group, a halogen atom or a group of —S—$R_{38}$. $R_{38}$ represents an alkyl group or an aryl group.

$X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

(5) The positive resist composition for an electron beam, EUV or X-ray as described in any one of items (2) to (4) above, which further comprises at least one compound selected from (A3) a compound that generates a carboxylic acid containing a fluorine atom upon irradiation of an actinic ray or radiation and (A4) a compound that generates a carboxylic acid free from a fluorine atom upon irradiation of an actinic ray or radiation.

(6) The positive resist composition for an electron beam, EUV or X-ray as described in any one of items (2) to (5) above, wherein the polymer of (BP) that is insoluble or hardly soluble in an aqueous alkali solution but becomes soluble in the aqueous alkali solution by the action of an acid is a polymer having a structural unit containing a group represented by formula (X1) or (X2) shown below.

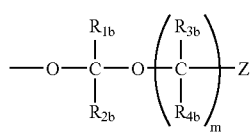

(X1)

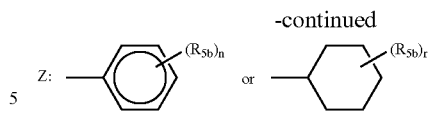

In formula (X1), $R_{1b}$ and $R_{2b}$, which may be the same or different, each represent a hydrogen atom or an alkyl group.

$R_{3b}$ and $R_{4b}$, which may be the same or different, each represent a hydrogen atom, an alkyl group which may have a substituent or a cycloalkyl group which may have a substituent.

$R_{5b}$ represents an alkyl group which may have a substituent, a cycloalkyl group which may have a substituent, an aryl group which may have a substituent or an aralkyl group which may have a substituent.

m represents an integer of from 0 to 20, and n represents an integer of from 0 to 5.

$$\overset{R_{6b}}{\underset{R_{7b}}{-O-C-O-W-O-R_{8b}}} \quad (X2)$$

In formula (X2), $R_{6b}$ and $R_{7b}$, which may be the same or different, each represent a hydrogen atom or an alkyl group.

W represents a divalent organic group.

$R_{8b}$ represents an alkyl group which may have a substituent, a cycloalkyl group which may have a substituent, an aryl group which may have a substituent or an aralkyl group which may have a substituent.

(7) The positive resist composition for an electron beam, EUV or X-ray as described in any one of items (2) to (6) above, wherein the polymer of (BP) that is insoluble or hardly soluble in an aqueous alkali solution but becomes soluble in the aqueous alkali solution by the action of an acid is a polymer having a structural unit containing a tertiary ester group that is decomposed by the action of an acid.

(8) The positive resist composition for an electron beam, EUV or X-ray as described in any one of items (2) to (6) above, wherein the polymer of (BP) that is insoluble or hardly soluble in an aqueous alkali solution but becomes soluble in the aqueous alkali solution by the action of an acid is a polymer having a structural unit containing a tert-butoxycarbonyl group that is decomposed by the action of an acid.

(9) A negative resist composition for an electron beam, EUV or X-ray comprising (A1) a compound that has a reduction potential higher than that of diphenyl iodonium salt and generates an acid upon irradiation of an actinic ray or radiation, (BN) an alkali-soluble resin and (C) a crosslinking agent crosslinking by the action of an acid.

(10) The negative resist composition for an electron beam, EUV or X-ray as described in item (9) above, wherein the compound of (A1) that has a reduction potential higher than that of diphenyl iodonium salt and generates an acid upon irradiation of an actinic ray or radiation is a compound represented by formula (1), (2) or (3) shown below.

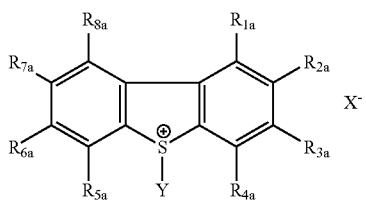

(1)

In formula (1), Y represents an aryl group which may have a substituent or an alkyl group which may have a substituent.

$R_{1a}$ to $R_{8a}$ each independently represent a hydrogen atom, a halogen atom, a nitro group, a cyano group, a carboxy group, an alkyl group which may have a substituent or a cycloalkyl group which may have a substituent.

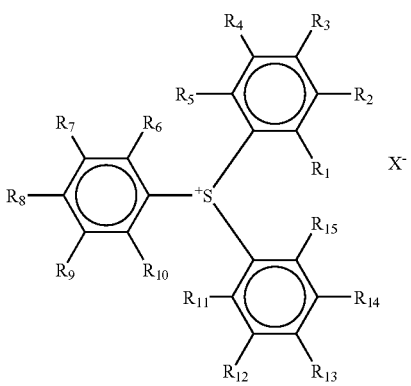

(2)

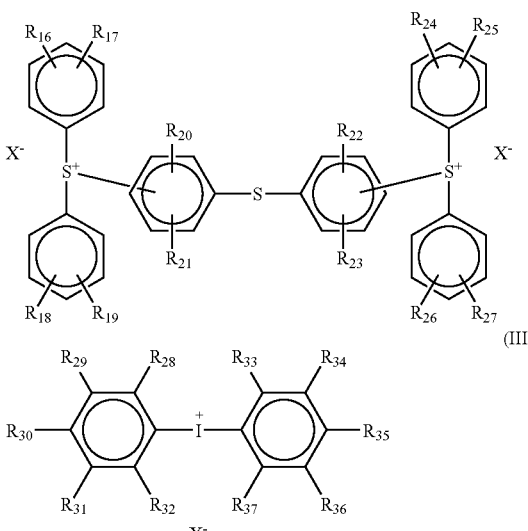

(3)

In formula (2), $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group.

In formula (3), $R_{16}$ to $R_{27}$ each independently represent a hydrogen atom, a nitro group, a cyano group, a trifluoromethyl group or a halogen atom.

y represents 0 or 1.

$X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

(11) The negative resist composition for an electron beam, EUV or X-ray as described in item (9) or (10) above, which further comprises (A2) a compound that generates an acid upon irradiation of an actinic ray or radiation and has a structure represented by any one of formulae (I) to (III) shown below.

(I)

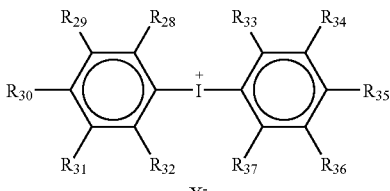

(II)

(III)

In formulae (I) to (III), $R_1$ to $R_{37}$, which may be the same or different, each represent a hydrogen atom, a straight chain, branched or cyclic alkyl group, a straight chain, branched or cyclic alkoxy group, a hydroxy group, a halogen atom or a group of —S—$R_{38}$. $R_{38}$ represents a straight chain, branched or cyclic alkyl group or an aryl group.

$X^-$ represents an anion of an alkylsulfonic acid, a benzenesulfonic acid, a naphthalenesulfonic acid or an anthracenesulfonic acid, having at least one member selected from a fluorine atom, a straight chain, branched or cyclic alkyl group substituted with at least one fluorine atom, a straight chain, branched or cyclic alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

(12) The negative resist composition for an electron beam, EUV or X-ray as described in any one of items (9) to (11) above, which further comprises at least one compound selected from (A3) a compound that generates a carboxylic acid containing a fluorine atom upon irradiation of an actinic ray or radiation and (A4) a compound that generates a carboxylic acid free from a fluorine atom upon irradiation of an actinic ray or radiation.

(13) The negative resist composition for an electron beam, EUV or X-ray as described in any one of items (9) to (12) above, wherein the crosslinking agent of (C) crosslinking by the action of an acid is at least one compound selected from compounds represented by formulae (2) to (4) shown below and alkoxymethylated melamine compounds.

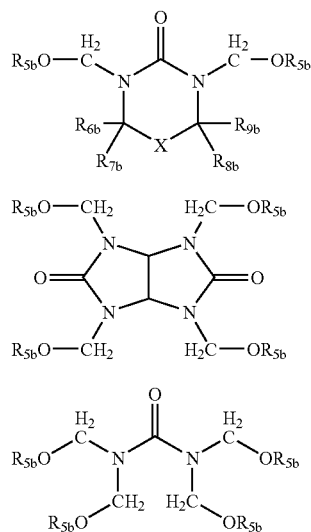

In formulae (2) to (4), $R_{5b}$'s each independently represent a hydrogen atom, an alkyl group or an acyl group.

In formula (2), $R_{6b}$ to $R_{9b}$ each independently represent a hydrogen atom, a hydroxy group, an alkyl group or an alkoxy group.

X represents a single bond, a methylene group or an oxygen atom.

(14) The negative resist composition for an electron beam, EUV or X-ray as described in any one of items (9) to (12) above, wherein the crosslinking agent of (C) crosslinking by the action of an acid is a compound selected from phenol derivatives having from 1 to 6 benzene rings and two or more hydroxymethyl groups and/or alkoxymethyl groups connected to any of the benzene rings per molecule.

DETAILED DESCRIPTION OF THE INVENTION

The compounds constituting the resist composition according to the present invention will be described in more detail below.

<<(A1) Compound That has a Reduction Potential Higher than that of Diphenyliodonium Salt and Generates an Acid Upon Irradiation of an Actinic Ray or Radiation (Hereinafter, also Referred to as "Component (A1)" or "Compound of (A1)")>>

The compound of (A1) is used as an acid generator in the present invention. Measurement of reduction potential of the compound of (A1) can be carried out by cyclic voltammetry. The compound of (A1) includes, for example, a diphenyliodonium salt having an electron attracting group on the phenyl group, e.g., bis(chlorophenyl)iodonium salt and the compounds represented by formulae (1) to (3) described above. The compounds represented by formulae (1) to (3) are preferably used.

In formula (1), Y represents an aryl group which may have a substituent or an alkyl group which may have a substituent. $R_{1a}$ to $R_{8a}$ each independently represent a hydrogen atom, a halogen atom, a nitro group, a cyano group, a carboxy group, an alkyl group which may have a substituent or a cycloalkyl group which may have a substituent.

The alkyl group represented by Y may be any of straight chain and branched alkyl groups, and preferably has from 1 to 8 carbon atoms. Specific examples of the alkyl group include methyl, ethyl, isopropyl, n-butyl, isobutyl, tert-butyl, pentyl, neopentyl, hexyl, heptyl and octyl groups. The alkyl group may further have a substituent.

The aryl group represented by Y preferably has from 6 to 16 carbon atoms. Specific examples of the aryl group include phenyl, naphthyl, anthryl, phenanthryl and pyrenyl groups.

The substituent for the alkyl group or aryl group represented by Y includes, for example, an aryl group, an alkyl group, a cycloalkyl group, an alkoxy group, a carboxy group, a hydroxy group, a halogen atom (e.g., fluorine, chlorine, bromine or iodine atom), a cyano group, a nitro group, an arylcarbonyl group and an alkylcarbonyl group. Of the substituents for the alkyl group or aryl group represented by Y, an electron attracting substituent, for example, a halogen atom (e.g., fluorine, chlorine, bromine or iodine atom), a cyano group, a nitro group, an arylcarbonyl group or an alkylcarbonyl group is preferred in view of the reduction potential.

The alkyl group represented by any one of $R_{1a}$ to $R_{8a}$ may be any of straight chain and branched alkyl groups, and preferably has from 1 to 8 carbon atoms. Specific examples of the alkyl group include methyl, ethyl, isopropyl, n-butyl, isobutyl, tert-butyl, pentyl, neopentyl, hexyl, heptyl and octyl groups. The alkyl group may further have a substituent.

The cycloalkyl group represented by any one of $R_{1a}$ to $R_{8a}$ preferably has from 3 to 8 carbon atoms. Specific examples of the cycloalkyl group include cyclopropyl, cyclopentyl and cyclohexyl groups. The cycloalkyl group may further have a substituent.

The halogen atom represented by any one of $R_{1a}$ to $R_{8a}$ includes, for example, fluorine, chlorine, bromine and iodine atoms.

The substituent for the alkyl group or cycloalkyl group represented by any one of $R_{1a}$ to $R_{8a}$ includes, for example, an alkyl group (e.g., methyl, ethyl, n-propyl, isopropyl, n-butyl, tert-butyl, n-amyl or tert-amyl group), a cycloalkyl group, a phenyl group, a halogen atom (e.g., fluorine, chlorine, bromine or iodine atom), a cyano group and a nitro group. Of the substituents for the alkyl group or cycloalkyl group represented by any one of $R_{1a}$ to $R_{8a}$, an alkyl group (e.g., methyl, ethyl, n-propyl, isopropyl, n-butyl, tert-butyl, n-amyl or tert-amyl group) is preferred in view of increasing the solubility in a solvent, and an electron attracting substituent, for example, a halogen atom (e.g., fluorine, chlorine, bromine or iodine atom), a cyano group or a nitro group is preferred in view of the reduction potential.

When the compound of formula (1) has a counter anion, as the counter anion, that generates an organic sulfonic acid is preferable and that generates an alkylsulfonic acid, an aromatic sulfonic acid, a fluorinated alkylsulfonic acid or a fluorinated aromatic sulfonic acid is more preferable. Of the organic sulfonic acids, those having a large number of carbon atoms are preferred, since diffusion of the acid generated is appropriately restrained to improve resolution. Specifically, an alkylsulfonic acid having from 4 to 20 carbon atoms in the alkyl group, an aromatic sulfonic acid containing a benzene ring or naphthalene ring, a fluorinated alkylsulfonic acid having from 4 to 12 carbon atoms in the alkyl group and a fluorinated aromatic sulfonic acid containing a benzene ring or naphthalene ring are preferably used.

In formula (2), $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group.

In formula (3), $R_{16}$ to $R_{27}$ each independently represent a hydrogen atom, a nitro group, a cyano group, a trifluoromethyl group or a halogen atom.

y represents 0 or 1.

$X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

The halogen atom represented by any one of $R_{16}$ to $R_{27}$ includes, for example, fluorine, chlorine, bromine and iodine atoms.

The alkyl group substituted with at least one fluorine atom described above may be any of straight chain, branched and cyclic alkyl groups and is preferably that having from 1 to 12 carbon atoms and substituted with 1 to 25 fluorine atoms.

Specific examples thereof include trifluoromethyl, pentafluoroethyl, 2,2,2-trifluoroethyl, heptafluoropropyl, heptafluoroisopropyl, perfluorobutyl, perfluorooctyl, perfluorododecyl and perfluorocyclohexyl groups. Among them, a perfluoroalkyl group having from 1 to 4 carbon atoms fully substituted with fluorine atoms is preferred. A perfluorobutyl group is particularly preferred.

The alkoxy group substituted with at least one fluorine atom described above may be any of straight chain, branched and cyclic alkoxy groups and is preferably that having from 1 to 12 carbon atoms and substituted with 1 to 25 fluorine atoms.

Specific examples thereof include trifluoromethoxy, pentafluoroethoxy, heptafluoroisopropyloxy, perfluorobutoxy, perfluorooctyloxy, perfluorododecyloxy and perfluorocyclohexyloxy groups. Among them, a perfluoroalkoxy group having from 1 to 4 carbon atoms fully substituted with fluorine atoms is preferred.

The acyl group substituted with at least one fluorine atom described above is preferably that having from 2 to 12 carbon atoms and substituted with 1 to 23 fluorine atoms. Specific examples thereof include trifluoroacetyl, fluoroacetyl, pentafluoropropionyl and pentafluorobenzoyl groups.

The acyloxy group substituted with at least one fluorine atom described above is preferably that having from 2 to 12 carbon atoms and substituted with 1 to 23 fluorine atoms. Specific examples thereof include trifluoroacetoxy, fluoroacetoxy, pentafluoropropionyloxy and pentafluorobenzoyloxy groups.

The sulfonyl group substituted with at least one fluorine atom described above is preferably that having from 1 to 12 carbon atoms and substituted with 1 to 25 fluorine atoms. Specific examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

The sulfonyloxy group substituted with at least one fluorine atom described above is preferably that having from 1 to 12 carbon atoms and substituted with 1 to 25 fluorine atoms. Specific examples thereof include trifluoromethanesulfonyloxy, perfluorobutanesulfonyloxy and 4-trifluoromethylbenzenesulfonyloxy groups.

The sulfonylamino group substituted with at least one fluorine atom described above is preferably that having from 1 to 12 carbon atoms and substituted with 1 to 25 fluorine atoms. Specific examples thereof include trifluoromethanesulfonylamino, perfluorobutanesulfonylamino, perfluorooctanesulfonylamino and pentafluorobenzenesulfonylamino groups.

The aryl group substituted with at least one fluorine atom described above is preferably that having from 6 to 14 carbon atoms and substituted with 1 to 9 fluorine atoms. Specific examples thereof include pentafluorophenyl, 4-trifluoromethylphenyl, heptafluoronaphthyl, nonafluoroanthryl, 4-fluorophenyl and 2,4-difluorophenyl groups.

The aralkyl group substituted with at least one fluorine atom described above is preferably that having from 7 to 10 carbon atoms and substituted with 1 to 15 fluorine atoms. Specific examples thereof include pentafluorophenylmethyl, pentafluorophenylethyl, perfluorobenzyl and perfluorophenethyl groups.

The alkoxycarbonyl group substituted with at least one fluorine atom described above is preferably that having from 2 to 13 carbon atoms and substituted with 1 to 25 fluorine atoms. Specific examples thereof include trifluoromethoxycarbonyl, pentafluoroethoxycarbonyl, pentafluoropenoxycarbonyl, perfluorobutoxycarbonyl and perfluorooctyloxycarbonyl groups.

$X^-$ preferably represents a benzenesulfonic acid anion substituted with a fluorine atom, and more preferably a pentafluorobenzenesulfonic acid anion.

The alkylsulfonic acid, benzenesulfonic acid, naphthalenesulfonic acid or anthracenesulfonic acid having the fluorine-containing substituent may further be substituted with a substituent, for example, a straight chain, branched or cyclic alkoxy group, an acyl group, an acyloxy group, a sulfonyl group, a sulfonyloxy group, a sulfonylamino group, an aryl group, an aralkyl group or an alkoxycarbonyl group (the numbers of carbon atoms included in these groups are same as those defined above respectively), a halogen atom other than a fluorine atom, a hydroxy group or a nitro group.

In the present invention, the compound of (A1) having a reduction potential higher than −0.78 V, which is the reduction potential of diphenyliodonium salt, can be used as the acid generator. From the standpoint of stability, the compound of (A1) having a reduction potential of not more than −0.5 V is preferably used.

Specific examples of the compound of (A1) are set forth below, but the present invention should not be construed as being limited thereto.

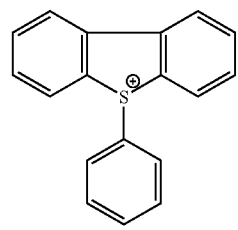 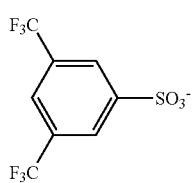 A1-1
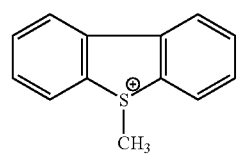 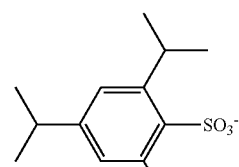 A1-2
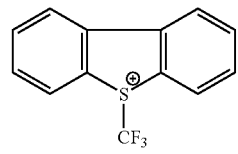 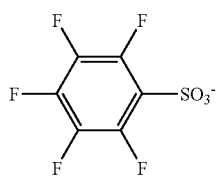 A1-3
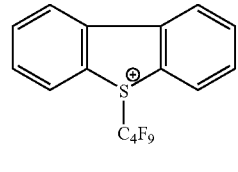 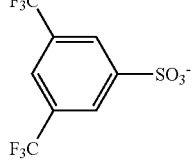 A1-4
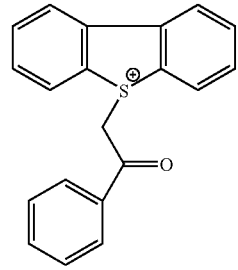 $C_4F_9SO_3^-$ A1-5
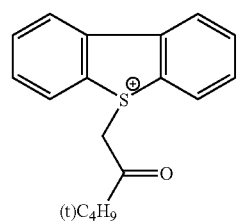 $C_8F_{17}SO_3^-$ A1-6
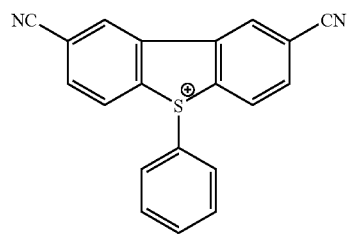 $C_4F_9SO_3^-$ A1-7
-continued
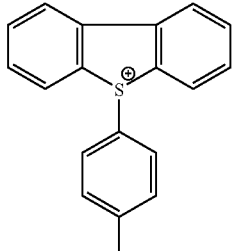  A1-8
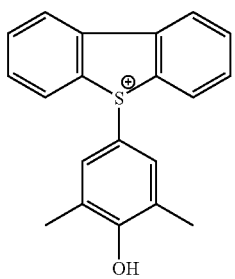 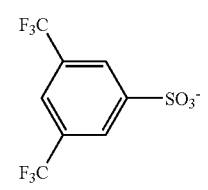 A1-9
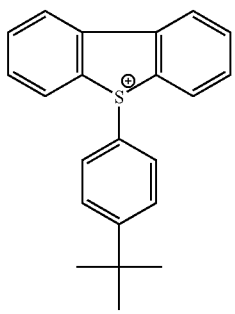 $C_4F_9SO_3^-$ A1-10
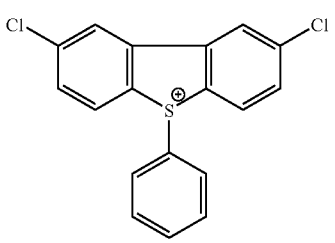 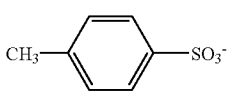 A1-11
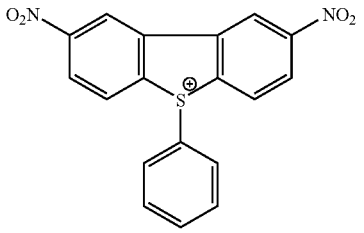 A1-12

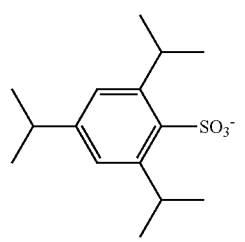
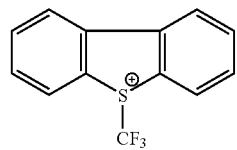
A1-13
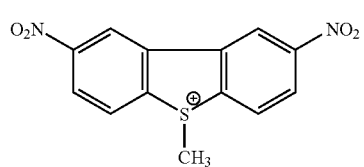
A1-14
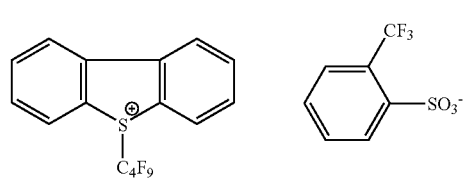
A1-15
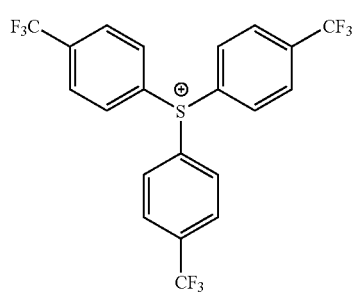
A1-16
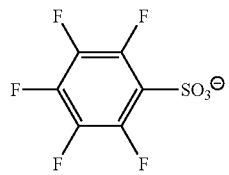
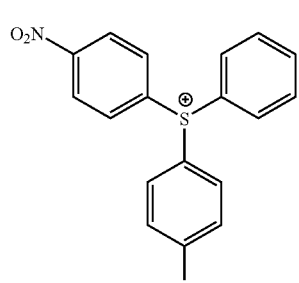
A1-17
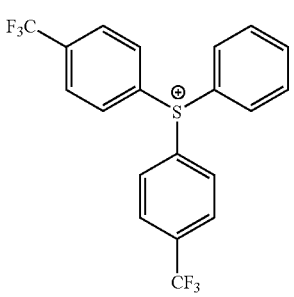
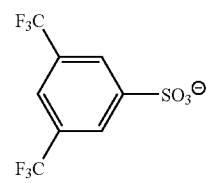
A1-18
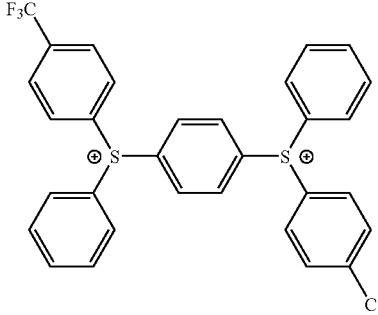
A1-19
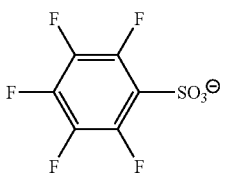
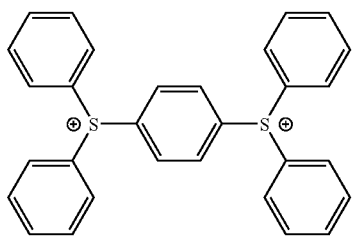
A1-20
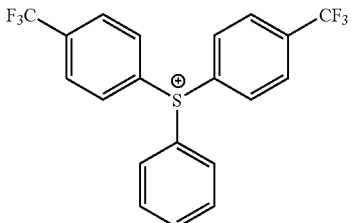
A1-21
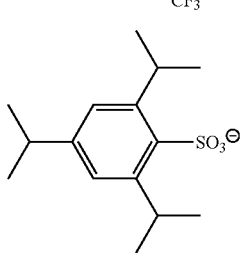

-continued

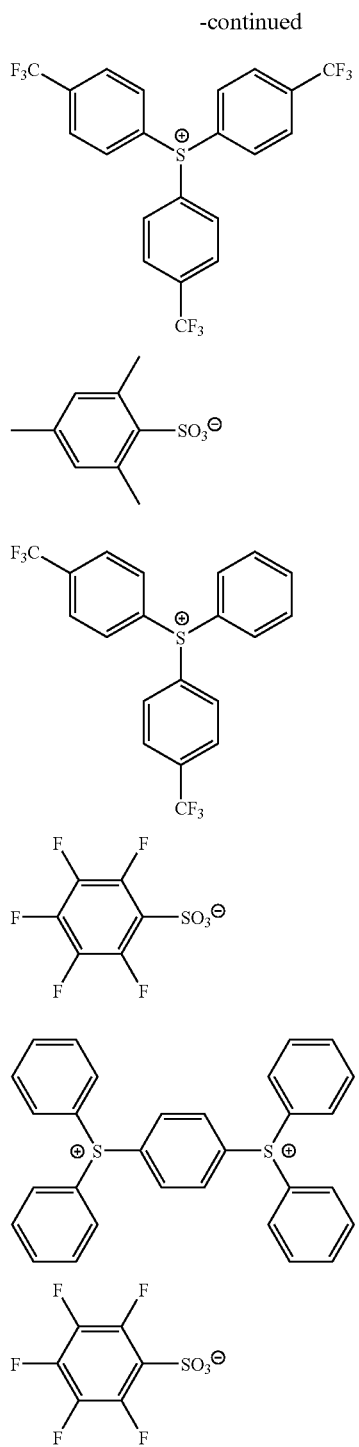

A1-22

A1-23

A1-24

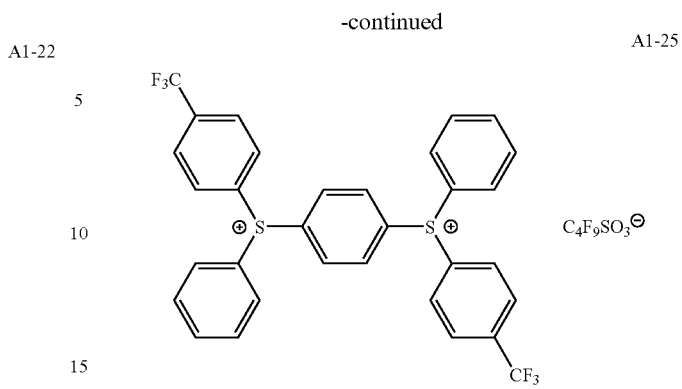

A1-25

The content of compound of (A1) in the resist composition of the present invention is suitably from 0.1 to 40% by weight, preferably from 0.5 to 30% by weight, and more preferably from 1.0 to 25% by weight, based on the total solid content of the resist composition.

<<(A2) Compound that Generates an Acid upon Irradiation of an Actinic Ray or Radiation and has a Structure Represented by any One of Formulae (I) to (III) (Hereinafter, also Referred to as "Component (A2)" or "Compound of (A2)">>

The resist composition according to the present invention may further contain the compound of (A2) as the acid generator.

In formulae (I) to (III), $R_1$ to $R_{37}$, which may be the same or different, each represent a hydrogen atom, an alkyl group, an alkoxy group, a hydroxy group, a halogen atom or a group of —S—$R_{38}$. $R_{38}$ represents an alkyl group or an aryl group.

The alkyl group represented by any one of $R_1$ to $R_{38}$ may be any of straight chain, branched and cyclic alkyl groups. The straight chain or branched alkyl group includes that having from 1 to 4 carbon atoms, which may have a substituent, for example, methyl, ethyl, propyl, n-butyl, sec-butyl or tert-butyl group. The cyclic alkyl group includes that having from 3 to 8 carbon atoms, which may have a substituent, for example, cyclopropyl, cyclopentyl or cyclohexyl group.

The alkoxy group represented by any one of $R_1$ to $R_{37}$ may be any of straight chain, branched and cyclic alkoxy groups. The straight chain or branched alkoxy group includes that having from 1 to 8 carbon atoms, which may have a substituent, for example, methoxy, ethoxy, hydroxyethoxy, propoxy, n-butoxy, isobutoxy, sec-butoxy, tert-butoxy or octyloxy group. The cyclic alkoxy group, which may have a substituent, includes, for example, cyclopentyloxy and cyclohexyloxy groups.

The halogen atom represented by any one of $R_1$ to $R_{37}$ includes, for example, fluorine, chlorine, bromine and iodine atoms.

The aryl group represented by $R_{38}$ includes that having from 6 to 14 carbon atoms, which may have a substituent, for example, phenyl, tolyl, methoxyphenyl or naphthyl group.

The substituents for the above groups preferably include an alkyl group, an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

In formulae (I) to (III), $X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

The alkyl group substituted with at least one fluorine atom described above may be any of straight chain, branched and cyclic alkyl groups and is preferably that having from 1 to 12 carbon atoms and substituted with 1 to 25 fluorine atoms.

Specific examples thereof include trifluoromethyl, pentafluoroethyl, 2,2,2-trifluoroethyl, heptafluoropropyl, heptafluoroisopropyl, perfluorobutyl, perfluorooctyl, perfluorododecyl and perfluorocyclohexyl groups. Among them, a perfluoroalkyl group having from 1 to 4 carbon atoms fully substituted with fluorine atoms is preferred. A perfluorobutyl group is particularly preferred.

The alkoxy group substituted with at least one fluorine atom described above may be any of straight chain, branched and cyclic alkoxy groups and is preferably that having from 1 to 12 carbon atoms and substituted with 1 to 25 fluorine atoms.

Specific examples thereof include trifluoromethoxy, pentafluoroethoxy, heptafluoroisopropyloxy, perfluorobutoxy, perfluorooctyloxy, perfluorododecyloxy and perfluorocyclohexyloxy groups. Among them, a perfluoroalkoxy group having from 1 to 4 carbon atoms fully substituted with fluorine atoms is preferred.

The acyl group substituted with at least one fluorine atom described above is preferably that having from 2 to 12 carbon atoms and substituted with 1 to 23 fluorine atoms. Specific examples thereof include trifluoroacetyl, fluoroacetyl, pentafluoropropionyl and pentafluorobenzoyl groups.

The acyloxy group substituted with at least one fluorine atom described above is preferably that having from 2 to 12 carbon atoms and substituted with 1 to 23 fluorine atoms. Specific examples thereof include trifluoroacetoxy, fluoroacetoxy, pentafluoropropionyloxy and pentafluorobenzoyloxy groups.

The sulfonyl group substituted with at least one fluorine atom described above is preferably that having from 1 to 12 carbon atoms and substituted with 1 to 25 fluorine atoms. Specific examples thereof include trifluoromethanesulfonyl, pentafluoroethanesulfonyl, perfluorobutanesulfonyl, perfluorooctanesulfonyl, pentafluorobenzenesulfonyl and 4-trifluoromethylbenzenesulfonyl groups.

The sulfonyloxy group substituted with at least one fluorine atom described above is preferably that having from 1 to 12 carbon atoms and substituted with 1 to 25 fluorine atoms. Specific examples thereof include trifluoromethanesulfonyloxy, perfluorobutanesulfonyloxy and 4-trifluoromethylbenzenesulfonyloxy groups.

The sulfonylamino group substituted with at least one fluorine atom described above is preferably that having from 1 to 12 carbon atoms and substituted with 1 to 25 fluorine atoms. Specific examples thereof include trifluoromethanesulfonylamino, perfluorobutanesulfonylamino, perfluorooctanesulfonylamino and pentafluorobenzenesulfonylamino groups.

The aryl group substituted with at least one fluorine atom described above is preferably that having from 6 to 14 carbon atoms and substituted with 1 to 9 fluorine atoms. Specific examples thereof include pentafluorophenyl, 4-trifluoromethylphenyl, heptafluoronaphthyl, nonafluoroanthryl, 4-fluorophenyl and 2,4-difluorophenyl groups.

The aralkyl group substituted with at least one fluorine atom described above is preferably that having from 7 to 10 carbon atoms and substituted with 1 to 15 fluorine atoms. Specific examples thereof include pentafluorophenylmethyl, pentafluorophenylethyl, perfluorobenzyl and perfluorophenethyl groups.

The alkoxycarbonyl group substituted with at least one fluorine atom described above is preferably that having from 2 to 13 carbon atoms and substituted with 1 to 25 fluorine atoms. Specific examples thereof include trifluoromethoxycarbonyl, pentafluoroethoxycarbonyl, pentafluoropenoxycarbonyl, perfluorobutoxycarbonyl and perfluorooctyloxycarbonyl groups.

X⁻ preferably represents a benzenesulfonic acid anion substituted with a fluorine atom, and more preferably a pentafluorobenzenesulfonic acid anion.

The alkylsulfonic acid, benzenesulfonic acid, naphthalenesulfonic acid or anthracenesulfonic acid having the fluorine-containing substituent may further be substituted with a substituent, for example, a straight chain, branched or cyclic alkoxy group, an acyl group, an acyloxy group, a sulfonyl group, a sulfonyloxy group, a sulfonylamino group, an aryl group, an aralkyl group or an alkoxycarbonyl group (the numbers of carbon atoms included in these groups are same as those defined above respectively), a halogen atom other than a fluorine atom, a hydroxy group or a nitro group.

Specific examples of the compound represented by any one of formulae (I) to (III) are set forth below, but the present invention should not be construed as being limited thereto.

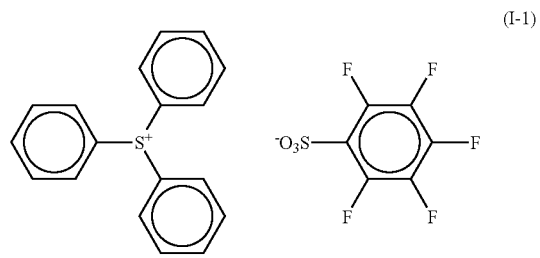
(I-1)

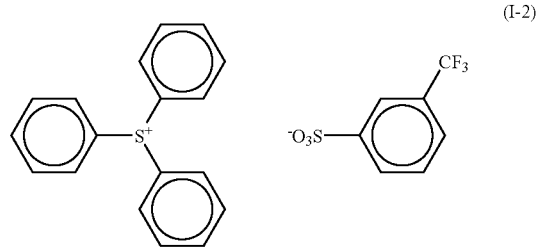
(I-2)

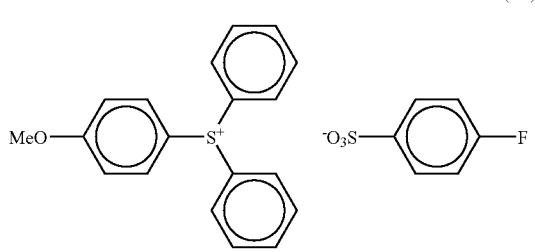
(I-3)

-continued
(I-4)
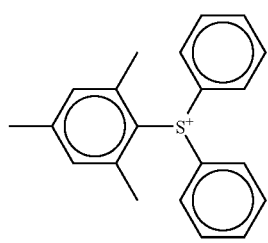 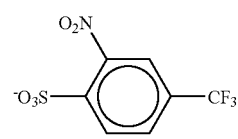
(I-5)
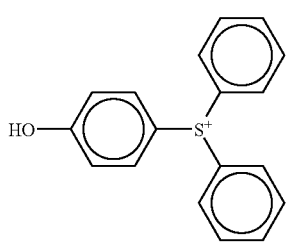 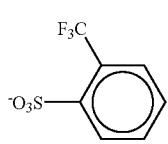
(I-6)
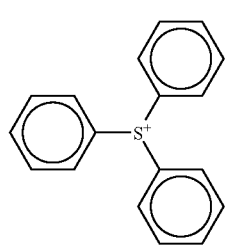 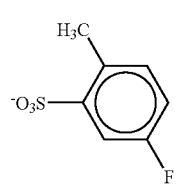
(I-7)
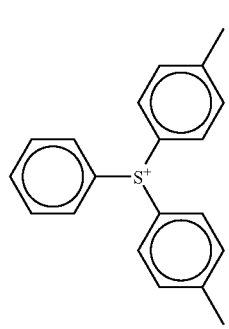 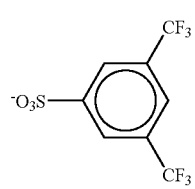
(I-8)
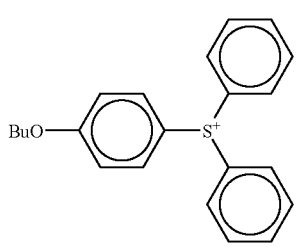 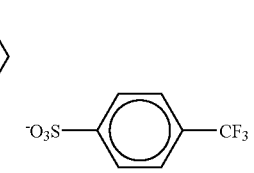
(I-9)
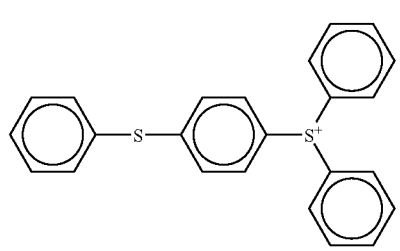
-continued
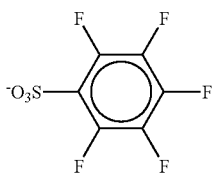 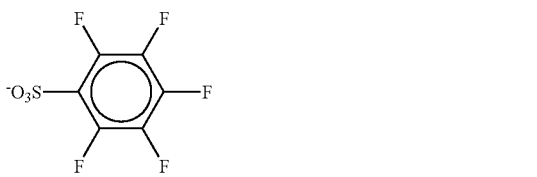
(I-11)
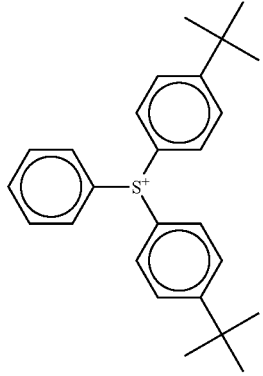
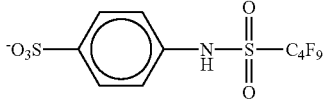
(I-12)
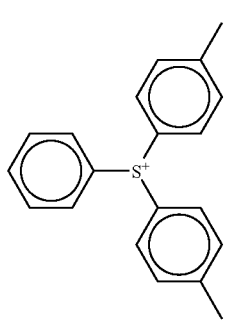 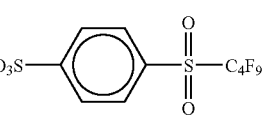
(I-13)
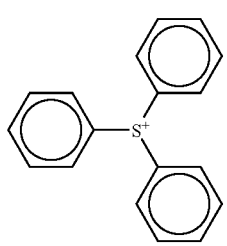
(I-14)
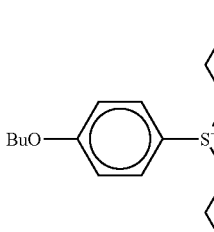 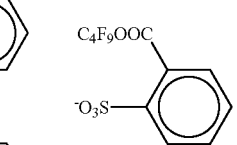

-continued
(I-15)
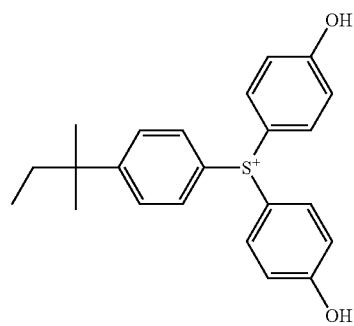
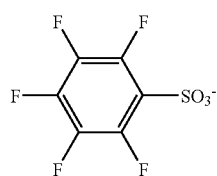
(I-16)
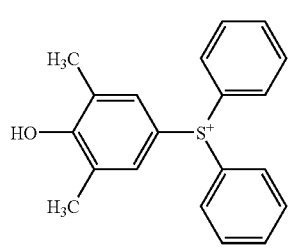 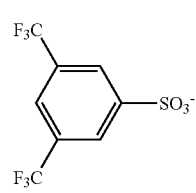
(I-17)
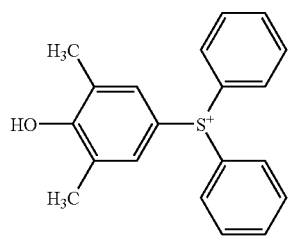
(I-18)
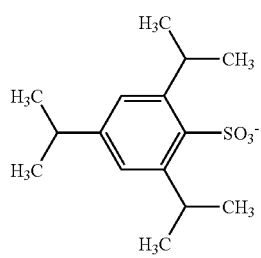 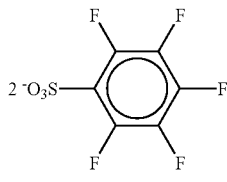
-continued
(I-19)
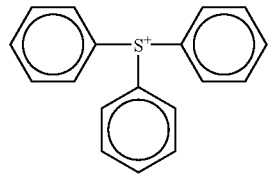  CF$_3$SO$_3^-$
(I-20)
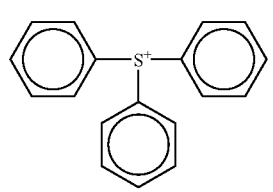  C$_4$F$_9$SO$_3^-$
(I-21)
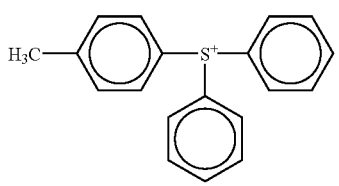  C$_4$F$_9$SO$_3^-$
(I-22)
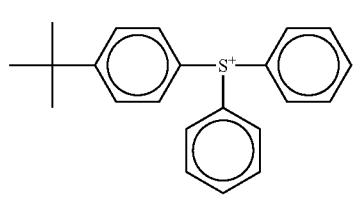  C$_4$F$_9$SO$_3^-$
(I-23)
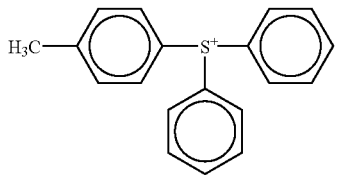  CF$_3$SO$_3^-$
(II-1)
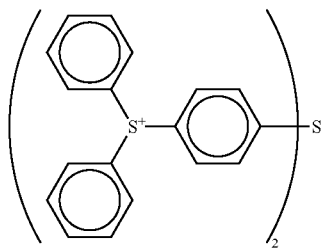
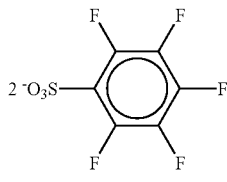

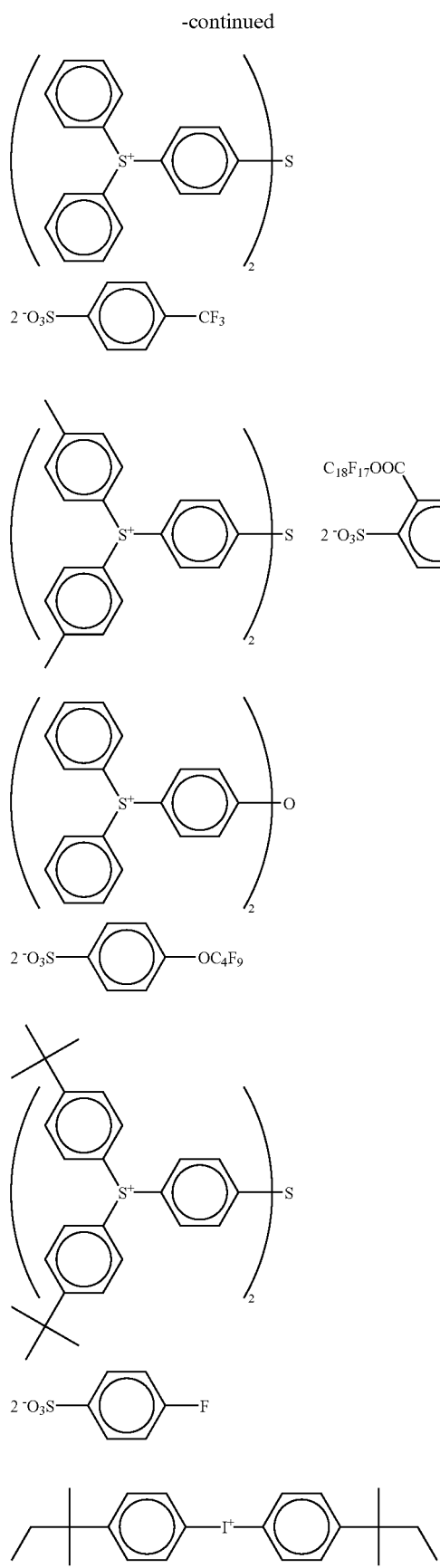

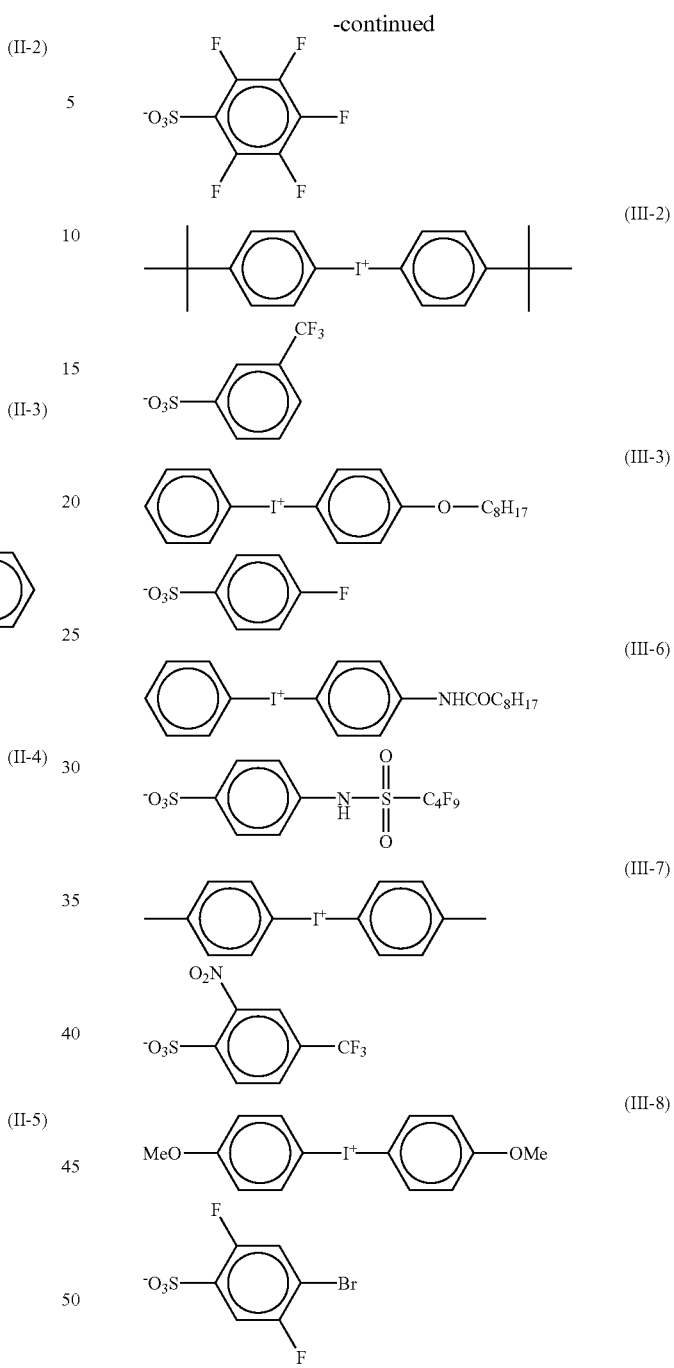

The compound represented by any one of formulae (I) and (II) can be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding sulfonic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The compound represented by formula (III) can be synthesized by reacting an aromatic compound with a periodate and subjecting the resulting iodonium salt to salt exchange with a corresponding sulfonic acid.

The compound of (A1) and the compound of (A2) are used together in a ratio described below in the present invention. Specifically, the compounds are used ordinarily from 100/0 to 10/90, preferably from 90/10 to 30/70, more preferably from 80/20 to 40/60, in terms of a molar ratio of compound of (A1)/compound of (A2).

<<(A3) Compound that Generates a Carboxylic Acid Containing a Fluorine Atom upon Irradiation of an Actinic Ray or Radiation (Hereinafter, also Referred to as "Compound of (A3)">>

The resist composition according to the present invention may further contain the compound of (A3) as the acid generator.

The carboxylic acid containing a fluorine atom includes, for example, a fluorine-substituted aliphatic carboxylic acid and a fluorine-substituted aromatic carboxylic acid.

The fluorine-substituted aliphatic carboxylic acid includes a fluorine-substituted compound of an aliphatic carboxylic acid, for example, acetic acid, propionic acid, n-butyric acid, isobutyric acid, valeric acid, trimethylacetic acid, caproic acid, heptanoic acid, caprylic acid, pelargonic acid, capric acid, lauric acid, myristic acid, palmitic acid, stearic acid, undecanoic acid or tridecanoic acid. The aliphatic carboxylic acid may have a hydroxy group, an alkoxy group or a halogen atom other than a fluorine atom as a substituent. The aliphatic carboxylic acid may contain in its alicyclic chain a connecting group, for example, an oxygen atom, a sulfur atom, a carbonyl group, an ester group or a sulfonyl group.

Preferred examples of the fluorine-substituted aliphatic carboxylic acid include those represented by the following formula:

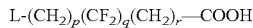

L-(CH$_2$)$_p$(CF$_2$)$_q$(CH$_2$)$_r$—COOH

In the formula, L represents a hydrogen atom or a fluorine atom, p and r each independently represent an integer of from 0 to 15, and q represents an integer of from 1 to 15. The hydrogen atom or fluorine atom included in the alkyl chain in the formula may be substituted with an alkyl group (preferably having from 1 to 5 carbon atoms) which may be substituted with a fluorine atom, an alkoxy group (preferably having from 1 to 5 carbon atoms) which may be substituted with a fluorine atom or a hydroxy group.

As the fluorine-substituted aliphatic carboxylic acid, a fluorine-substituted compound of a saturated aliphatic carboxylic acid having from 2 to 20 carbon atoms is preferred, and a fluorine-substituted compound of a saturated aliphatic carboxylic acid having from 4 to 20 carbon atoms is more preferred. By controlling the number of carbon atoms in the aliphatic carboxylic acid to 4 or more, diffusibility of the acid generated decreases, and fluctuation of line width with the lapse of time from exposure to post heating can be more restrained. Among them, a fluorine-substituted compound of a straight chain or branched saturated aliphatic carboxylic acid having from 4 to 18 carbon atoms is preferably used.

As the fluorine-substituted aromatic carboxylic acid, a fluorine-substituted compound of an aromatic carboxylic acid having from 7 to 20 carbon atoms is preferred, a fluorine-substituted compound of an aromatic carboxylic acid having from 7 to 15 carbon atoms is more preferred, and an aromatic carboxylic acid having from 7 to 11 carbon atoms is still more preferred. Specific examples of the fluorine-substituted aromatic carboxylic acid include a fluorine-substituted compound of an aromatic carboxylic acid, for example, benzoic acid, a substituted benzoic acid, naphthoic acid, a substituted naphthoic acid, anthracenecarboxylic acid or a substituted anthracenecarboxylic acid (wherein the substituent includes an alkyl group, an alkoxy group, a hydroxy group, a halogen atom, an aryl group, an acyl group, an acyloxy group, a nitro group, an alkylthio group and an arylthio group). Among them, a fluorine-substituted compound of benzoic acid or substituted benzoic acid is preferably used.

The aliphatic or aromatic carboxylic acid substituted with a fluorine atom includes an aliphatic or aromatic carboxylic acid in which at least one of the hydrogen atoms present in the skeleton other than the carboxy group is substituted with a fluorine atom. Particularly, an aliphatic or aromatic carboxylic acid in which all of the hydrogen atoms present in the skeleton other than the carboxy group are substituted with fluorine atoms (a perfluoro saturated aliphatic carboxylic acid or a perfluoro aromatic carboxylic acid) is preferred. By using such a perfluoro aliphatic or aromatic carboxylic acid, the sensitivity is more improved.

Of the aliphatic carboxylic acid anions, an anion having a fluorine atom on the a-carbon atom of carboxylic acid has a high acid strength and tends to easily conduct salt exchange with a carboxylic acid anion free from a fluorine atom. The perfluoro aliphatic carboxylic acid anion has a higher acid strength.

Of the compounds of (A3), an onium salt compound (e.g., a sulfonium salt or an iodonium salt) having as a counter anion, the anion of aliphatic or aromatic carboxylic acid substituted with a fluorine atom described above, an imidocarboxylate compound and a nitrobenzyl ester compound each having a carboxylic acid ester group are preferred.

More preferred examples of the compound of (A3) include compounds represented by formulae (IF) to (IIIF) shown below.

By using such a compound, the sensitivity, resolution and exposure margin are more improved. When the compound is irradiated with an actinic ray or radiation, it generates a saturated aliphatic or aromatic carboxylic acid substituted with at least one fluorine atom, which corresponds to an anion represented by X⁻ in any one of formulae (IF) to (IIIF), whereby it functions as a photo-acid generator.

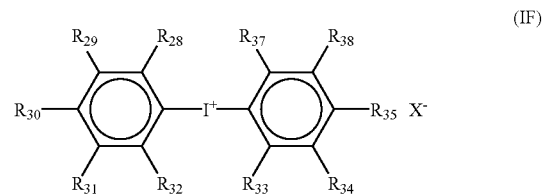

(IF)

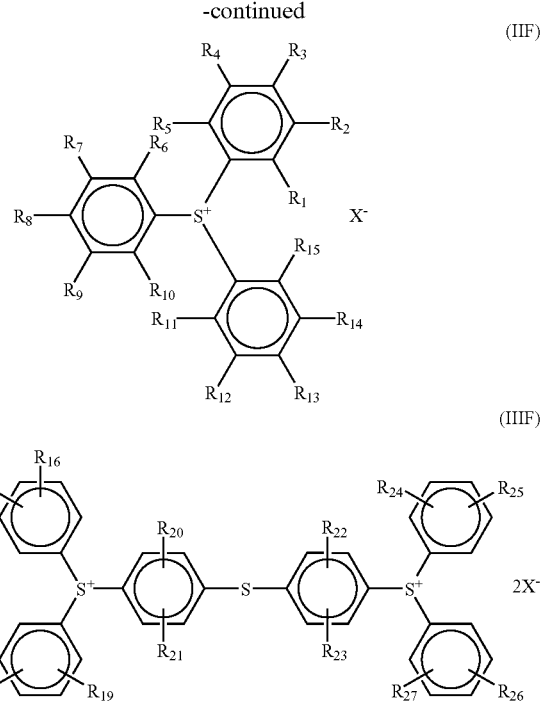

(IIF)

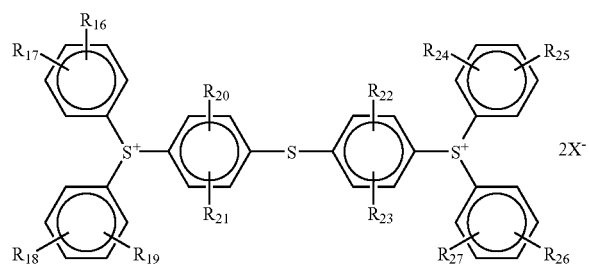

(IIIF)

In formulae (IF) to (IIIF), $R_1$ to $R_{37}$ each independently represent a hydrogen atom, a straight chain, branched or cyclic alkyl group, a straight chain, branched or cyclic alkoxy group, a hydroxy group, a halogen atom or a group of —S—$R_{38}$. $R_{38}$ represents a straight chain, branched or cyclic alkyl group or an aryl group. $X^-$ represents an anion of an aliphatic or aromatic carboxylic acid substituted with at least one fluorine atom.

In any one of formulae (IF) to (IIIF), $X^-$ represents preferably an anion of a perfluoro aliphatic carboxylic acid or a perfluoro aromatic carboxylic acid, and more preferably an anion of a fluorine-substituted alkylcarboxylic acid having not less than 4 carbon atoms.

The straight chain or branched alkyl group represented by any one of $R_1$ to $R_{38}$ includes that having from 1 to 4 carbon atoms, which may have a substituent, for example, methyl, ethyl, propyl, n-butyl, sec-butyl or tert-butyl group. The cyclic alkyl group represented by any one of $R_1$ to $R_{38}$ includes that having from 3 to 8 carbon atoms, which may have a substituent, for example, cyclopropyl, cyclopentyl or cyclohexyl group.

The alkoxy group represented by any one of $R_1$ to $R_{37}$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_1$ to $R_{37}$ includes, for example, fluorine, chlorine, bromine and iodine atoms.

The aryl group represented by $R_{38}$ includes that having from 6 to 14 carbon atoms, which may have a substituent, for example, phenyl, tolyl, methoxyphenyl or naphthyl group.

The substituents for the above groups preferably include, for example, an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The iodonium compound or sulfonium compound represented by any one of formulae (IF) to (IIIF) for use in the present invention has as the counter anion represented by $X^-$ the anion of a saturated aliphatic or aromatic carboxylic acid substituted with at least one fluorine atom. The anion is an anion (—COO$^-$) formed by releasing the hydrogen atom of the saturated aliphatic or aromatic carboxylic acid (—COOH).

Specific examples of the compound of (A3) are set forth below, but the present invention should not be construed as being limited thereto.

Specific examples (I-1f) to (I-36f) of the acid generator represented by formula (IF):

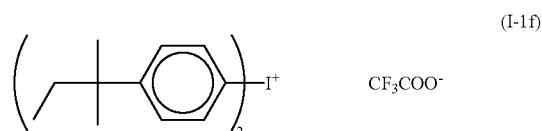
(I-1f)

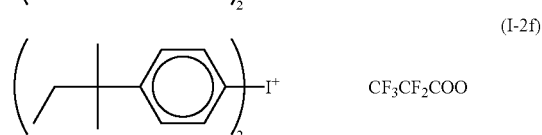
(I-2f)

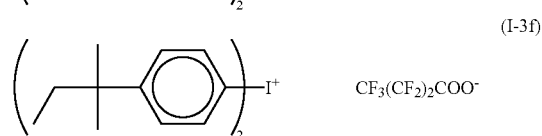
(I-3f)

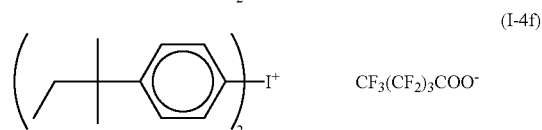
(I-4f)

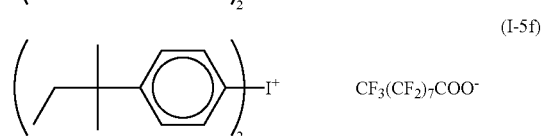
(I-5f)

(I-6f)

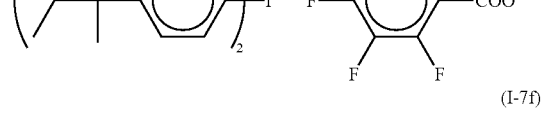
(I-7f)

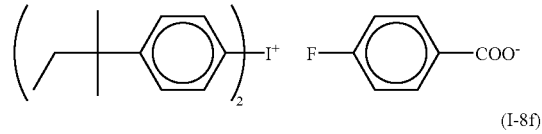
(I-8f)

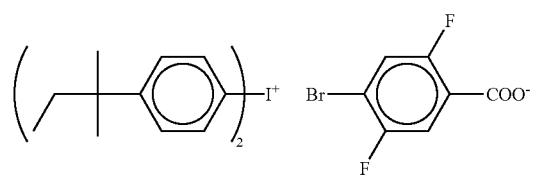

-continued
(I-9f)
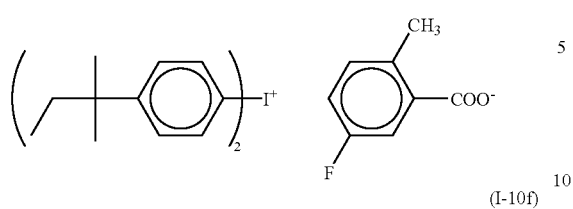
(I-10f)
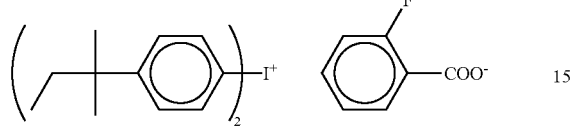
(I-11f)
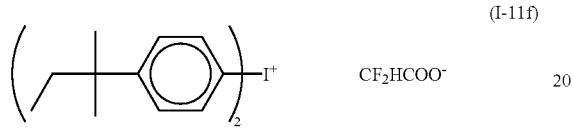
(I-12f)
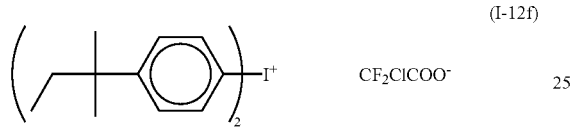
(I-13f)
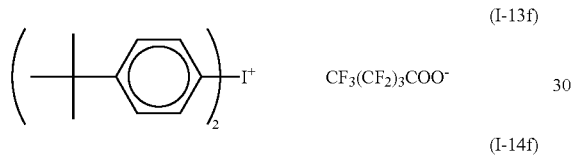
(I-14f)
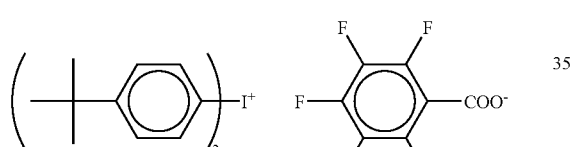
(I-15f)
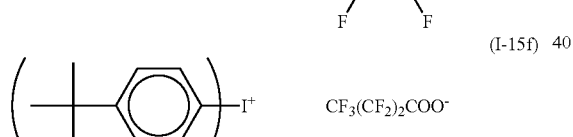
(I-16f)
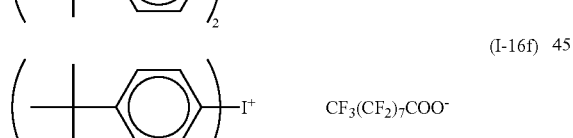
(I-17f)
(I-18f)
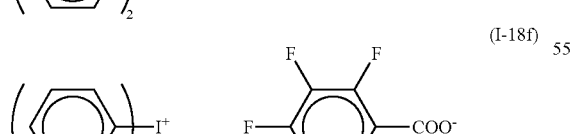
(I-19f)
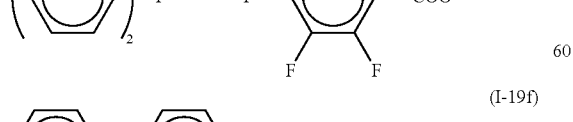
-continued
(I-20f)
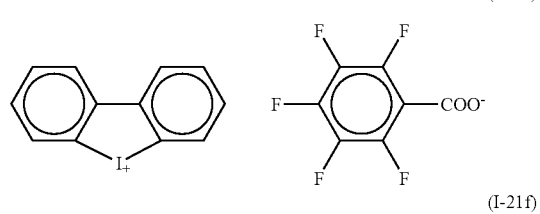
(I-21f)
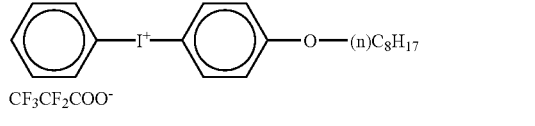
(I-22f)
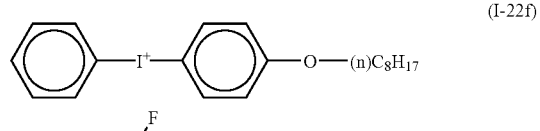
(I-23f)
(I-24f)
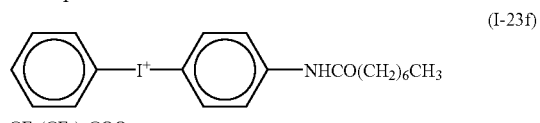
(I-25f)
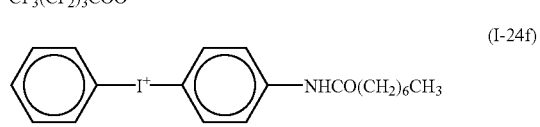
(I-26f)
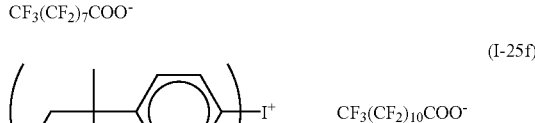
(I-27f)
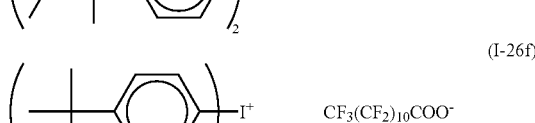
(I-28f)
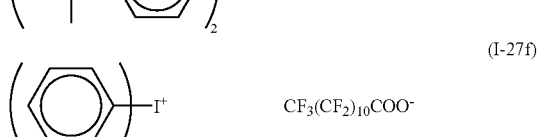
(I-29f)
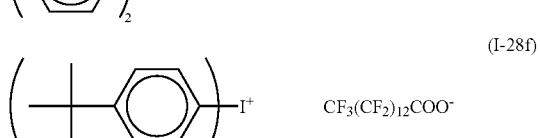
(I-30f)
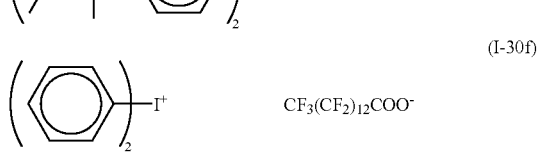

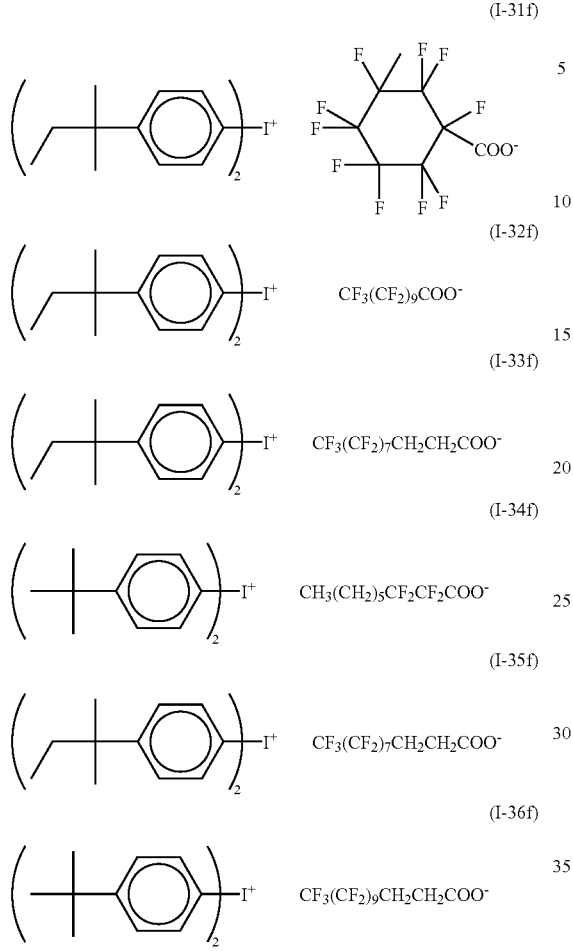
(I-31f)
(I-32f) CF₃(CF₂)₉COO⁻
(I-33f) CF₃(CF₂)₇CH₂CH₂COO⁻
(I-34f) CH₃(CH₂)₅CF₂CF₂COO⁻
(I-35f) CF₃(CF₂)₇CH₂CH₂COO⁻
(I-36f) CF₃(CF₂)₉CH₂CH₂COO⁻
Specific examples (II-1f) to (II-67f) of the acid generator represented by formula (IIF):
 (II-1f) CF₃COO⁻
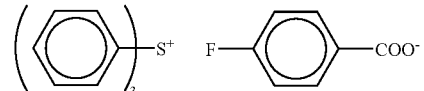 (II-2f) CF₃CF₂COO⁻
(II-3f) CF₃(CF₂)₂COO⁻
(II-4f) CF₃(CF₂)₃COO⁻
(II-5f) CF₃(CF₂)₇COO⁻
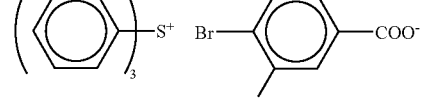 (II-6f)
 (II-7f)
 (II-8f)
 (II-9f)
 (II-10f)
(II-11f) CF₂HCOO⁻
(II-12f) CF₂ClCOO⁻
 (II-13f)
 (II-14f)
(II-15f) CF₃CH(OH)COO⁻
(II-16f) (CF₃)₂C(OH)COO⁻

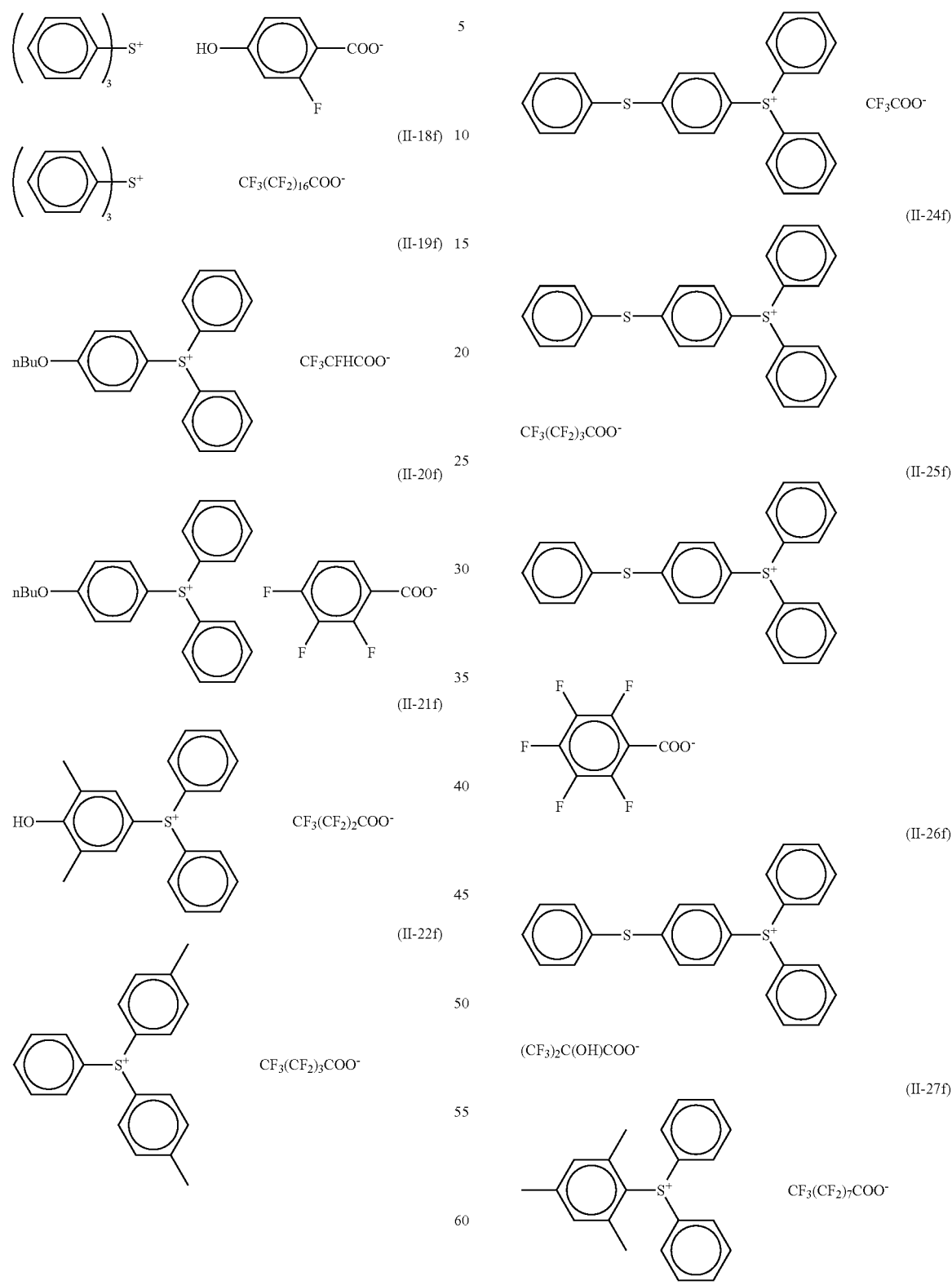

-continued
(II-28f) 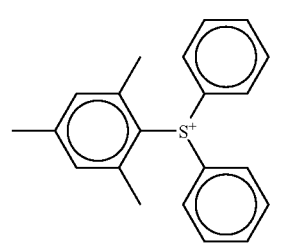 CF₃(CF₂)₂COO⁻
(II-29f) 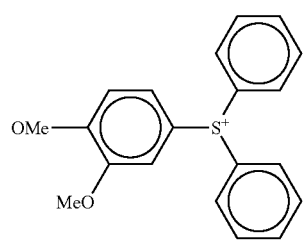 CF₂ClCOO⁻
(II-30f) 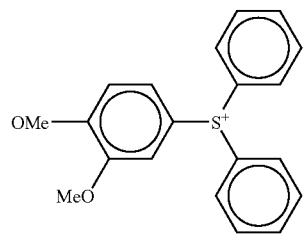 CF₃(CF₂)₃COO⁻
(II-31f) 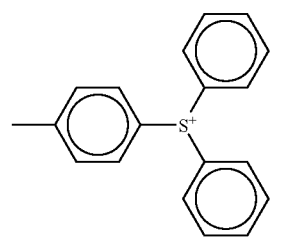 CF₃(CF₂)₂COO⁻
(II-32f) 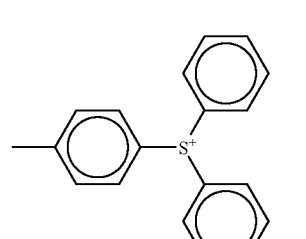
(II-33f) 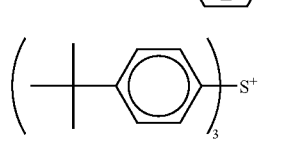 CF₃COO⁻
(II-34f) 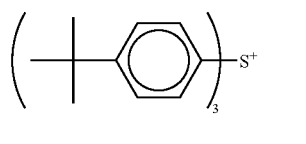 CF₂HCOO⁻
(II-35f) 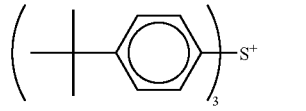 CF₃(CF₂)₂COO⁻
-continued
(II-36f) 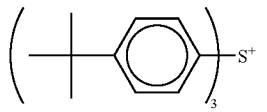 CF₃(CF₂)₃COO⁻
(II-37f) 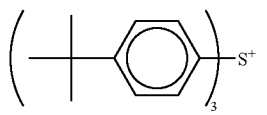 CF₃(CF₂)₇COO⁻
(II-38f) 
(II-39f) 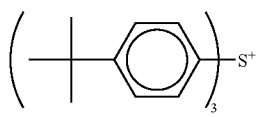
(II-40f) 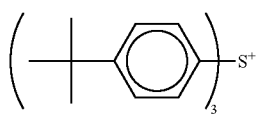
(II-41f) 
(II-42f) 
(II-43f) 

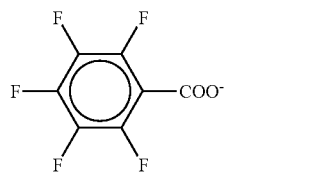
(II-44f)
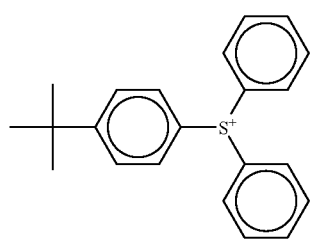
(II-45f)
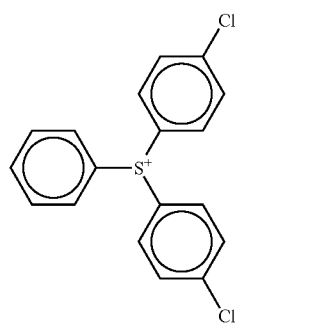
(II-46f)
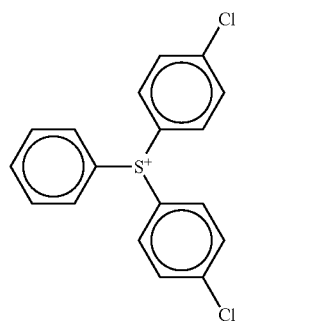
(II-47f)
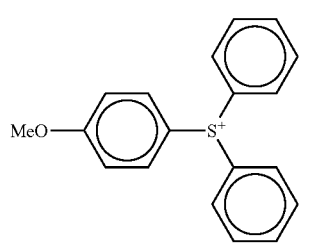
(II-48f)
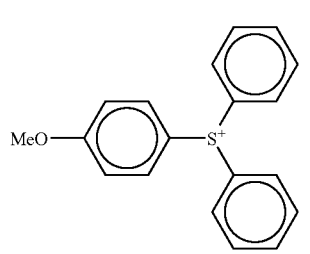
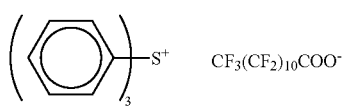
(II-49f)
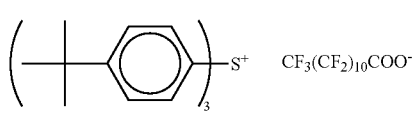
(II-50f)
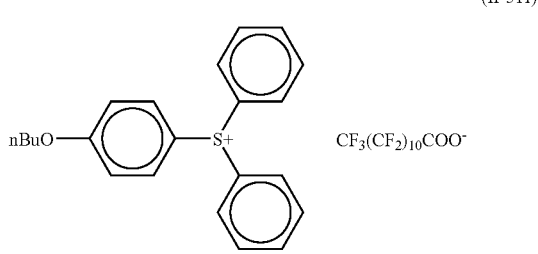
(II-51f)
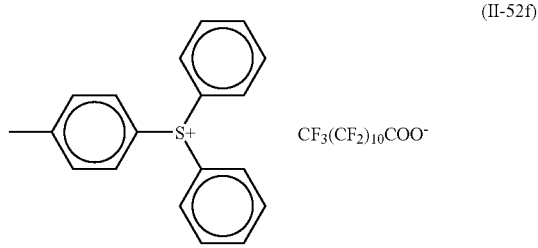
(II-52f)
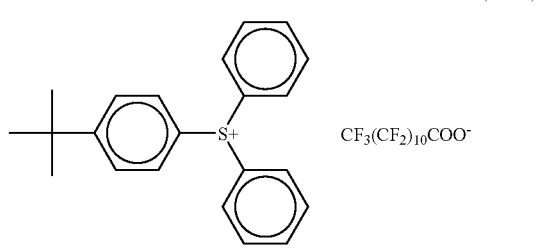
(II-53f)
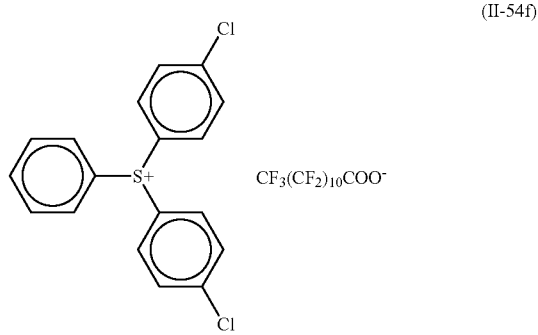
(II-54f)
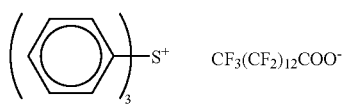
(II-55f)
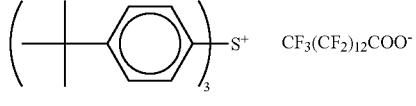
(II-56f)

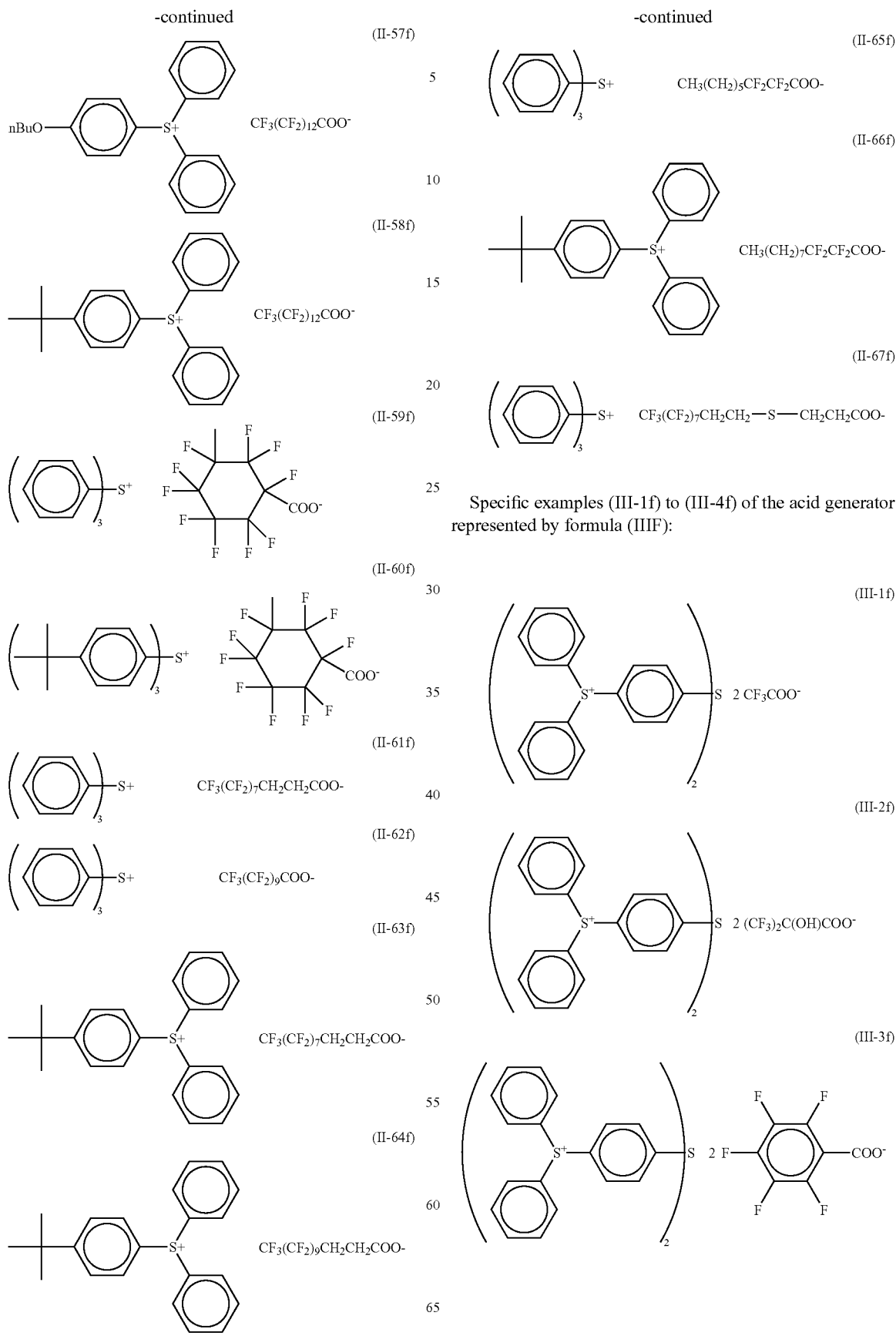
Specific examples (III-1f) to (III-4f) of the acid generator represented by formula (IIIF):

-continued (III-4f)

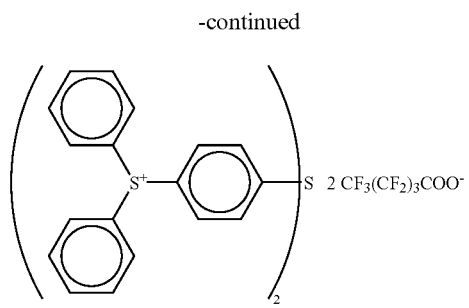

Specific examples (IV-1f) to (V-4f) of other acid generator:

(IV-1f)

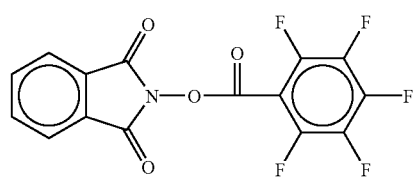

(IV-2f)

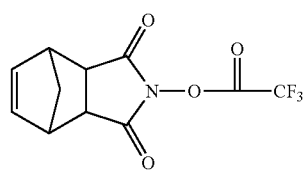

(IV-3f)

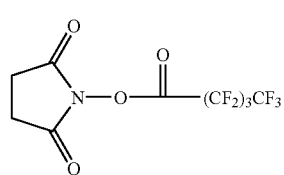

(V-1f)

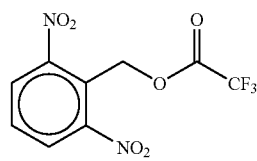

(V-2f)

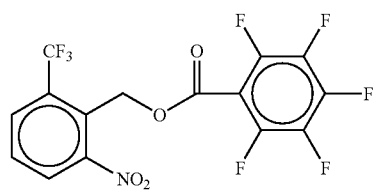

(V-3f)

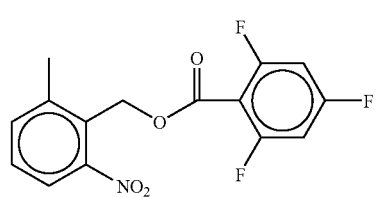

-continued (V-4f)

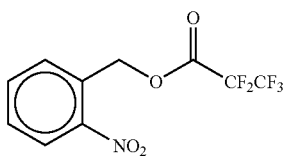

The compound represented by formula (IF) can be synthesized by reacting an aromatic compound with a periodate and subjecting the resulting iodonium salt to salt exchange with a corresponding carboxylic acid.

The compound represented by any one of formulae (IIF) and (IIIF) can be synthesized, for example, by a method comprising reacting an aryl Grignard reagent, e.g., an aryl magnesium bromide with a substituted or unsubstituted phenylsulfoxide and then subjecting the resulting triaryl sulfonium halide to salt exchange with a corresponding carboxylic acid, a method comprising condensing a substituted or unsubstituted phenyl sulfoxide with a corresponding aromatic compound in the presence of an acid catalyst, e.g., methanesulfonic acid/diphosphorus pentaoxide or aluminum chloride and then subjecting the resulting condensate to salt exchange, or a method comprising condensing a diaryl iodonium salt with a diaryl sulfide in the presence of a catalyst, e.g., copper acetate and then subjecting the resulting condensate to salt exchange.

The salt exchange can be conducted by introducing once into a halide, followed by converting to a carboxylate using a silver reagent, e.g., silver oxide, or by using an ion exchange resin. For the salt exchange, a carboxylic acid or carboxylate commercially available or obtained by hydrolysis of a commercially available carboxylic acid halide can be employed.

The fluorine-substituted carboxylic acid as the anion portion is preferably that derived from a fluoro-aliphatic compound produced by a telomerization method (also referred to as a telomer method) or an origomerization method (also referred to as an origomer method). Methods for the production of fluoro-aliphatic compound are described, for example, in Nobuo Ishikawa ed., *Fusso-Kagobutsu no Gosei to Kino* (*Synthesis and Function of Fluorine Compounds*), pages 117 to 118, CMC Publishing Co., Ltd. (1987) and Milos Hudlicky and Attila E. Pavlath ed., *Chemistry of Organic Fluorine Compounds II*, Monograph 187, pages 747 to 752, American Chemical Society (1995). The telomerization method comprises a radical polymerization of a fluorine-containing vinyl compound, e.g., tetrafluoroethylene using an alkyl halide having a large chain transfer constant, e.g., an iodide, as a telogen to synthesize a telomer. In the synthesis according to the telomer method, a mixture of plural compounds having a carbon chain length different from each other are obtained, and the mixture may be used as it is or after purification.

The compound of (A1) and the compound of (A3) are used together in a ratio described below in the present invention. Specifically, the compounds are used ordinarily from 100/0 to 10/90, preferably from 90/10 to 30/70, more preferably from 80/20 to 40/60, in terms of a molar ratio of compound of (A1)/compound of (A3).

<<(A4) Compound that Generates a Carboxylic Acid Free from a Fluorine Atom upon Irradiation of an Actinic Ray or Radiation (Hereinafter, also Referred to as "Compound of (A4)">>

The resist composition according to the present invention may further contain the compound of (A4) as the acid generator.

The compound of (A4) includes, for example, compounds represented by the following formulae (AI) to (AV):

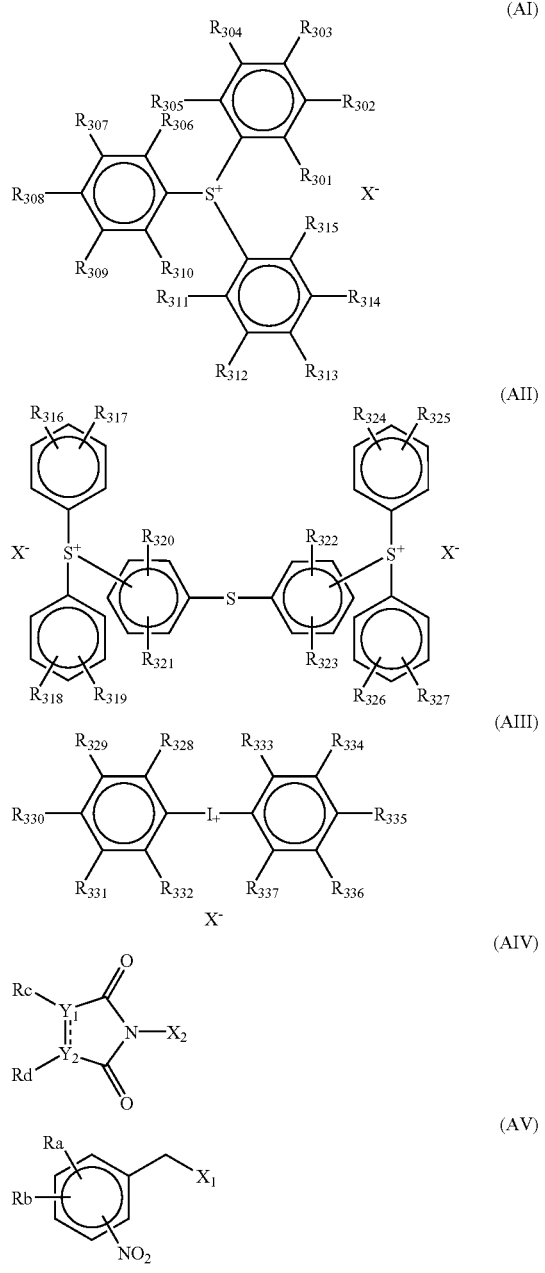

In the above formulae, $R_{301}$ to $R_{337}$ each independently represent a hydrogen atom, a straight chain, branched or cyclic alkyl group, a straight chain, branched or cyclic alkoxy group, a hydroxy group, a halogen atom or a group of $-S-R_0$. $R_0$ represents a straight chain, branched or cyclic alkyl group or an aryl group.

$R_a$ and $R_b$ each independently represent a hydrogen atom, a nitro group, a halogen atom, an alkyl group which may have a substituent or an alkoxy group which may have a substituent. $R_c$ and $R_d$ each independently represent a halogen atom, an alkyl group which may have a substituent or an aryl group which may have a substituent. Alternatively, $R_c$ and $R_d$ may be combined with each other to form an aromatic ring or a monocyclic or polycyclic aliphatic hydrocarbon ring (the ring may contain an oxygen atom or a nitrogen atom). $Y_1$ and $Y_2$ each represent a carbon atom, and the $Y_1$-$Y_2$ bond may be a single bond or a double bond. $X^-$ represents an anion of at least one of carboxylic acid compounds represented by formulae shown below. $X_1$ and $X_2$ each independently represent an ester group formed at the carboxy group of at least one of the carboxylic acid compounds represented by formulae shown below.

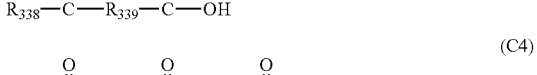

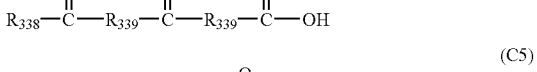

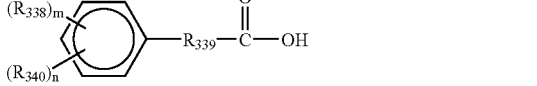

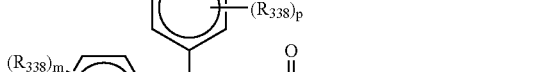

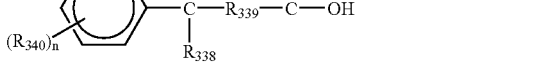

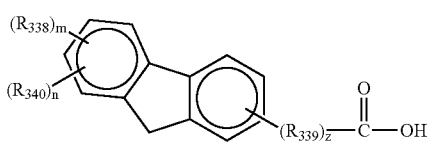

In the above formulae, $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 2 to 20 carbon atoms, a straight chain, branched or cyclic alkynyl group having from 2 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms. Examples of the substituent for the aryl group include an alkyl group, a nitro group, a hydroxy group, an alkoxy group, an acyl group, an alkoxycarbonyl group and a halogen atom.

$R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 2 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxyalkylene group having from 2 to 20 carbon atoms. The plural $R_{338}$'s and $R_{339}$'s may be the same or different from each other.

$R_{340}$ represents a hydroxy group or a halogen atom. The plural $R_{340}$'s may be the same or different from each other. m, n, p and q each independently represent an integer of from 0 to 3, provided that $m+n \leq 5$ and $p+q \leq 5$. z represents 0 or 1.

In formulae (AI) to (AV), the straight chain or branched alkyl group represented by any one of $R_{301}$ to $R_{337}$, $R_a$, $R_b$, $R_c$, $R_d$ and $R_0$ includes that having from 1 to 4 carbon atoms, which may have a substituent, for example, methyl, ethyl, propyl, n-butyl, sec-butyl or tert-butyl group. The cycloalkyl group includes that having from 3 to 8 carbon atoms, which may have a substituent, for example, cyclopropyl, cyclopentyl or cyclohexyl group.

The alkoxy group represented by any one of $R_{301}$ to $R_{337}$, $R_a$ and $R_b$ includes that having from 1 to 4 carbon atoms, which may have a substituent, for example, methoxy, ethoxy, hydroxyethoxy, propoxy, n-butoxy, isobutoxy, sec-butoxy or tert-butoxy group.

The halogen atom represented by any one of $R_{301}$ to $R_{337}$, $R_a$, $R_b$, $R_c$ and $R_d$ includes, for example, fluorine, chlorine, bromine and iodine atoms.

The aryl group represented by any one of $R_0$, $R_c$ and $R_d$ includes that having from 6 to 14 carbon atoms, which may have a substituent, for example, phenyl, tolyl, methoxyphenyl or naphthyl group.

The substituents for the above groups preferably includes an alkoxy group having from 1 to 4 carbon atoms, a halogen atom (e.g., fluorine, chlorine or iodine atom), an aryl group having from 6 to 10 carbon atoms, an alkenyl group having from 2 to 6 carbon atoms, a cyano group, a hydroxy group, a carboxy group, an alkoxycarbonyl group and a nitro group.

The aromatic ring, or monocyclic or polycyclic aliphatic hydrocarbon ring (the ring may contain an oxygen atom or a nitrogen atom) formed by combining $R_c$ and $R_d$ includes, for example, benzene, naphthalene, cyclohexane, norbornene and oxabicyclo structures.

The sulfonium or iodonium compound represented by any one of formulae (AI) to (AIII) for use in the present invention includes as the counter anion represented by $X^-$, an anion ($-COO^-$) of the carboxy group ($-COOH$) of at least one of the carboxylic compounds represented by any one of formulae (C1) to (C10) described above.

The compound represented by any one of formulae (AIV) to (AV) for use in the present invention includes as the substituent $X_1$ or $X_2$, an ester group ($-COO-$) formed from the carboxy group ($-COOH$) of at least one of the carboxylic compounds represented by any one of formulae (C1) to (C10) described above.

The straight chain, branched or cyclic alkyl group having from 1 to 30 carbon atoms (wherein the alkyl group may contain an oxygen atom or a nitrogen atom in the chain thereof) represented by $R_{338}$ includes, for example, methyl, ethyl, propyl, butyl, pentyl, hexyl, cyclohexyl, dodecyl, 1-ethoxyethyl and adamantyl groups.

The straight chain, branched or cyclic alkenyl group having from 2 to 20 carbon atoms includes, for example, ethenyl, propenyl, isopropenyl and cyclohexenyl groups.

The straight chain, branched or cyclic alkynyl group having from 2 to 20 carbon atoms includes, for example, ethynyl and propynyl groups.

The straight chain, branched or cyclic alkoxy group having from 1 to 20 carbon atoms includes, for example, methoxy, ethoxy, propyloxy, butoxy, cyclohexyloxy, isobutoxy and dodecyloxy groups.

The substituted or unsubstituted aryl group having from 6 to 20 carbon atoms includes, for example, phenyl, naphthyl and anthryl groups.

The substituent for the aryl group includes, for example, an alkyl group, a nitro group, a hydroxy group, an alkoxy group, an acyl group, an alkoxycarbonyl group and a halogen atom.

The straight chain, branched or cyclic alkylene group having from 1 to 20 carbon atoms (wherein the alkylene group may contain an oxygen atom or a nitrogen atom in the chain thereof) represented by $R_{339}$ includes, for example, methylene, ethylene, propylene, butylene, isobutylene, ethoxyethylene and cyclohexylene groups.

The straight chain, branched or cyclic alkenylene group having from 2 to 20 carbon atoms includes, for example, vinylene and allylene groups.

Specific examples of the compound of (A4) are set forth below, but the present invention should not be construed as being limited thereto.

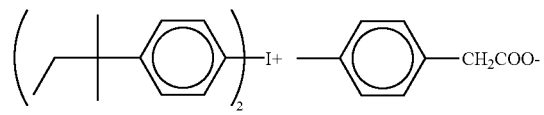

-continued
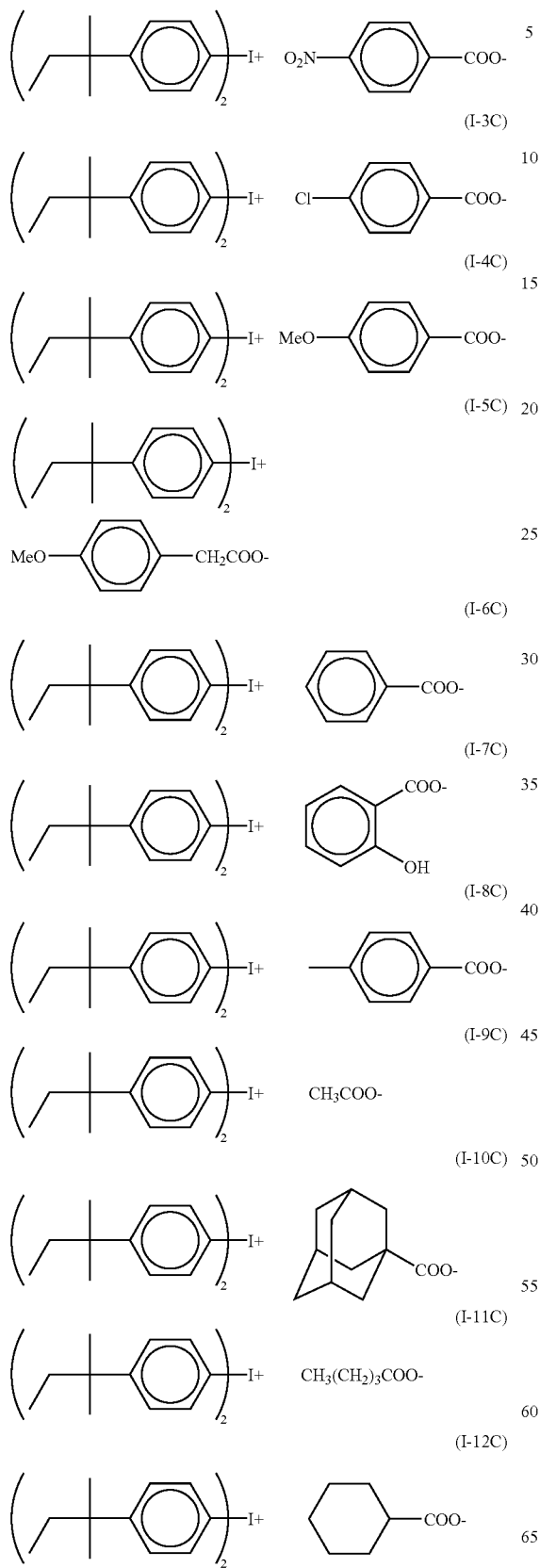
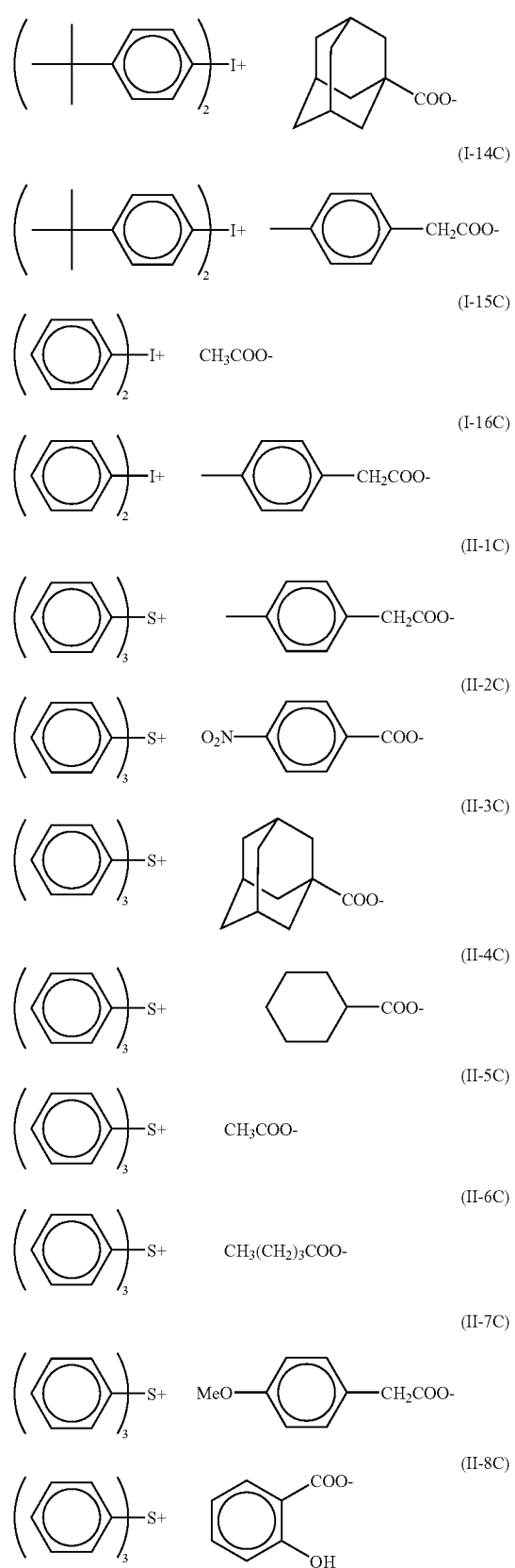

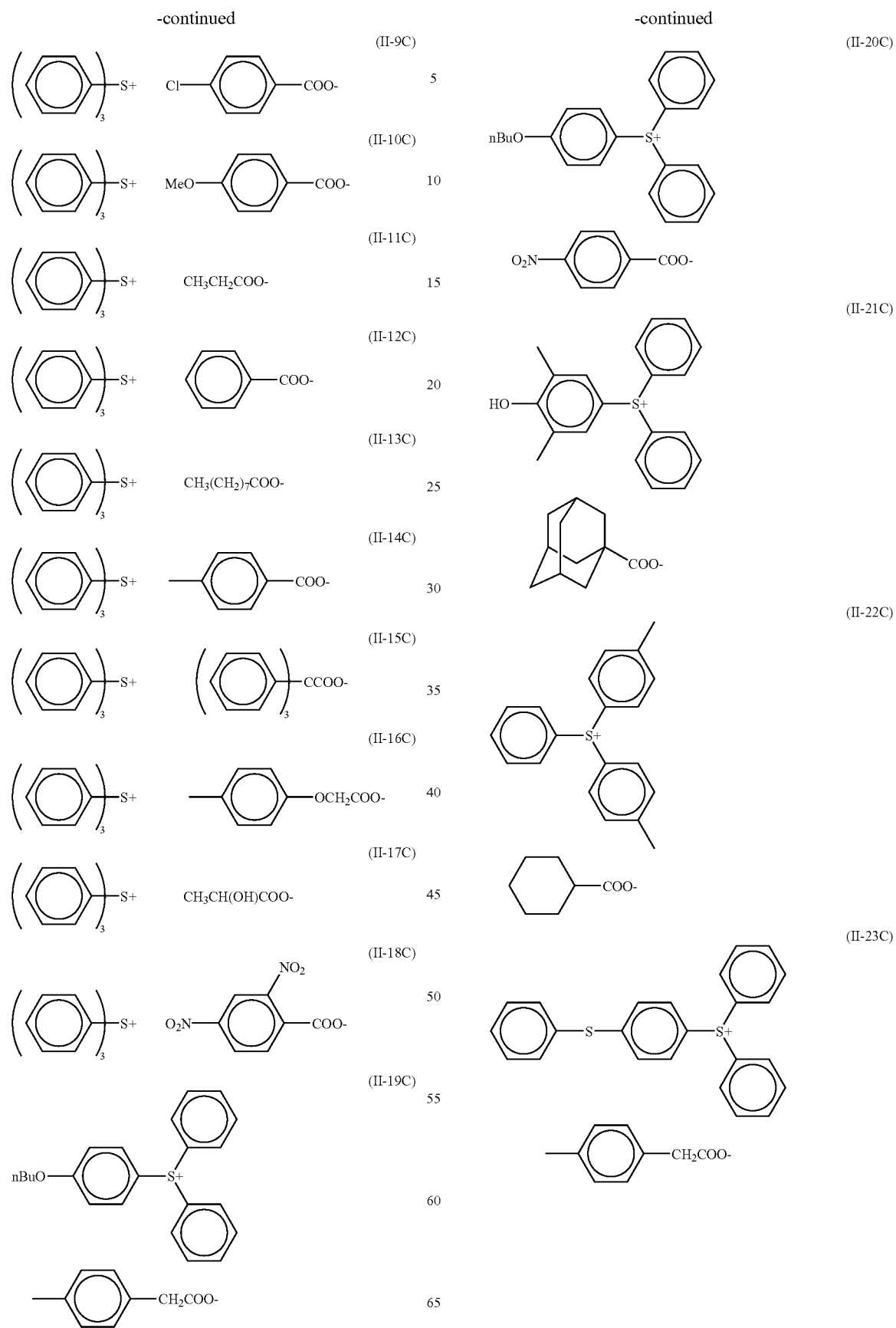

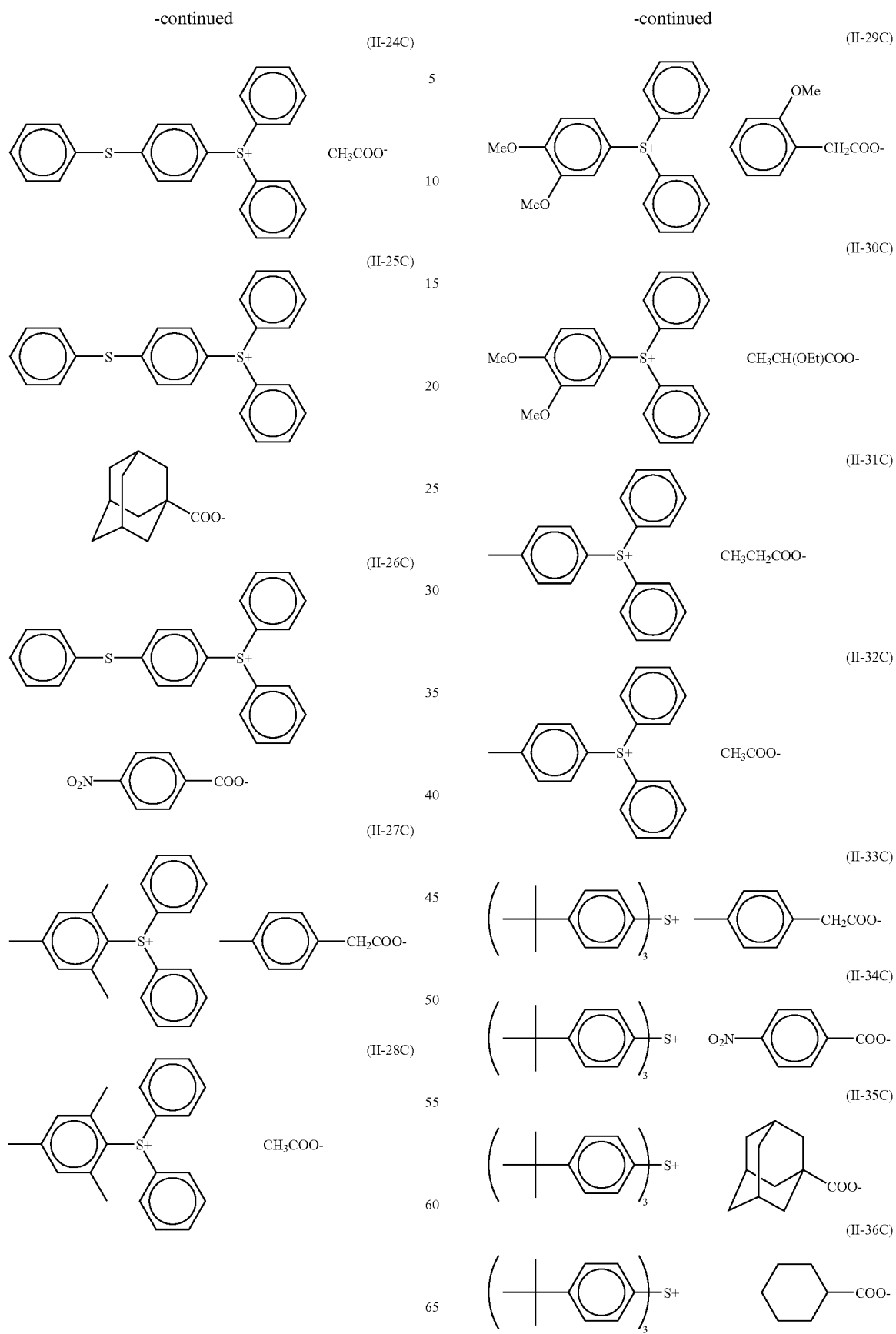
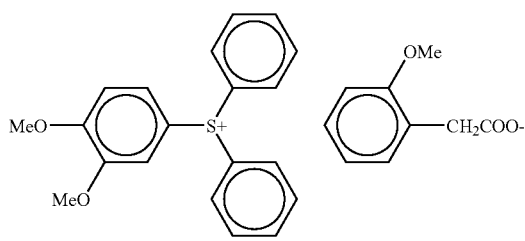
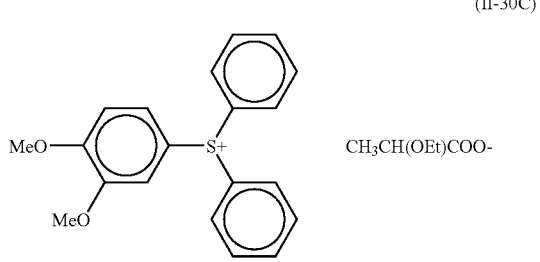
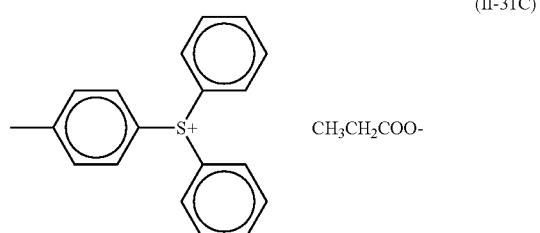
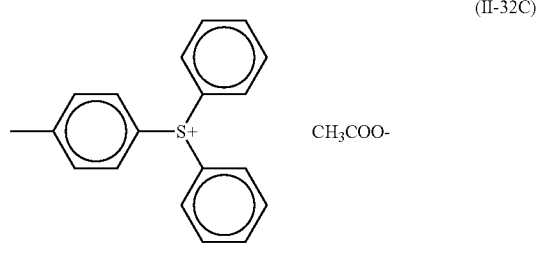
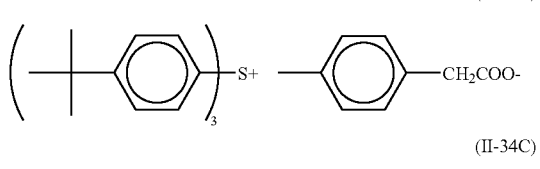
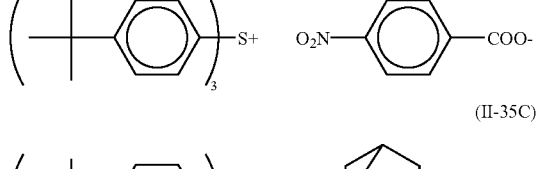
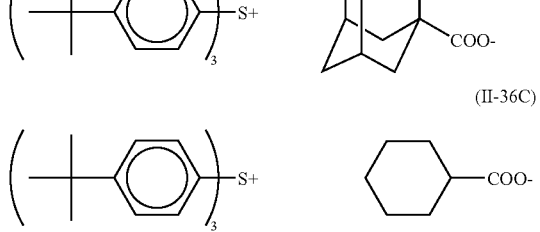

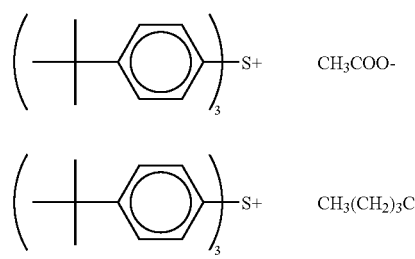 (II-37C)
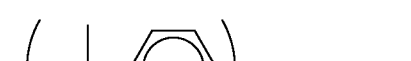 (II-38C)
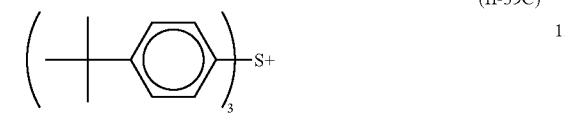 (II-39C)
 (II-40C)
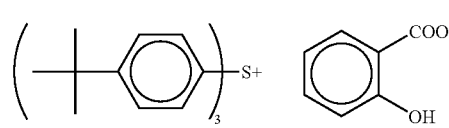
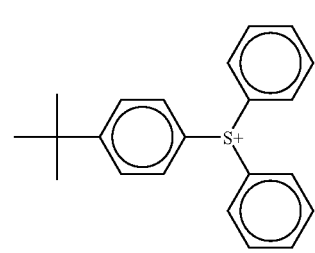 (II-41C)
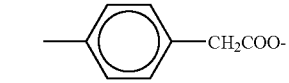 (II-42C)
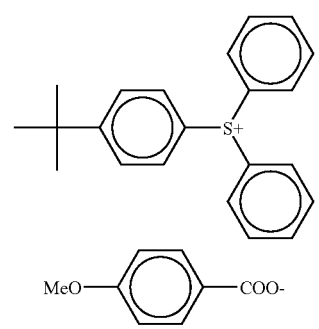 (II-43C)
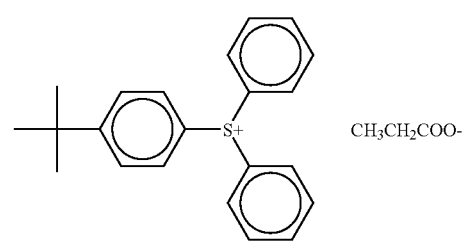
(II-44C)
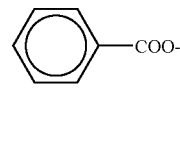
(II-45C)
(II-46C)
(II-47C)
(II-48C)

The compound of (A1) and the compound of (A4) are used together in a ratio described below in the present invention. Specifically, the compounds are used ordinarily from 100/0 to 10/90, preferably from 90/10 to 30/70, more preferably from 80/20 to 40/60, in terms of a molar ratio of compound of (A1)/compound of (A4).

<<Other Compounds that Generate an Acid upon Irradiation of an Actinic Ray or Radiation>>

In the present invention, a compound that generates an acid upon irradiation of an actinic ray or radiation other than the compound of (A1), the compound of (A2), the compound of (A3) and the compound of (A4) described above may be further used together.

A molar ratio of the total amount of compound of (A1), compound of (A2), compound of (A3) and compound of (A4) according to the present invention to the other compound that generates an acid upon irradiation of an actinic ray or radiation used together therewith is ordinarily from 100/0 to 10/90, preferably from 98/2 to 40/60, and more preferably from 95/5 to 50/50.

Such a compound that generates an acid upon irradiation of an actinic ray or radiation used together with the acid generators according to the present invention can be appropriately selected from photoinitiators for cationic polymerization, photoinitiators for photo-radical polymerization, photo-achromatic agents for dyes, photo-discoloring agents, compounds capable of generating an acid upon known light used for microresists, and mixtures thereof.

Specific examples of such compounds include diazonium salts as described, e.g., in S. I. Schlesinger, *Photogr. Sci. Eng.*, 18, 387 (1974) and T. S. Bal et al., *Polymer*, 21, 423 (1980); onium salts, for example, ammonium salts as described, e.g., in U.S. Pat. Nos. 4,069,055, 4,069,056 and Re 27,992 and JP-A-3-140140, phosphonium salts as described, e.g., in D. C. Necker et al., *Macromolecules*, 17, 2468 (1984), C. S. Wen et al., *Teh. Proc. Conf. Rad. Curing ASIA*, p. 478, Tokyo (October 1988) and U.S. Pat. Nos. 4,069,055 and 4,069,056, iodonium salts as described, e.g., in J. V. Crivello et al., *Macromolecules*, 10(6), 1307(1977), *Chem. & Eng. News*, Nov. 28, p. 31 (1988), European Patents 104,143, 339,049 and 410,201, JP-A-2-150848 and JP-A-2-296514, sulfonium salts as described, e.g., in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14(5), 1141 (1981), J. V. Crivello et al., *J. Polymer Sci.*, Polymer Chem. Ed., 17, 2877 (1979), European Patents 370,693, 161,811, 410,201, 339,049, 233,567, 297,443 and 297,442, U.S. Pat. Nos. 3,902,114, 4,933,377, 4,760,013, 4,734,444 and 2,883,827, German Patents 2,904,626, 3,604,580 and 3,604,581, selenonium salts as described, e.g., in J. V. Crivello et al., *Macromolecules*, 10(6), 1307 (1977) and J. V. Crivello et al., *J. Polymer Sci.*, Polymer Chem. Ed., 17, 1047 (1979), and arsonium salts as described, e.g., in C. S. Wen et al., *Teh. Proc. Conf. Rad. Curing ASIA*, p. 478, Tokyo (October, 1988); organic halogen compounds as described, e.g., in U.S. Pat. No. 3,905,815, JP-B-46-4605, JP-A-48-36281, JP-A-55-32070, JP-A-60-239736, JP-A-61-169835, JP-A-61-169837, JP-A-62-58241, JP-A-62-212401, JP-A-63-70243 and JP-A-63-298339; organic metal/organic halogen compounds as described, e.g., in K. Meier et al., *J. Rad. Curing*, 13(4), 26(1986), T. P. Gill et al., *Inorg. Chem.*, 19, 3007 (1980), D. Astruc, *Acc. Chem. Res.*, 19(12), 377 (1986) and JP-A-2-161445; photo-acid generators having an o-nitrobenzyl type protective group as described, e.g., in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. imaging Technol.*, 11(4), 191 (1985), H. M. Houlihan et al., *Macromolecules*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid State Sci. Technol., 130(6), F. M. Houlihan et al., *Macromolecules*, 21, 2001 (1988), European Patents 290,750, 046,083, 156,535, 271,851 and 388,343, U.S. Pat. Nos. 3,901,710 and 4,181,531, JP-A-60-198538 and JP-A-53-133022; compounds generating a sulfonic acid upon photolysis, as typified by iminosulfonates, as described, e.g., in M. Tunooka et al., *Polymer Preprints Japan*, 35(8), G. Berner et al., *J. Rad. Curing*, 13(4), W. J. Mijs et al., *Coating Technol.*, 55(697), 45(1983), Akzo, H. Adachi et al., *Polymer Preprints Japan*, 37(3), European Patents 199,672, 084,515, 044,115, 618,564 and 101,122, U.S. Pat. Nos. 4,371,605 and 4,431,774, JP-A-64-18143, JP-A-2-245756 and JP-A-3-140109; and disulfone compounds as described, e.g., in JP-A-61-166544.

Also, polymer compounds in which a group or compound capable of generating an acid upon exposure to light is introduced into the main chain or side chain thereof, for example, compounds as described, e.g., in M. E. Woodhouse et al., *J. Am. Chem. Soc.*, 104, 5586(1982), S. P. Pappas et al., *J. Imaging Sci.*, 30(5), 218(1986), S. Kondo et al., *Makromol. Chem.*, Rapid Commun., 9, 625(1988), Y. Yamada et al., *Makromol. Chem.*, 152, 153, 163 (1972), J. V. Crivello et al., *J. Polymer Sci.*, Polymer Chem. Ed., 17, 3845(1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853 and JP-A-63-146029 can be used.

Further, compounds capable of generating an acid upon exposure to light as described, e.g., in V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778 and European Patent 126,712 can also be used.

<<(BP) Polymer that is Insoluble or Hardly Soluble in an Aqueous Alkali Solution but Becomes Soluble in the Aqueous Alkali Solution by the Action of an Acid (Hereinafter, also Referred to as "Component (BP)")>>

The component (BP) for use in the positive resist composition of the present invention includes a resin having a group decomposable with an acid in the main chain or side chain thereof, or in both the main chain and side chain thereof. A resin having a group decomposable with an acid in the side chain thereof is more preferred.

Preferred examples of the group decomposable with an acid include a group represented by —COOA$^0$ and a group represented by —O—B$^0$.

In the above formulae, A$^0$ represents —C(R$^{01}$)(R$^{02}$)(R$^{03}$), —Si(R$^{01}$)(R$^{02}$)(R$^{03}$) or —C(R$^{04}$)(R$^{05}$)—O—R$^{06}$. B$^0$ represents -A$^0$ or —CO—O-A$^0$. R$^{01}$ to R$^{06}$, which may be the same or different, each represent an alkyl group which may have a substituent, a cycloalkyl group which may have a substituent, an alkenyl group which may have a substituent, an aralkyl group which may have a substituent or an aryl group which may have a substituent.

Preferred examples of the group decomposable with an acid include a silyl ether group, a cumyl ester group, an acetal group, a tetrahydropyranyl ether group, an enol ether group, an enol ester group, a tertiary alkyl ether group, a tertiary alkyl ester group and a tertiary alkylcarbonate group. More preferred examples thereof include a tertiary alkyl ester group, a tertiary alkylcarbonate group, a cumyl ester group, an acetal group and a tetrahydropyranyl ether group. Particularly, tert-butoxycarbonyl group is preferred.

In a case wherein the group decomposable with an acid is bonded as a side chain, a parent resin is an alkali-soluble resin having an —OH group or a —COOH group in the side chain. Examples of the parent resin include alkali-soluble resins described hereinafter.

An alkali-dissolution rate of the alkali-soluble resin is preferably not less than 170 angstroms/sec, and more preferably not less than 330 angstroms/sec, when measured in a 0.261 N aqueous solution of tetramethylammonium hydroxide (TMAH) at 23° C.

From the standpoint of alkali-dissolution rate, preferred examples of the alkali-soluble resin include a poly(o-, m-, or p-hydroxystyrene), a copolymer of o-, m-, or p-hydroxystyrene, a hydrogenated poly(hydroxystyrene), a halogen- or alkyl-substituted poly(hydroxystyrene), a partially O-alkylated or O-acylated poly(hydroxystyrene), a styrene-hydroxystyrene copolymer, an α-methylstyrene-hydroxystyrene copolymer and a hydrogenated novolac resin.

A resin having a structural unit containing a group represented by formula (X1) or (X2) described above is also referred as the component (BP).

In formula (X1), R$_{1b}$ and R$_{2b}$, which may be the same or different, each represent a hydrogen atom or an alkyl group. R$_{3b}$ and R$_{4b}$, which may be the same or different, each represent a hydrogen atom, an alkyl group which may have a substituent or a cycloalkyl group which may have a substituent. R$_{5b}$ represents an alkyl group which may have a substituent, a cycloalkyl group which may have a substituent, an aryl group which may have a substituent or an aralkyl group which may have a substituent. m represents an integer of from 0 to 20, and n represents an integer of from 0 to 5.

In formula (X2), R$_{6b}$ and R$_{7b}$, which may be the same or different, each represent a hydrogen atom or an alkyl group. W represents a divalent organic group. R$_{8b}$ represents an alkyl group which may have a substituent, a cycloalkyl group which may have a substituent, an aryl group which may have a substituent or an aralkyl group which may have a substituent.

The alkyl group represented by any one of $R^{01}$ to $R^{06}$ and $R_{1b}$ to $R_{8b}$ may be a straight chain or branched alkyl group, and preferably includes that having from 1 to 4 carbon atoms, which may have a substituent, for example, methyl, ethyl, propyl, n-butyl, sec-butyl or tert-butyl group.

The cycloalkyl group represented by any one of $R^{01}$ to $R^{06}$, $R_{3b}$ to $R_{5b}$ and $R_{8b}$ preferably includes that having from 3 to 8 carbon atoms, which may have a substituent, for example, cyclopropyl, cyclopentyl or cyclohexyl group.

The alkenyl group represented by any one of $R^{01}$ to $R^{06}$ preferably includes that having from 2 to 8 carbon atoms, which may have a substituent, for example, vinyl, allyl, butenyl or cyclohexenyl group.

The aralkyl group represented by any one of $R^{01}$ to $R^{06}$, $R_{5b}$ and $R_{8b}$ preferably includes that having from 7 to 12 carbon atoms, which may have a substituent, for example, benzyl, phenethyl or naphthylmethyl group.

The aryl group represented by any one of $R^{01}$ to $R^{06}$, $R_{5b}$ and $R_{8b}$ preferably includes that having from 6 to 15 carbon atoms, which may have a substituent, for example, phenyl, tolyl, naphthyl or anthryl group.

The substituent for the alkyl, cycloalkyl, alkenyl, aralkyl or aryl group described above include, for example, a carboxy group, an acyloxy group, a cyano group, an aryl group, an alkyl group, a cycloalkyl group, a halogen atom, a hydroxy group, an alkoxy group, an acetylamido group, an alkoxycarbonyl group and an acyl group.

The divalent organic group represented by W preferably includes a straight chain, branched or cyclic alkylene group which may have a substituent, an arylene group which may have a substituent, a heteroarylene group which may have a substituent, an aralkylene group which may have a substituent, —S—, —C(=O)—, —N($R_{4c}$)—, —SO—, —SO$_2$—, —CO$_2$—, —N($R_{4c}$)SO$_2$— and a divalent group formed by combination of two or more of these groups. $R_{4c}$, represents a hydrogen atom or an alkyl group (which has the same meaning as the alkyl group represented by $R^{01}$ described above).

The component (BP) for use in the present invention can be obtained by reacting an alkali-soluble resin with a precursor of the group decomposable with an acid, or by copolymerizing a monomer for forming an alkali-soluble resin, which has the group decomposable with an acid, with any of various monomers, as described, for example, in European Patent 254,853, JP-A-2-25850, JP-A-3-223860 and JP-A-4-251259.

Specific examples of the component (BP) for use in the present invention are set forth below, but the present invention should not be construed as being limited thereto.

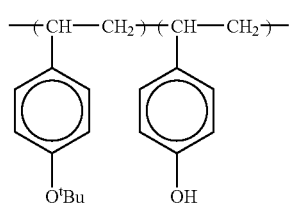

(B-1)

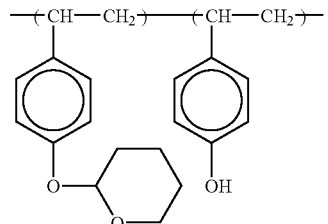

(B-2)

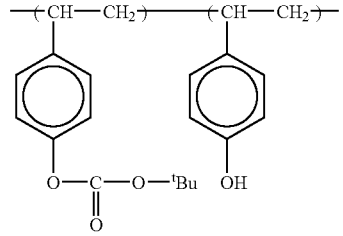

(B-3)

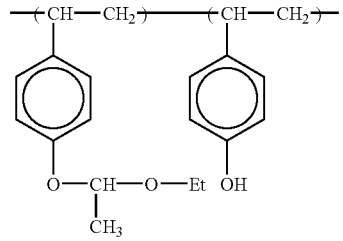

(B-4)

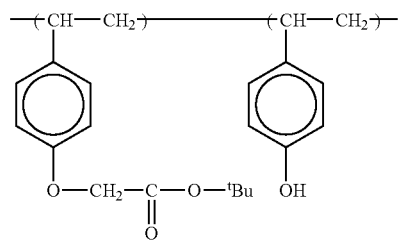

(B-5)

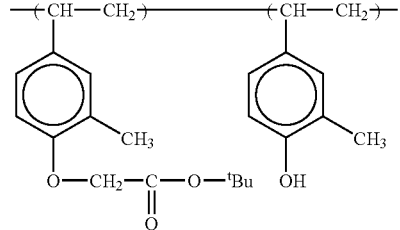

(B-6)

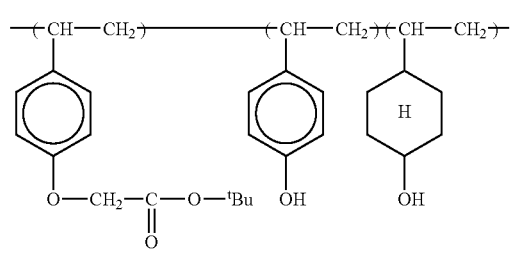

(B-7)

-continued
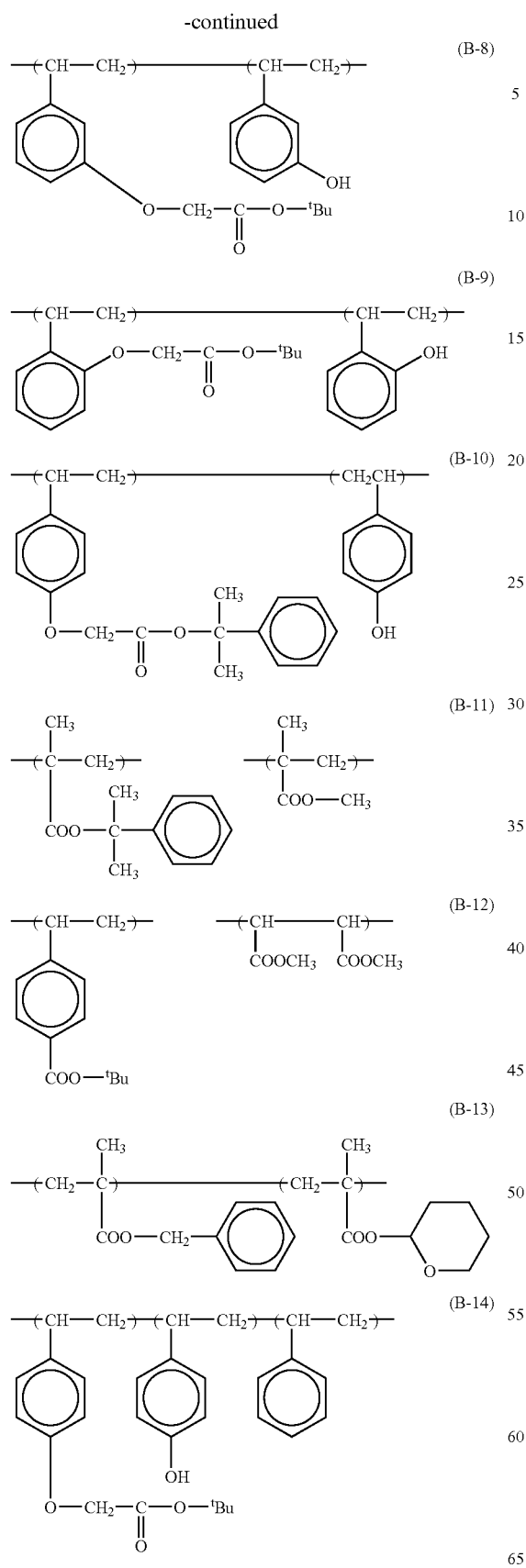
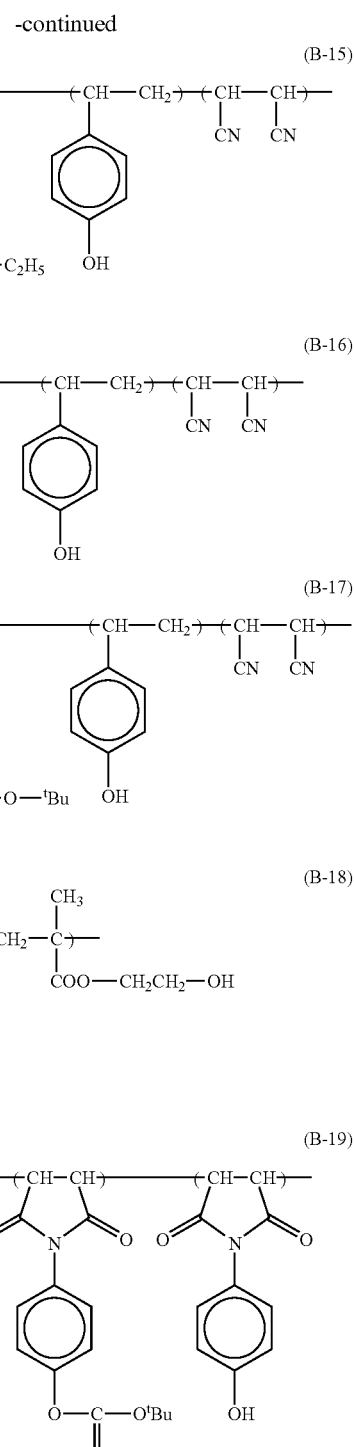

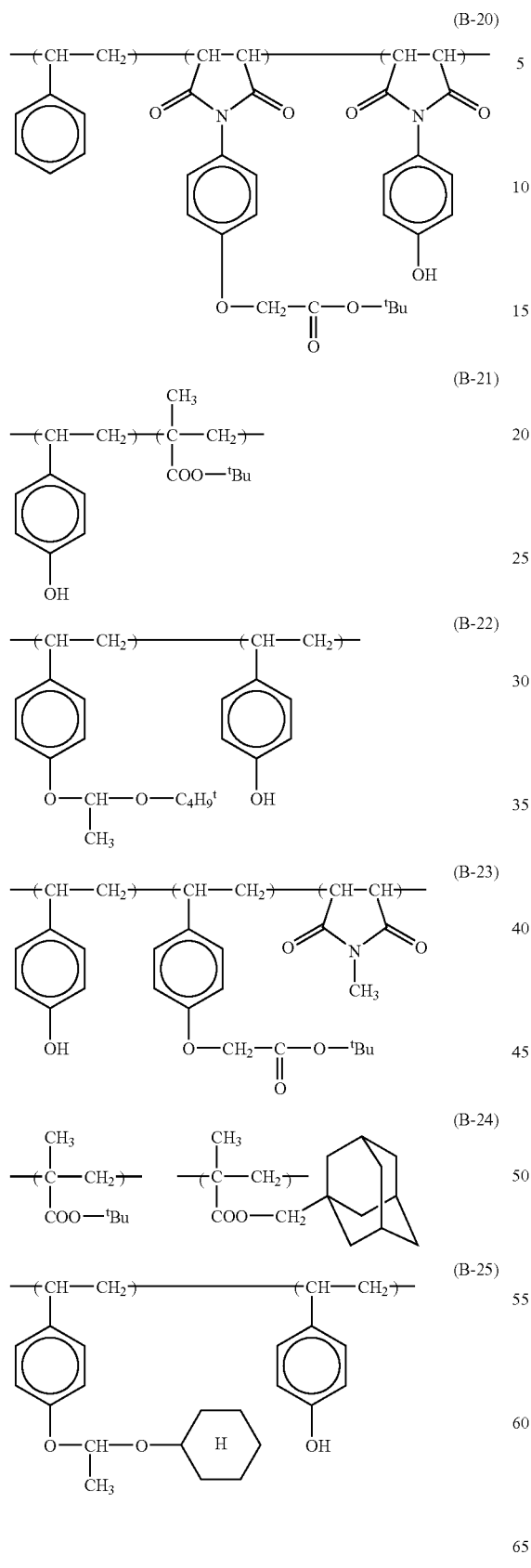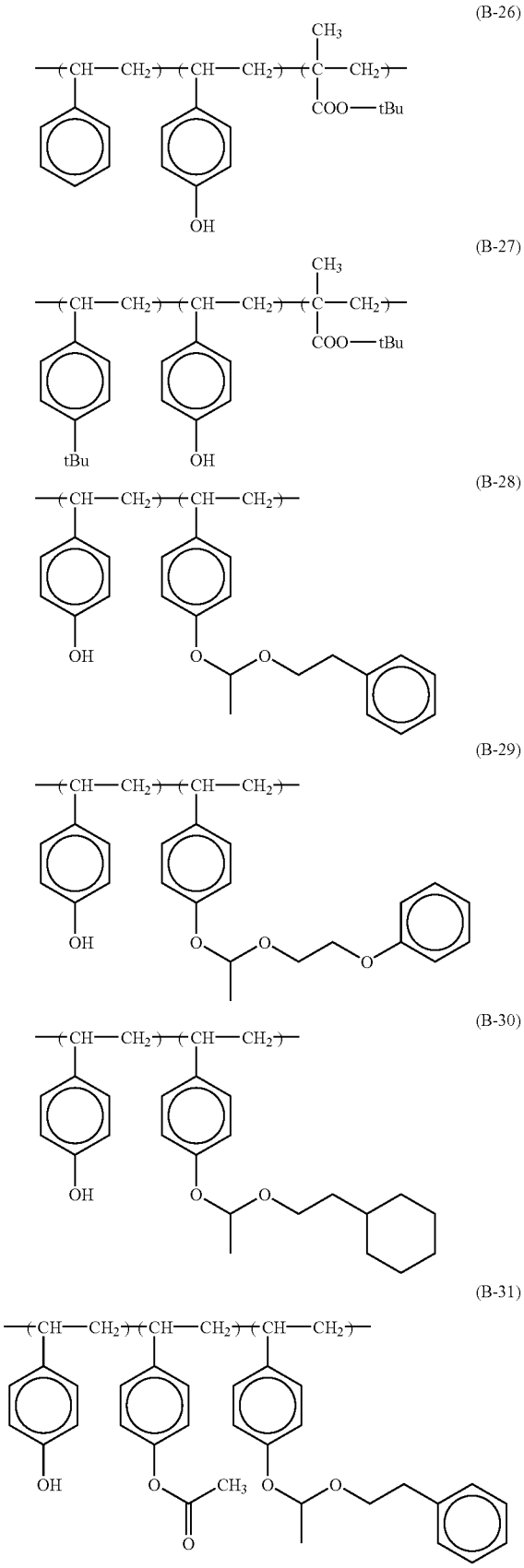

-continued

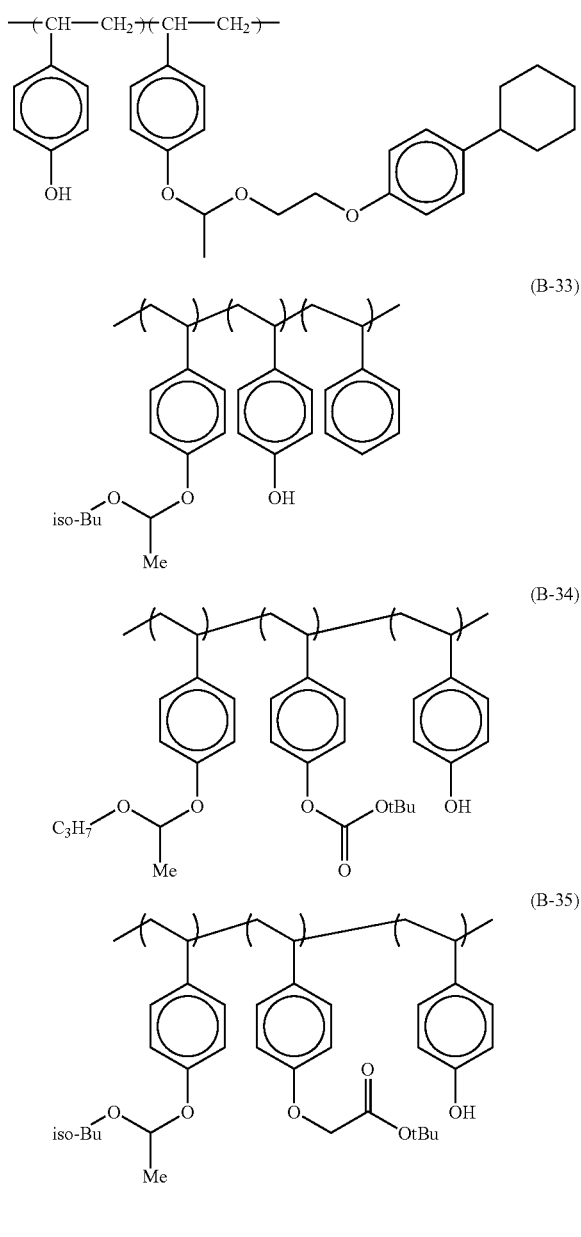

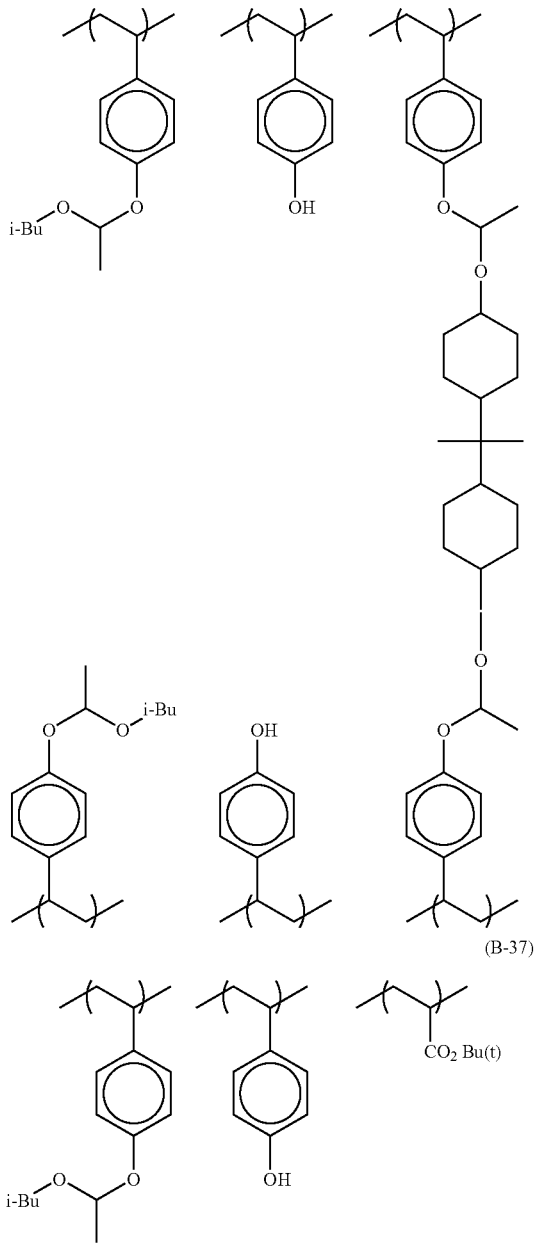

A ratio of content of the group decomposable with an acid in the resin is indicated by a formula of B/(B+S) wherein B represents a number of the group decomposable with an acid and S represents a number of an alkali-soluble group that is not protected by the group decomposable with an acid. The ratio of content is preferably from 0.01 to 0.7, more preferably from 0.05 to 0.50, and still more preferably from 0.05 to 0.40. The ratio of content of more than 0.7 is disadvantageous in view of film shrinking after PEB, adhesion failure to a substrate or occurrence of scam. On the other hand, the ratio of content of less than 0.01 is also not preferred, since a remarkable standing wave effect on the sidewall of pattern may occur in some cases.

The weight average molecular weight (Mw) of the component (BP) is preferably in a range of from 2,000 to 200,000. If it is less than 2,000, decrease in a film thickness of the unexposed area after development is large and on the other hand, if it exceeds 200,000, a dissolution rate of the alkali-soluble resin per se to alkali decreases, resulting in lowering sensitivity. The weight average molecular weight is more preferably in a range of from 5,000 to 100,000, and still more preferably in a range of from 8,000 to 50,000.

The molecular weight distribution (Mw/Mn) is preferably from 1.0 to 4.0, more preferably from 1.0 to 2.0, and particularly preferably from 1.0 to 1.6.

The weight average molecular weight is expressed using a value determined by gel permeation chromatography and calculated in terms of polystyrene.

Two or more of the polymers of component (BP) may be used in the positive resist composition of the present invention.

The amount of the polymer of component (BP) is ordinarily from 70 to 98% by weight, and preferably from 80 to 96% by weight, based on the solid content of the positive resist composition of the present invention.

<<(BN) Alkali-soluble Resin (Hereinafter, also Referred to as "Component (BN)" or "Resin of (BN)")>>

The alkali-soluble resin for use in the negative resist composition of the present invention includes polymers having a phenol skeleton, which have hitherto been disclosed for negative chemical amplification resists, for example, phenol novolac resins, polyvinylphenol resins, copolymers having a structural unit derived from vinylphenol and resins obtained by protecting or modifying a part of polyvinylphenol resin.

The resin of component (BN) includes preferably a resin containing a repeating unit represented by the following formula (a):

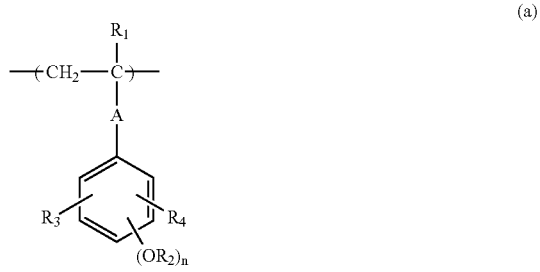

(a)

In formula (a), $R_1$ represents a hydrogen atom, a halogen atom, a cyano group, an alkyl group which may have a substituent or a haloalkyl group which may have a substituent. $R_2$ represents a hydrogen atom, an alkyl group which may have a substituent, a cycloalkyl group which may have a substituent, an aryl group which may have a substituent, an aralkyl group which may have a substituent or an acyl group which may have a substituent. $R_3$ and $R_4$, which may be the same or different, each represent a hydrogen atom, a halogen atom, a cyano group, an alkyl group which may have a substituent, a cycloalkyl group which may have a substituent, an alkenyl group which may have a substituent, an aralkyl group which may have a substituent or an aryl group which may have a substituent.

A represents a single bond, an alkylene group which may have a substituent, an alkenylene group which may have a substituent, a cycloalkylene group which may have a substituent, an arylene group which may have a substituent, —O—, —SO$_2$—, —O—CO—R$_5$—, —CO—O—R$_6$— or —CO—N(R$_7$)—R$_8$—.

$R_5$, $R_6$ and $R_8$, which may be the same or different, each represent a single bond, an alkylene group which may have a substituent, an alkenylene group which may have a substituent, a cycloalkylene group which may have a substituent, an arylene group which may have a substituent, a divalent group formed by combining the above-described alkylene, alkenylene, cycloalkylene or arylene group and at least one member selected from an ether structure, an ester structure, an amido structure, a urethane structure and a ureido structure.

$R_7$ represents a hydrogen atom, an alkyl group which may have a substituent, a cycloalkyl group which may have a substituent, an aralkyl group which may have a substituent or an aryl group which may have a substituent.

n represents an integer of from 1 to 3. Alternatively, plural $R_2$'s, $R_2$ and $R_3$ or $R_2$ and $R_4$ may be combined with each other to form a ring.

A phenol resin containing the repeating structural unit represented by formula (a) described above is more preferably used.

The alkyl group represented by any one of $R_1$ to $R_4$ and $R_7$ preferably includes an alkyl group having from 1 to 8 carbon atoms, specifically, methyl, ethyl, propyl, n-butyl, sec-butyl, hexyl, 2-ethylhexyl and octyl groups. The cycloalkyl group represented by any one of $R_2$ to $R_4$ and $R_7$ may be monocyclic or polycyclic. The monocyclic cycloalkyl group preferably includes that having from 3 to 8 carbon atoms, specifically, cyclopropyl, cyclopentyl and cyclohexyl groups. The polycyclic cycloalkyl group preferably includes adamantyl, norbornyl, isobornyl, dicyclopentyl, α-pinenyl and tricyclodecanyl groups.

The alkenyl group represented by any one of $R_3$ and $R_4$ preferably includes an alkenyl group having from 2 to 8 carbon atoms, specifically, vinyl, allyl, butenyl and cyclohexenyl groups.

The aryl group represented by any one of $R_2$ to $R_4$ and $R_7$ preferably includes an aryl group having from 6 to 15 carbon atoms, specifically, phenyl, tolyl, dimethylphenyl, 2,4,6-trimethylphenyl, naphthyl and anthryl groups.

The aralkyl group represented by any one of $R_2$ to $R_4$ and $R_7$ preferably includes an aralkyl group having from 7 to 12 carbon atoms, specifically, benzyl, phenethyl and naphthylmethyl groups.

The haloalkyl group represented by $R_1$ preferably includes a haloalkyl group having from 1 to 4 carbon atoms, specifically, chloromethyl, chloroethyl, chloropropyl, chlorobutyl, bromomethyl and bromoethyl groups.

The acyl group represented by $R_2$ preferably includes an acyl group having from 1 to 8 carbon atoms, specifically, formyl, acetyl, propanoyl, butanoyl, pivaloyl and benzoyl groups.

The alkylene group represented by any one of A, $R_5$, $R_6$ and $R_8$ preferably includes an alkylene group having from 1 to 8 carbon atoms, which may have a substituent, specifically, methylene, ethylene, propylene, butylene, hexylene and octylene groups.

The alkenylene group represented by any one of A, $R_5$, $R_6$ and $R_8$ preferably includes an alkenylene group having from 2 to 6 carbon atoms, which may have a substituent, specifically, ethenylene, propenylene and butenylene groups.

The cycloalkylene group represented by any one of A, $R_5$, $R_6$ and $R_8$ preferably includes a cycloalkylene group having from 5 to 8 carbon atoms, which may have a substituent, specifically, cyclopentylene and cyclohexylene groups.

The arylene group represented by any one of A, $R_5$, $R_6$ and $R_8$ preferably includes an arylene group having from 6 to 12 carbon atoms, which may have a substituent, specifically, phenylene, tolylene and naphthylene groups.

The substituents for the above-described groups include a group having an active hydrogen, for example, an amino group, an amido group, a ureido group, a urethane group, a hydroxy group or a carboxy group, a halogen atom (e.g., fluorine, chlorine, bromine or iodine atom), an alkoxy group (e.g., methoxy, ethoxy, propoxy or butoxy group), a thioether group, an acyl group (e.g., acetyl, propanoyl or benzoyl group), an acyloxy group (e.g., acetoxy, propanoyloxy or benzoyloxy group), an alkoxycarbonyl group (e.g., methoxycarbonyl, ethoxycarbonyl or propoxycarbonyl group), a cyano group and a nitro group. Particularly, a group having an active hydrogen, for example, an amino group, a hydroxy group or a carboxy group is preferred.

The ring formed by combining plural $R_2$'s, $R_2$ and $R_3$ or $R_2$ and $R_4$ with each other includes 4-membered to 7-membered rings containing the oxygen atom, for example, benzofuran, benzodioxonol or benzopyran ring.

The resin of (BN) for use in the present invention may be a resin composed of the repeating structural unit represented by formula (a) alone. For the purpose of further improving performance of the negative resist composition of the present invention, the resin of (BN) may be a copolymer containing the repeating structural unit represented by formula (a) and repeating units derived from one or more other polymerizable monomers.

The copolymerizable monomers which can be used in the present invention include, for example, compounds having one addition-polymerizable unsaturated bond selected from acrylic acid esters, acrylamides, methacrylic acid esters, methacrylamides, allyl compounds, vinyl ethers, vinyl esters, styrenes and crotonic acid esters.

Among the monomers, monomers improving the solubility in alkali, for example, a monomer having a carboxy group, e.g., carboxystyrene, N-(carboxyphenyl)acrylamide or N-(carboxyphenyl)methacrylamide, or maleimide is preferred as the copolymerization component.

The content of other monomers in the resin is preferably 50% by mole or less, and more preferably 30% by mole or less, based on the total repeating units of the resin.

Specific examples of the resin having the repeating structural unit represented by formula (a) are set forth below, but the present invention should not be construed as being limited thereto.

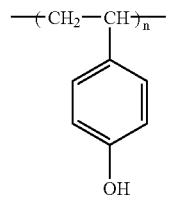

a-(1)

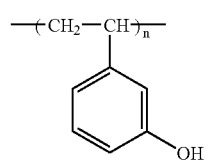

a-(2)

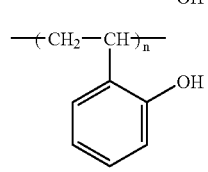

a-(3)

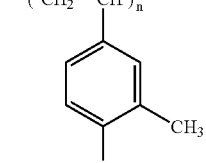

a-(4)

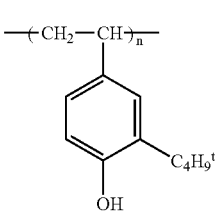

a-(5)

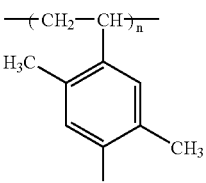

a-(6)

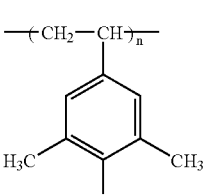

a-(7)

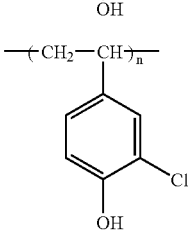

a-(8)

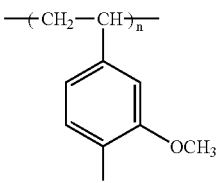

a-(9)

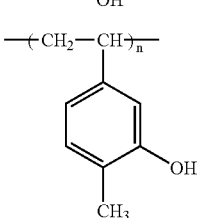

a-(10)

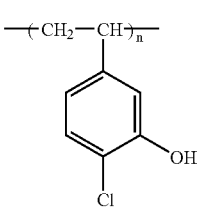

a-(11)

-continued
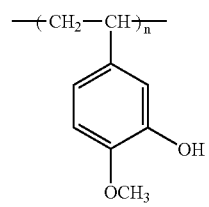
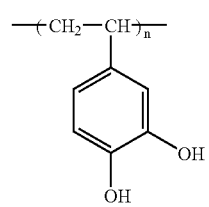
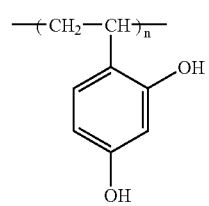
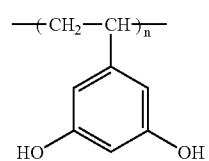
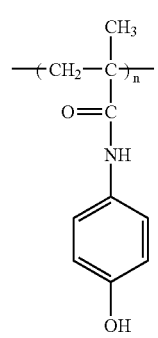
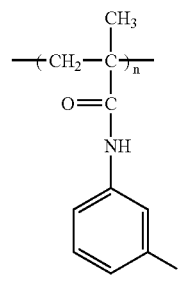
-continued
a-(12)
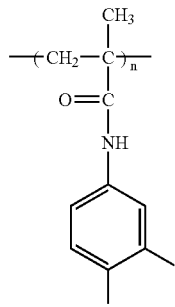
a-(13)
a-(14)
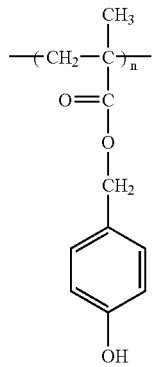
a-(15)
a-(16)
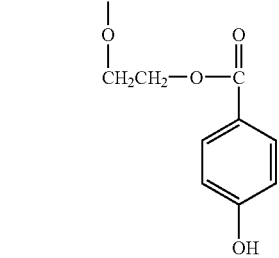
a-(17)
a-(18)
a-(19)
a-(20)
a-(21)
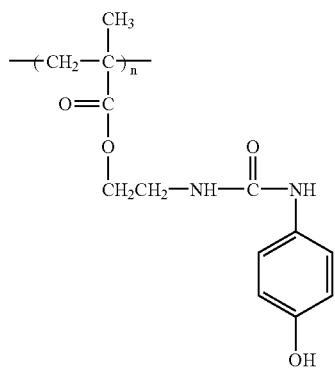

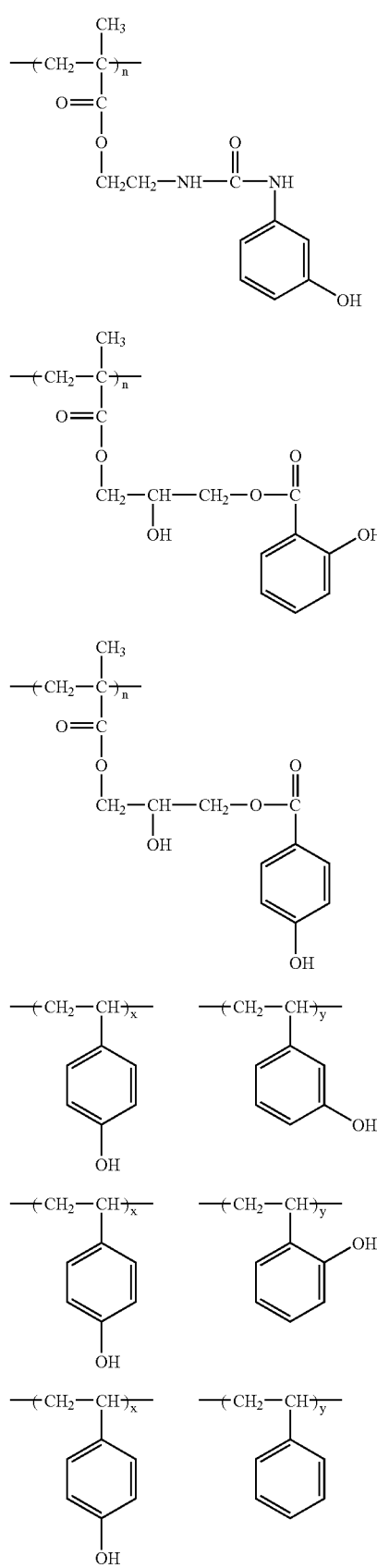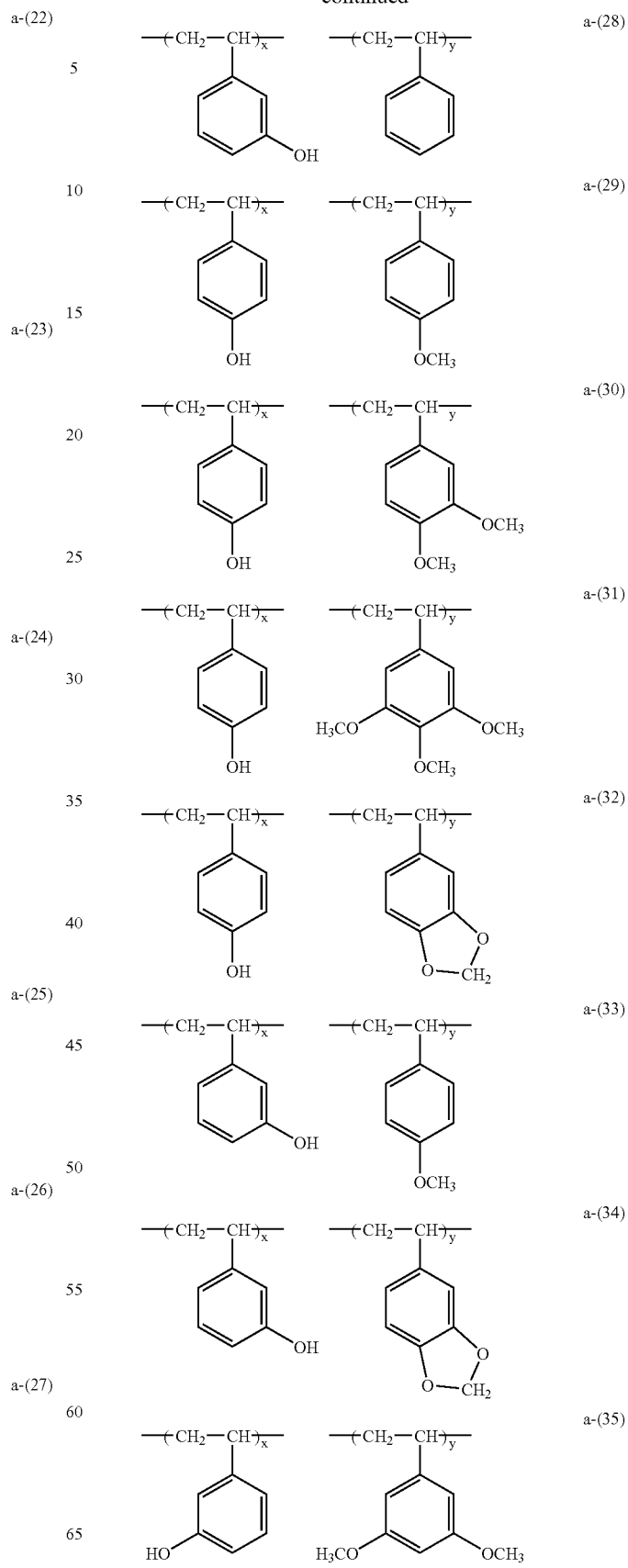

-continued a-(36)
a-(37)
a-(38)
a-(39)
a-(40)
a-(41)
a-(42)
a-(43)
a-(44)
a-(45)
a-(46)
a-(47)
a-(48)
a-(49)

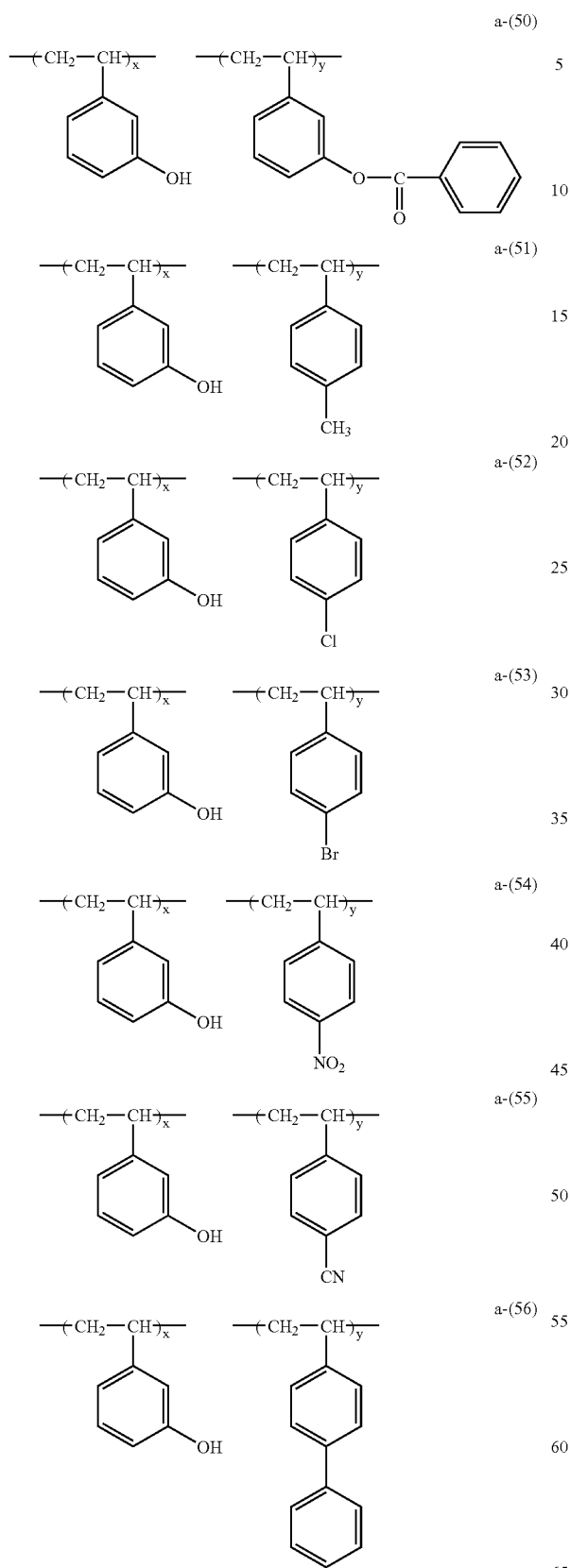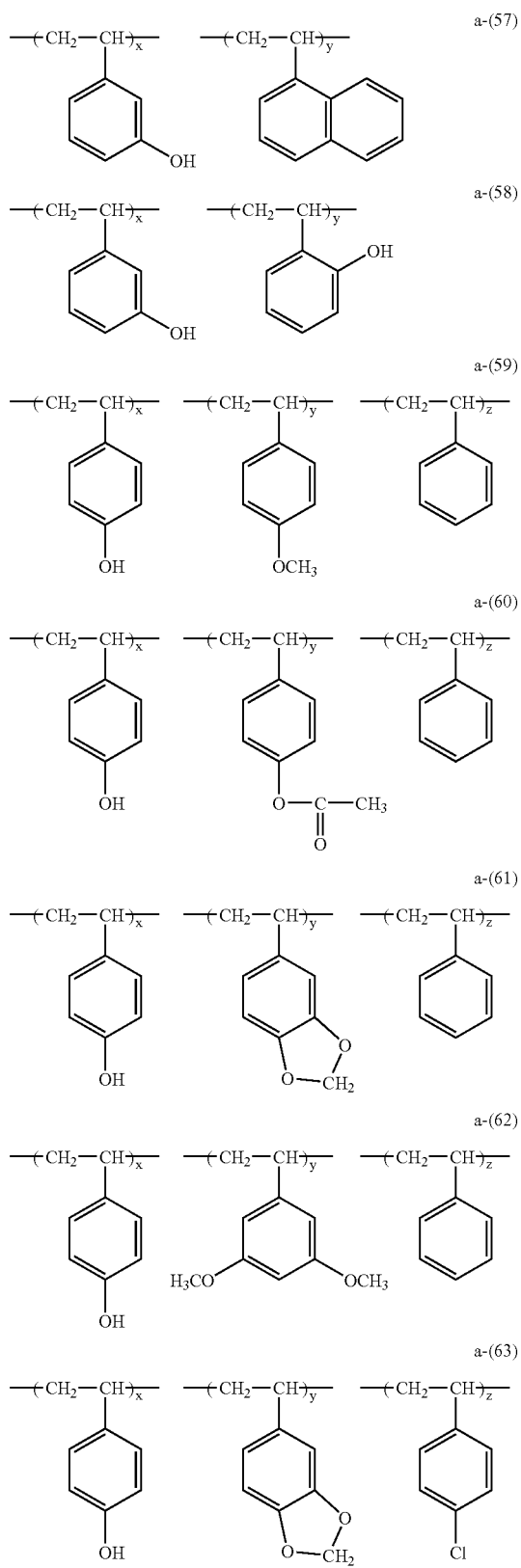

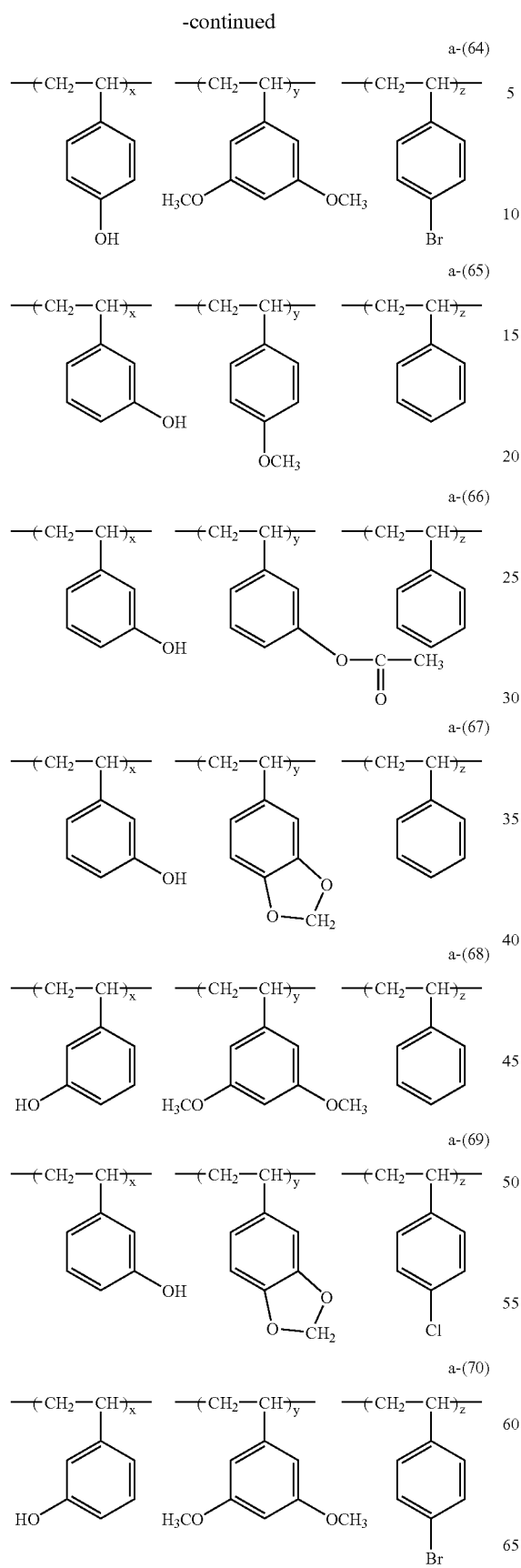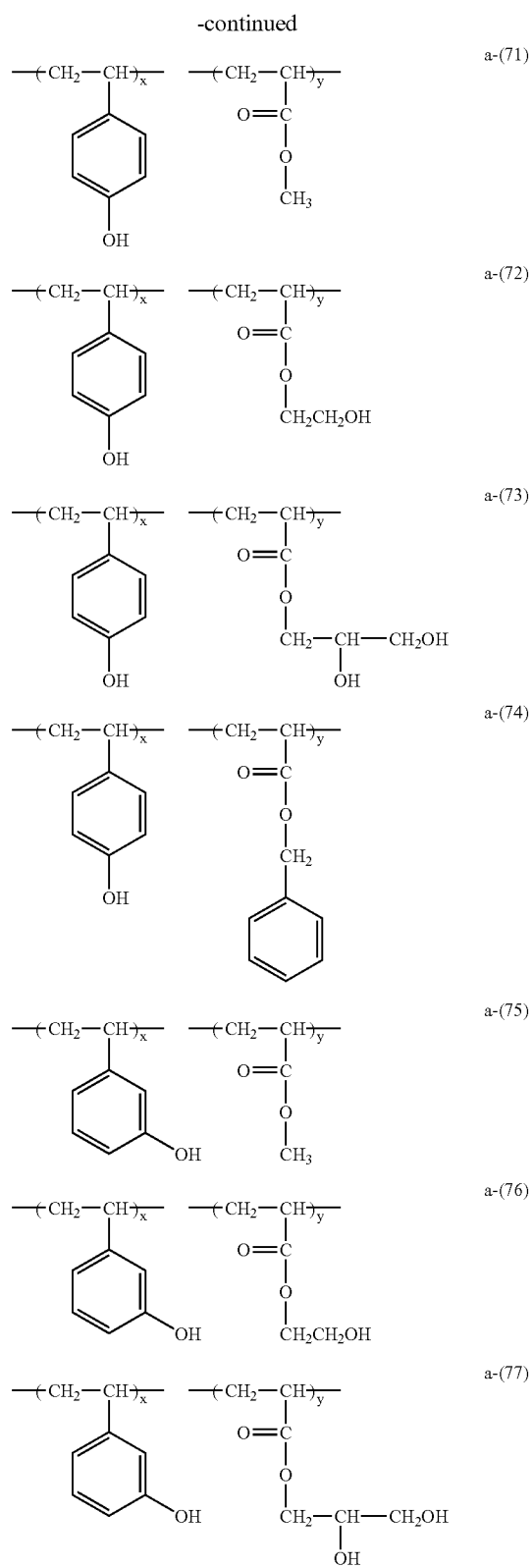

a-(78)
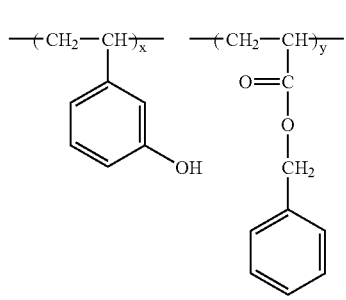
a-(84)
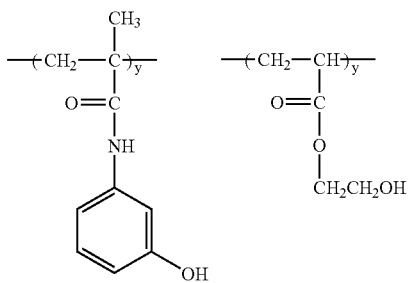
a-(79)
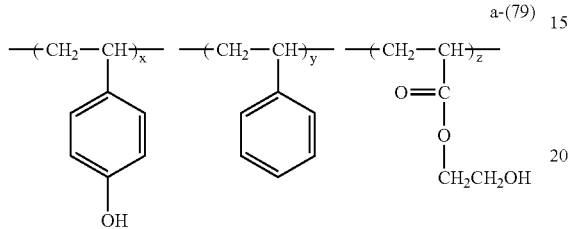
a-(85)
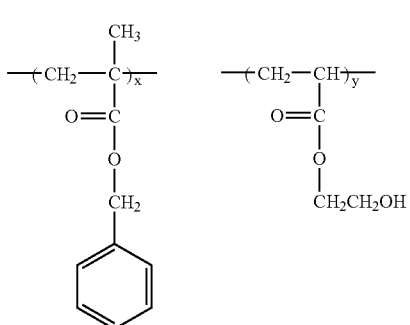
a-(80)
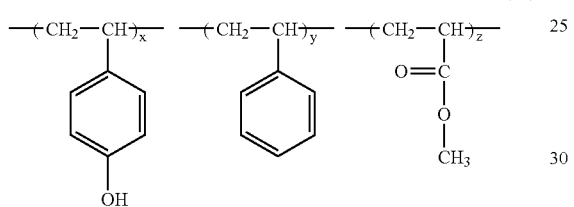
a-(81)
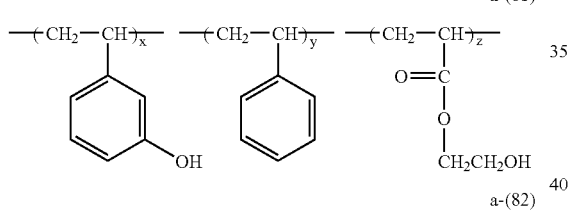
a-(86)
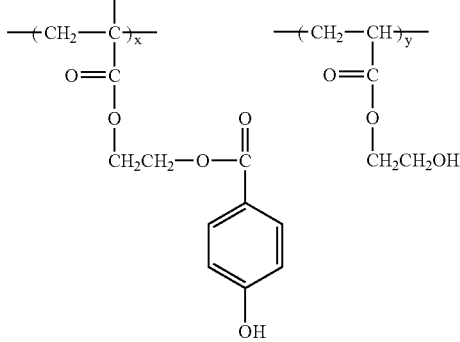
a-(82)
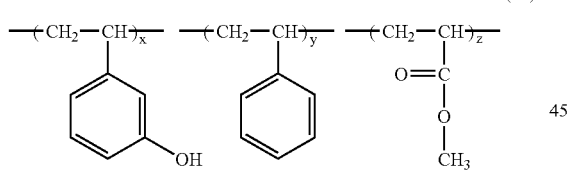
a-(87)
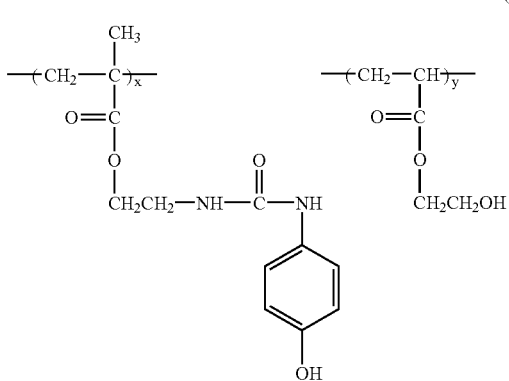
a-(83)
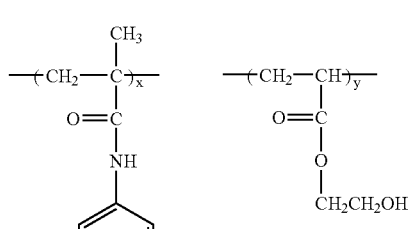

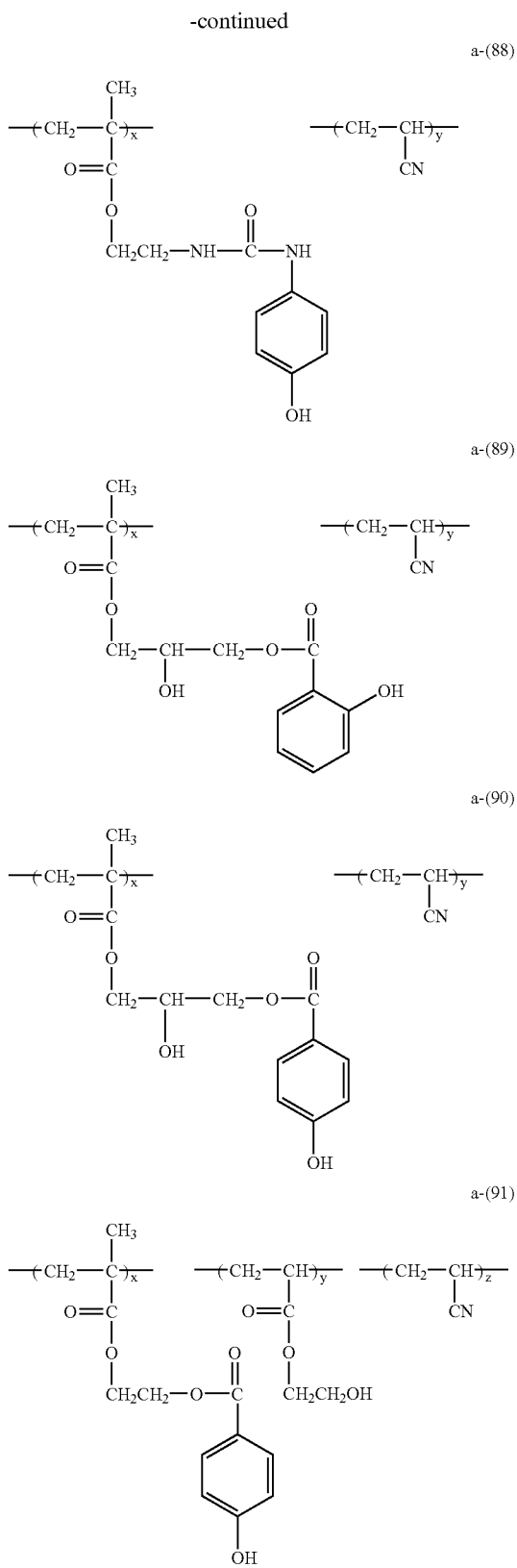

In the specific examples described above, n represents a positive integer. x, y and z each represent a molar ratio of each repeating unit. In the resin composed of two components, x and y are used in the range of x=10 to 95 and y=5 to 90, and preferably x=40 to 90 and y=10 to 60. In the resin composed of three components, x, y and z are used in the range of x=10 to 90, y=5 to 85 and z=5 to 85, and preferably x=40 to 80, y=10 to 50 and z=10 to 50.

The molecular weight of the resin of (BN), preferably the resin having the repeating structural unit represented by formula (a), is preferably from 1,000 to 200,000, and more preferably from 3,000 to 50,000 in terms of a weight average molecular weight. The molecular weight distribution of the resin is in the range of from 1 to 10, preferably from 1 to 3, and more preferably from 1 to 1.5. As the molecular weight distribution is smaller, the resolution is higher, the resist profile is better, the sidewalls of the resist patterns are smoother, and the resist patterns are more excellent in the edge roughness.

The content of the repeating unit represented by formula (a) is from 5 to 100% by mole, and preferably from 10 to 90% by mole, based on the alkali-soluble resin.

The alkali-soluble resin containing the structural unit represented by formula (a) for use in the present invention can be synthesized by methods described in *Macromolecules*, 28(11), 3787-3789 (1995), *Polym. Bull. (Berlin)*, 24(4), 385-389 (1990) and JP-A-8-286375. Specifically, the desired alkali-soluble resin can be obtained by a radical polymerization method or a living anion polymerization method.

The resins may be used individually or as a mixture of two or more thereof.

The weight average molecular weight is expressed using a value determined by gel permeation chromatography and calculated in terms of polystyrene.

An alkali-dissolution rate of the alkali-soluble resin is preferably not less than 20 angstrom/second, and more preferably not less than 200 angstrom/second, when measured in a 0.261N aqueous solution of tetramethylammonium hydroxide (TMAH) at 23° C.

In the present invention, the alkali-soluble resin having a repeating unit represented by formula (a) may be used individually or together with other alkali-soluble resins. With respect to a ratio of the resins, the amount of other alkali-soluble resins used is at most 100 parts by weight based on 100 parts by weight of the alkali-soluble resin having a repeating unit represented by formula (a). Examples of other alkali-soluble resins used in combination include novolac resins, hydrogenated novolac resins, acetone-pyrogallol resins, styrene-maleic anhydride copolymers, carboxy group-containing methacrylic resins and derivatives thereof, but the present invention should not be construed as being limited thereto.

The amount of the resin (BN) used is in the range of from 30 to 95% by weight, preferably from 40 to 90% by weight, and more preferably from 50 to 80% by weight, based on the total solid content of the resist composition.

<<Crosslinking Agent Crosslinking by the Action of an Acid (Hereinafter, also Referred to as "Component (C)" or "Crosslinking Agent of (C)")>>

The crosslinking agent crosslinking by the action of an acid for use in the negative resist composition of the present invention (hereinafter, also referred to as "acid crosslinking agent" or simply as "crosslinking agent") is a compound capable of crosslinking the alkali-soluble resin in the presence of an acid, for example, an acid generated upon irradiation of radiation. The crosslinking agent of (C) includes, for example, a compound containing at least one substituent (hereinafter, referred to as "crosslinkable substituent") having a crosslinking reactivity with the alkali-soluble resin.

Specific examples of the crosslinkable substituent include:
(i) a hydroxyalkyl group or a derivative thereof, e.g., a hydroxyalkyl group, an alkoxyalkyl group or an acetoxyalkyl group;
(ii) a carbonyl group or a derivative thereof, e.g., a formyl group or a carboxyalkyl group;
(iii) a substituent having a nitrogen-containing group, e.g., a dimethylaminomethyl group, a diethylaminomethyl group, a dimethylolaminomethyl group, a diethylolaminomethyl group or a morpholinomethyl group;
(iv) a substituent having a glycidyl group, e.g., a glycidyl ether group, a glycidyl ester group or a glycidyl amino group;
(v) an aromatic derivative, for example, an aralkyloxyalkyl group or an arylcarbonyloxyalkyl group, e.g., a benzyloxymethyl group or a benzoyloxymethyl group; and
(vi) a substituent having a polymerizable multi-bond, e.g., a vinyl group or an isopropenyl group.

As the crosslinkable substituent in the crosslinking agent of (C) according to the present invention, for example, a hydroxyalkyl group and an alkoxyalkyl group are preferred, and an alkoxymethyl group is more preferred.

The crosslinking agent containing the crosslinkable substituent includes, for example,
(i) a methylol group-containing compound, e.g., a methylol group-containing melamine compound, a methylol group-containing benzoguanamine compound, a methylol group-containing urea compound, a methylol group-containing glycoluril compound or a methylol group-containing phenol compound;
(ii) an alkoxyalkyl group-containing compound, e.g., an alkoxyalkyl group-containing melamine compound, an alkoxyalkyl group-containing benzoguanamine compound, an alkoxyalkyl group-containing urea compound, an alkoxyalkyl group-containing glycoluril compound or an alkoxyalkyl group-containing phenol compound;
(iii) a carboxymethyl group-containing compound, e.g., a carboxymethyl group-containing melamine compound, a carboxymethyl group-containing benzoguanamine compound, a carboxymethyl group-containing urea compound, a carboxymethyl group-containing glycoluril compound or a carboxymethyl group-containing phenol compound; and
(iv) an epoxy compound, e.g., a Bisphenol A based epoxy compound, a Bisphenol F based epoxy compound, a Bisphenol S based epoxy compound, a novolac resin based epoxy compound, a resol resin based epoxy compound or a poly(hydroxystyrene) based epoxy compound.

A resin wherein the crosslinkable substituent described above is introduced into an acidic functional group of the alkali-soluble resin so as to have a property of crosslinking agent can also be used as the crosslinking agent. In such a case, the introduction ratio of crosslinkable substituent is controlled ordinarily in a range of from 5 to 60% by mole, more preferably from 10 to 50% by more, and still more preferably from 15 to 40% by mole, based on the total acidic functional group in the alkali-soluble resin. When the introduction ratio of crosslinkable substituent is less than 5% by weight, it is difficult to cause the sufficient crosslinking reaction, and as a result, problems, for example, film thickness loss and swelling phenomenon and meandering of pattern are apt to occur. On the other hand, the ratio exceeding 60% by weight results in decrease in alkali solubility of the alkali-soluble resin, thereby tending to degradation of developing property.

As the crosslinking agent of (C) for use in the negative resist composition of the present invention, an alkoxymethylated urea compound or a polymer thereof and an alkoxymethylated glycoluril compound or a polymer thereof are preferred.

Particularly preferred examples of the crosslinking agent (C1) include a compound represented by any one of formulae (2) to (4) described hereinbefore and an alkoxymethylated melamine compound.

$R_{5b}$ in formulae (2) to (4) each independently represents a hydrogen atom, an alkyl group (preferably having from 1 to 5 carbon atoms, more preferably having from 1 to 3 carbon atoms, for example, methyl, ethyl or propyl group) or an acyl group (preferably having from 2 to 6 carbon atoms, more preferably having from 2 to 4 carbon atoms, for example, acetyl or propionyl group).

$R_{6b}$ to $R_{9b}$ in formula (2) each independently represent a hydrogen atom, a hydroxy group, an alkyl group (preferably having from 1 to 5 carbon atoms, more preferably having from 1 to 3 carbon atoms, for example, methyl, ethyl or propyl group) or an alkoxy group (preferably having from 1 to 5 carbon atoms, more preferably having from 1 to 3 carbon atoms, for example, methoxy, ethoxy or propoxy group).

X in formula (2) represents a single bond, a methylene group or an oxygen atom. X is preferably a single bond or a methylene group.

The above groups may further have a substituent, for example, an alkyl group, e.g., methyl or ethyl group, an alkoxy group, e.g., methoxy or ethoxy group, a hydroxy group or a halogen atom.

Specific examples of the compounds represented by formulae (2) to (4) and alkoxymethylated melamine compounds are set forth below, but the present invention should not be construed as being limited thereto.

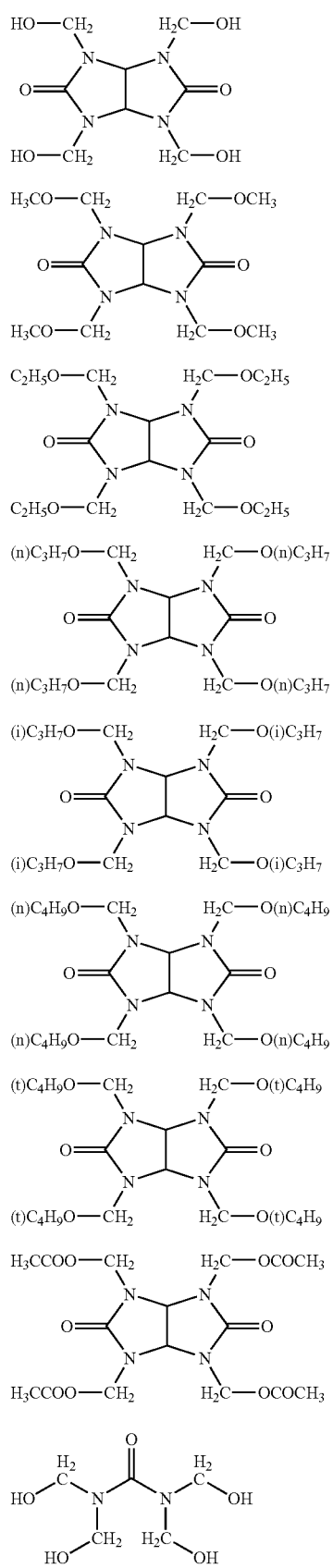
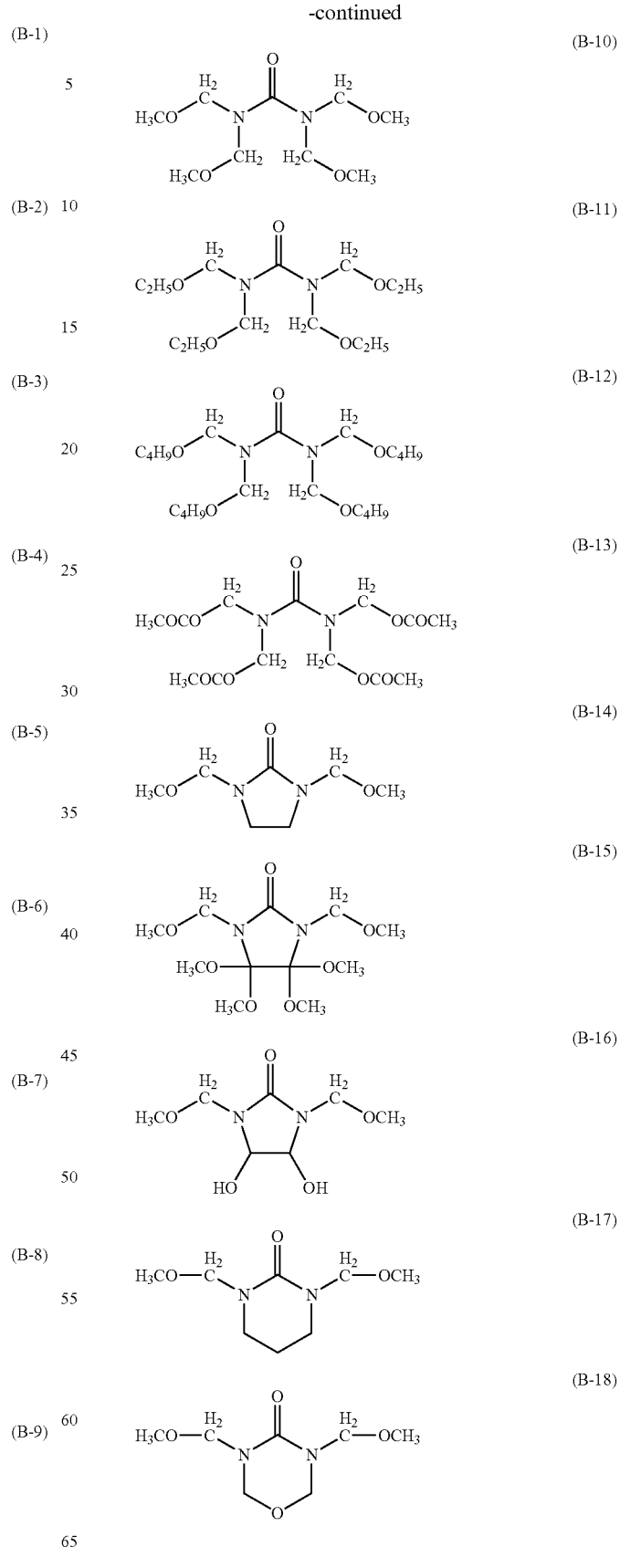

-continued

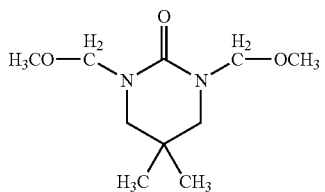

(B-19)

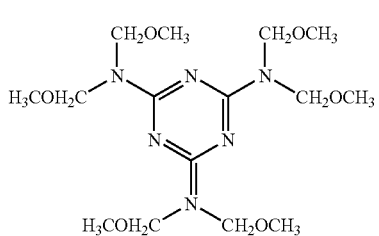

(B-20)

The crosslinking agent can be obtained by conducting a condensation reaction of a urea compound or glycoluril compound with formalin to introduce a methylol group, etherifying the methylol group with a lower alcohol, e.g., methyl alcohol, ethyl alcohol, propyl alcohol or butyl alcohol, and cooling the reaction solution, followed by recovering the deposited compound or resin. The crosslinking agent is also available as a commercial product, for example, Cymel (manufactured by Mitsui Cyanamid Co., Ltd.) or Nikarad (manufactured by Sanwa Chemical Co., Ltd.).

Particularly preferred examples of the crosslinking agent (C2) include a compound selected from phenol derivatives having from 1 to 6 benzene rings and two or more hydroxymethyl groups and/or alkoxymethyl groups connected to any of the benzene rings per molecule.

A phenol derivative having a molecular weight of not more than 1,500, containing from 1 to 6 benzene rings, and having at least two groups selected from hydroxymethyl group and an alkoxymethyl group, connected concentrically to one of the benzene rings or connected dispersedly to the benzene rings in the molecule thereof is preferably used.

The alkoxymethyl group connected to the benzene ring preferably includes an alkoxymethyl group having not more than 6 carbon atoms. Specific examples thereof include methoxymethyl, ethoxymethyl, n-propoxymethyl, isopropoxymethyl, n-butoxymethyl, isobutoxymethyl, sec-butoxymethyl and tert-butoxymethyl groups. An alkoxy-substituted alkoxy group, e.g., 2-methoxyethoxy or 2-methoxy-1-propoxy group is also preferred.

Among the phenol derivatives, those particularly preferred are set forth below.

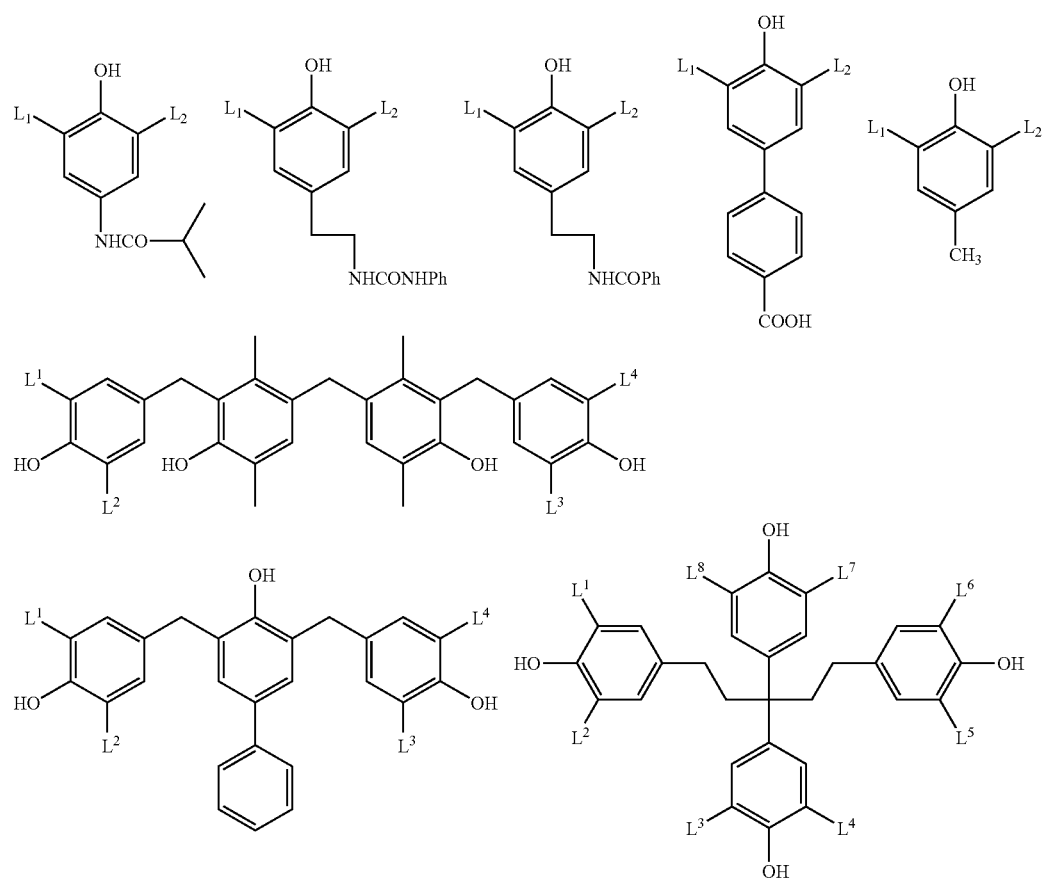

-continued
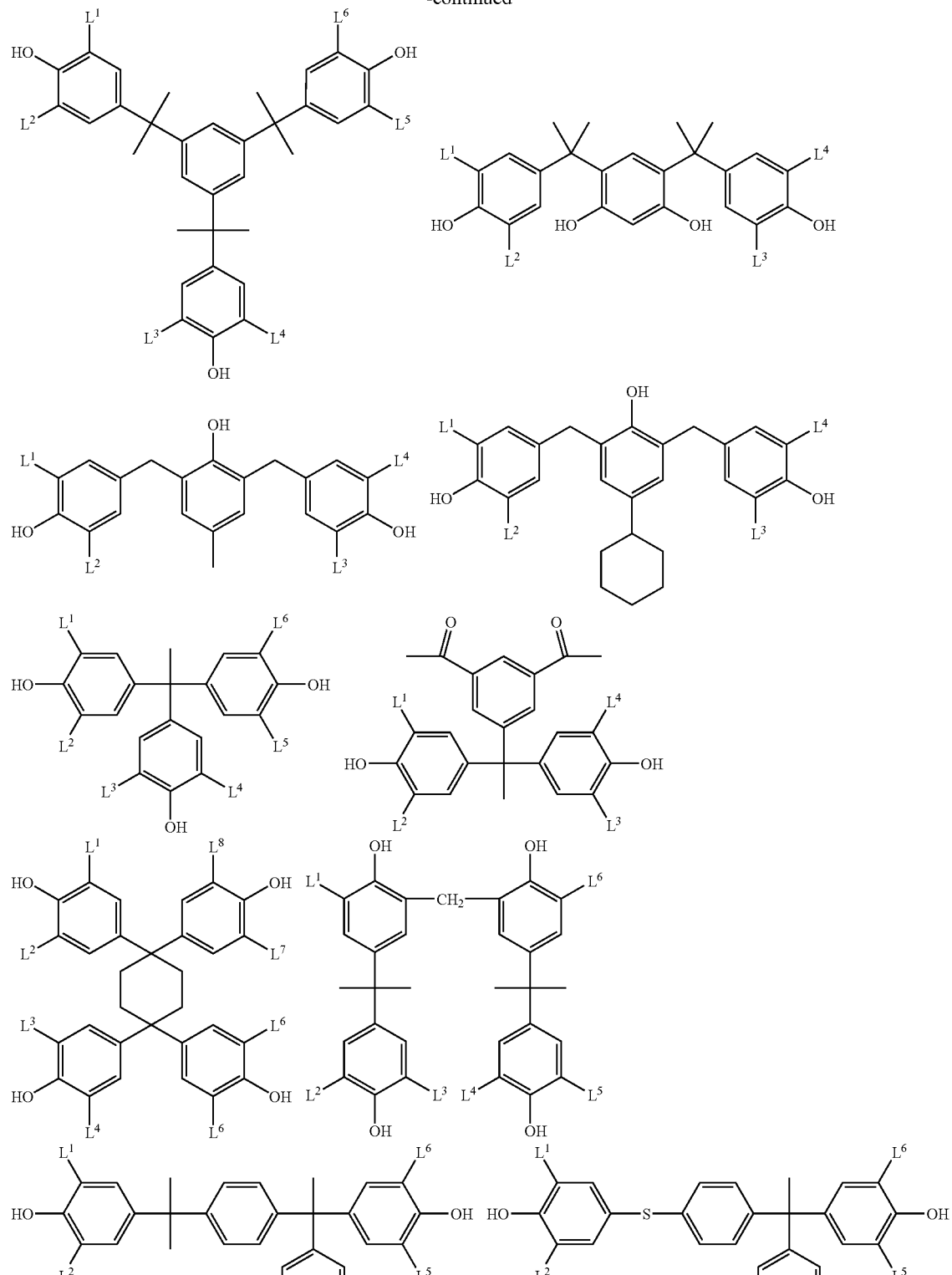

wherein, $L^1$ to $L^8$, which may be the same or different, each represent a hydroxymethyl group, a methoxymethyl group or an ethoxymethyl group.

The phenol derivative having a hydroxymethyl group can be obtained by reacting a corresponding phenol compound free from a hydroxymethyl group (the compound represented by the above-described formula wherein all of $L^1$ to $L^8$ represent hydrogen atoms) with formaldehyde in the presence of a base catalyst. At that time, it is preferred to carry out the reaction at a temperature of not higher than 60° C. in order to prevent the occurrence of resinification or gelation. Specifically, the phenol derivative can be synthesized according to methods described, e.g., in JP-A-6-282067 and JP-A-7-64285.

The phenol derivative having an alkoxymethyl group can be obtained by reacting a corresponding phenol derivative having a hydroxymethyl group with an alcohol in the presence of an acid catalyst. At that time, it is preferred to carry out the reaction at a temperature of not higher than 100° C. in order to prevent the occurrence of resinification or gelation. Specifically, the phenol derivative can be synthesized according to methods described, e.g., in European Patent 632,003.

The phenol derivatives having a hydroxymethyl group or an alkoxymethyl group are preferable in view of the storage stability, and the phenol derivatives having an alkoxymethyl group are particularly preferable from the standpoint of storage stability. The phenol derivatives having at least two groups of a hydroxymethyl group and alkoxymethyl group in total, wherein these groups are connected concentrically to one of the benzene rings or dispersedly to the benzene rings, may be used individually or as a combination of two or more thereof.

The crosslinking agent is ordinarily used in an amount of from 3 to 70% by weight, and preferably from 5 to 50% by weight, base on the total solid content of the negative resist composition. When the amount of the crosslinking agent added is less than 3% by weight, the film remaining ratio decreases, and on the other hand, when the amount exceeds 70% by weight, the resolution decreases and a further disadvantage in stability of the resist solution during storage may occur.

The compounds having an N-hydroxymethyl group, an N-alkoxymethyl group or an N-acyloxymethyl group and the phenol derivatives having a hydroxymethyl group or an alkoxymethyl group may be used as a combination of two or more thereof.

<<Other Components for Use in the Resist Composition of the Present Invention>>

The resist composition of the present invention may further contain other components, for example, an organic basic compound, a dye and a surface active agent, if desired.

<Organic Basic Compound>

A preferred organic basic compound which can be used in the present invention is a compound having a basicity stronger than that of phenol. Among the compounds, a nitrogen-containing basic compound is preferably used.

Preferred chemical environments for the nitrogen-containing basic compound include a structure represented by the following formula (A), (B), (C), (D) or (E):

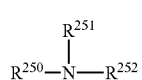 (A)

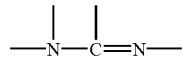 (B)

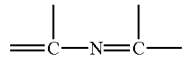 (C)

 (D)

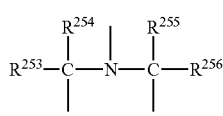 (E)

wherein $R^{250}$, $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be combined with each other to form a ring.

$R^{253}$, $R^{254}$, $R^{255}$ and $R^{256}$, which may be the same or different, each represent an alkyl group having from 1 to 6 carbon atoms.

A more preferable compound is a nitrogen-containing basic compound having at least two nitrogen atoms of different chemical environments per molecule. A compound containing both a substituted or unsubstituted amino group and a ring structure containing a nitrogen atom, and a compound containing an alkylamino group are particularly preferred.

Preferred specific examples of the nitrogen-containing basic compound include a substituted or unsubstituted guanidine, a substituted or unsubstituted aminopyridine, a substituted or unsubstituted aminoalkylpyridine, a substituted or unsubstituted aminopyrrolidine, a substituted or unsubstituted indazole, a substituted or unsubstituted imidazole, a substituted or unsubstituted pyrazole, a substituted or unsubstituted pyrazine, a substituted or unsubstituted pyrimidine, a substituted or unsubstituted purine, a substituted or unsubstituted imidazoline, a substituted or unsubstituted pyrazoline, a substituted or unsubstituted piperazine, a substituted or unsubstituted aminomorpholine and a substituted or unsubstituted aminoalkylmorpholine. Preferred examples of the substituent include an amino group, an aminoalkyl group, an alkylamino group, an aminoaryl group, an arylamino group, an alkyl group, an alkoxy group, an acyl group, an acyloxy group, an aryl group, an aryloxy group, a nitro group, a hydroxy group and a cyano group.

Particularly preferable compounds include guanidine, 1,1-dimethylguanidine, 1,1,3,3-tetramethylguanidine, imidazole, 2-methylimidazole, 4-methylimidazole, N-methylimidazole, 2-phenylimidazole, 4,5-diphenylimidazole, 2,4,5-triphenylimidazole, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5- methylpyrazine, pyrimidine, 2, 4-diaminopyrimidine, 4,6-dihydroxypyrimidine, 2-pyrazoline, 3-pyrazoline, N-aminomorpholine and N-(2-aminoethyl)morpholine. However, the present invention should not be construed as being limit to these compounds.

The organic basic compounds may be used individually or as a combination of two or more thereof.

With respect to a ratio of the acid generator and the organic basic compound used in the positive resist composition, a molar ratio of (acid generator)/(organic basic compound) is preferably from 2.5 to 300. When the molar ratio is less than 2.5, the sensitivity is low and the resolution decreases in some cases. On the other hand, when the molar ratio exceeds 300, the resist pattern sizes are changed with the lapse of time from exposure to heat treatment, and the resolution also decreases in some cases. The molar ratio of (acid generator)/(organic basic compound) is preferably from 5.0 to 200, and more preferably from 7.0 to 150.

The amount of organic basic compound used in the negative resist composition is ordinarily from 0.001 to 10% by weight, and preferably from 0.01 to 5% by weight, based on the total solid content of the resist composition. When the amount of organic basic compound is less than 0.001% by weight, the effect of adding the basic organic compound may not be obtained. On the other hand, when the amount exceeds 10% by weight, decrease of the sensitivity and deterioration of the developing property in the unexposed area may tend to occur.

<Dye>

Suitable dyes include oil dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (these dyes are manufactured by Orient Chemical Industries, Ltd.), Crystal Violet (CI 42555), Methyl Violet (CI 42535), Rhodamine B (CI 45170B), Malachite Green (CI 42000) and Methylene Blue (CI 52015).

<Solvent>

The resist composition of the present invention is dissolved in a solvent capable of dissolving the components described above and applied to a support. Preferred examples of the solvent used include ethylene dichloride, cyclohexanone, cyclopentanone, 2-heptanone, γ-butyrolactone, methyl ethyl ketone, ethylene glycol monomethyl ether, ethylene glycol monoethyl ether, 2-methoxyethyl acetate, ethylene glycol monoethyl ether acetate, propylene glycol monomethyl ether, propylene glycol monomethyl ether acetate, toluene, ethyl acetate, methyl lactate, ethyl lactate, methyl methoxypropionate, ethyl ethoxypropionate, methyl pyruvate, ethyl pyruvate, propyl pyruvate, N,N-dimethylformamide, dimethyl sulfoxide, N-methylpyrrolidone and tetrahydrofuran. The solvents are used individually or as a mixture of two or more thereof.

A particularly preferred solvent includes propylene glycol monomethyl ether acetate and a mixed solvent of propylene glycol monomethyl ether acetate/propylene glycol monomethyl ether.

<Surface Active Agent>

Into the resist composition of the present invention, a fluorine-based and/or silicon-based surface active agent can be preferably incorporated.

It is preferred that the resist composition of the present invention contains one or more of a fluorine-based surface active agent, a silicon-based surface active agent and a surface active agent containing both a fluorine atom and a silicon atom.

The incorporation of surface active agent together with the components described above into the resist composition of the present invention is particularly effective for the formation of finer line width pattern and further improves the development defect.

Examples of the surface active agent include those described in JP-A-62-36663, JP-A-61-226746, JP-A-61-226745, JP-A-62-170950, JP-A-63-34540, JP-A-7-230165, JP-A-8-62834, JP-A-9-54432 and JP-A-9-5988. Commercially available surface active agents described below may also be used as they are.

Examples of the commercially available surface active agent used include fluorine-based or silicon-based surface active agents, e.g., Eftop EF301 and EF303 (manufactured by Shin-Akita Kasei Co., Ltd.), Florad FC430 and FC431 (manufactured by Sumitomo 3M Ltd.), Megafac F171, F173, F176, F189 and $R_{08}$ (manufactured by Dainippon Ink & Chemicals, Inc.), Surflon S-382, SC101, 102, 103, 104, 105 and 106 (manufactured by Asahi Glass Co., Ltd.) and Troysol S-366 (manufactured by Troy Chemical Corp.). A polysiloxane polymer KP-341 (manufactured by Shin-Etsu Chemical Co., Ltd.) is also used as a silicon-based surface active agent.

The amount of surface active agent used is ordinarily from 0.001 to 2% by weight, and preferably from 0.01 to 1% by weight, based on the total solid content of the resist composition.

The surface active agents may be used individually or as a combination of two or more thereof.

Specific examples of the surface active agent other than those described above include a nonionic surface active agent, for example, a polyoxyethylene alkyl ether, e.g., polyoxyethylene lauryl ether, polyoxyethylene stearyl ether, polyoxyethylene cetyl ether or polyoxyethylene oleyl ether, a polyoxyethylene alkyl aryl ether, e.g., polyoxyethylene octyl phenol ether or polyoxyethylene nonyl phenol ether, a polyoxyethylene/polyoxypropylene block copolymer, a sorbitan fatty acid ester, e.g., sorbitan monolaurate, sorbitan monopalmitate, sorbitan monostearate, sorbitan monooleate, sorbitan trioleate or sorbitan tristearate, and a polyoxyethylene sorbitan fatty acid ester, e.g., polyoxyethylene sorbitan monolaurate, polyoxyethylene sorbitan monopalmitate, polyoxyethylene sorbitan monostearate, polyoxyethylene sorbitan trioleate or polyoxyethylene sorbitan tristearate.

The amount of such other surface active agent is ordinarily from not more than 2 parts by weight, and preferably not more than 1 part by weight, based on 100 parts by weight of the total solid content of the resist composition according to the present invention.

The pattern formation process on a resist film in the production of precise integrated circuit device comprises applying the resist composition of the present invention to a substrate (for example, a silicon/silicon dioxide film or a transparent substrate, e.g., a glass substrate or an ITO substrate) according to an appropriate method, for example, using a spinner or coater and exposing the coated layer through a predefined mask, followed by heating, developing, rinsing and drying, whereby a good resist pattern is formed.

The exposure light used includes an electron beam, EUV (extreme ultraviolet) and an X-ray.

In the present invention, a known inorganic or organic anti-reflective coating may be used, if desired. Further, the anti-reflective coating may be coated on the resist layer.

Suitable examples of the anti-reflective coating used for an under layer of the resist layer include an inorganic coating type, for example, titanium, titanium dioxide, titanium nitride, chromium oxide, carbon or amorphous silicon, and an organic coating type comprising a light absorbent and a polymer material. The former requires an apparatus, for example, a vacuum deposition apparatus, a CVD apparatus or a sputtering apparatus, for the formation of anti-reflective coating. The organic anti-reflective coating includes, for example, a coating comprising a condensate of a diphenylamine derivative with a formaldehyde-modified melamine resin, an alkali-soluble resin and a light absorbent as described in JP-B-7-69611, a coating comprising a reaction product of a maleic anhydride copolymer with a diamine light absorbent as described in U.S. Pat. No. 5,294,680, a coating comprising a resin binder and a methylolmelamine thermal crosslinking agent as described in JP-A-6-118631, a coating comprising an acrylic resin containing a carboxylic acid group, an epoxy group and a light absorbing group in the same molecule as described in JP-A-6-118656, a coating comprising methylolmelamine and a benzophenone light absorbent as described in JP-A-8-87115, and a coating comprising a low molecular weight light absorbent added to a polyvinyl alcohol resin as described in JP-A-8-179509.

Also, a commercially available organic anti-reflective coating, for example, DUV-30 Series and DUV-40 Series (manufactured by Brewer Science, Inc.) and AR-2, AR-3 and AR-5 (manufactured by Shipley Co., Ltd.) are employed as the organic anti-reflective coating.

A developing solution for the resist composition of the present invention is ordinarily an aqueous solution of an alkali, for example, an inorganic alkali, e.g., sodium hydroxide, potassium hydroxide, sodium carbonate, sodium silicate, sodium metasilicate or aqueous ammonia; a primary amine, e.g., ethylamine or n-propylamine; a secondary amine, e.g., diethylamine or di-n-butylamine; a tertiary amine, e.g., triethylamine or methyldiethylamine; an alcoholamine, e.g., dimethylethanolamine or triethanolamine; a quaternary ammonium salt, e.g., tetramethylammonium hydroxide, tetraethylammonium hydroxide or choline; and a cyclic amine, e.g., pyrrole or piperidine. Further, the aqueous solution of alkali containing an appropriate amount of an alcohol, e.g., isopropyl alcohol or a surface active agent, e.g., a nonionic surface active agent may be used.

Of the developing solutions, a developing solution containing a quaternary ammonium salt is preferred, and a developing solution containing tetramethylammonium hydroxide or choline is more preferred.

The present invention will be described in more detail with reference to the following examples, but the present invention should not be construed as being limited thereto.

EXPERIMENTAL EXAMPLE

Measurement of Reduction Potential

The reduction potential of acid generator was measured by a cyclic voltammetry method. Specifically, each of the acid generators shown in Table 1 below was dissolved in distilled acetonitrile under argon atmosphere to prepare a 1 mM solution of the acid generator for the measurement. A 0.1 mM solution of tetrabutylammonium perchlorate was used as a supporting electrolyte. With respect to electrodes, MP-2 (manufactured by Yanaco LID Co., Ltd.), C-2U (manufactured by Yanaco LID Co., Ltd.) and Ag/AgCl were used as a working electrode, a counter electrode and a reference electrode, respectively. The measurement was conducted at 23.5° C. The scanning speed was 50 mV/cm². Since the acid generator was decomposed by reduction and the reaction was irreversible, only a reduction peak was observed.

TABLE 1

| Chemical Structure | Reduction Potential (vs SCE) |
|---|---|
| Triphenylsulfonium $C_4F_9SO_3^\ominus$ | −1.14 V |
| Diphenyliodonium $C_4F_9SO_3^\ominus$ | −0.78 V |
| Dibenzothiophenium-CF₃ $C_4F_9SO_3^\ominus$ | −0.61 V |

A1-13

TABLE 1-continued

| Chemical Structure | Reduction Potential (vs SCE) |
| --- | --- |
| A1-16 | −0.74 V |
| A1-17 | −0.68 V |
| A1-18 | −0.77 V |
| A1-19 | −0.64 V |

(1) Synthesis of Compound of (A1)

In 200 ml of benzene was dissolved 10 g of dibenzothiophene, and the resulting solution was cooled at 5° C. and 40 ml of concentrated sulfuric acid was gradually added dropwise thereto with stirring. The temperature of solution was raised to room temperature, followed by stirring for 48 hours. The reaction mixture was poured onto ice, and the aqueous layer was extracted three times with each one liter of ether. The aqueous layer was cooled at 0° C. and an aqueous solution containing 16.95 g of trimethylammonium 3,5-ditrifluoromethylbenzenesulfonate in one liter of water was added dropwise thereto, followed by stirring at 0° C. for 2 hours. The reaction mixture was extracted three times with each one liter of chloroform. The organic layer was washed with water and concentrated to obtain 2.5 g of the oil of Compound A1-1.

Compounds A1-2 to A1-15 can be synthesized in a similar manner.

(2) Synthesis of Compound of (A2)

(2-1) Synthesis of tetramethylammonium pentafluorobenzenesulfonate

In 100 ml of methanol was dissolved 25 g of pentafluorobenzenesulfonyl chloride under cooling with ice, and 100 g of a 25% aqueous solution of tetramethylammonium hydroxide was gradually added thereto. The mixture was stirred for 3 hours at room temperature to obtain a solution of tetramethylammonium pentafluorobenzenesulfonate. The solution was used for salt exchange with a sulfonium salt or an iodonium salt.

(2-2) Synthesis of triphenylsulfonium pentafluorobenzenesulfonate

In 800 ml of benzene was dissolved 50 g of diphenyl sulfoxide, and after the addition of 200 g of aluminum chloride, the mixture was refluxed for 24 hours. The reaction solution was gradually poured into 2 liters of ice water, and after the addition of 400 ml of concentrated hydrochloric acid, the mixture was heated at 70° C. for 10 minutes. The aqueous solution was washed with 500 ml of ethyl acetate, and after filtration, a solution containing 200 g of ammonium iodide dissolved in 400 ml of water was added thereto. The powder thus precipitated was collected by filtration, washed with water and then with ethyl acetate, and dried to obtain 70 g of triphenylsulfonium iodide.

In 1,000 ml of methanol was dissolved 30.5 g of triphenylsulfonium iodide, and after the addition of 19.1 g of silver oxide to the solution, the mixture was stirred at room temperature for 4 hours. The reaction solution was filtered and to the filtrate was added an excessive amount of the solution of tetramethylammonium pentafluorobenzenesulfonate described above. The reaction solution was concentrated, the resulting residue was dissolved in 500 ml of dichloromethane, and the solution was washed with a 5% aqueous solution of tetramethylammonium hydroxide and then with water. The organic layer was dried over anhydrous sodium sulfate, and then concentrated to obtain triphenylsulfonium pentafluorobenzenesulfonate of Compound (I-1).

(2-3) Synthesis of di(4-tert-amylphenyl)iodonium pentafluorobenzenesulfonate

To a mixture of 60 g of tert-amylbenzene, 39.5 g of potassium iodate, 81 g of acetic anhydride and 170 ml of dichloromethane was gradually added dropwise 66.8 g of concentrated sulfuric acid under cooling with ice. After stirring under cooling with ice for 2 hours, the mixture was further stirred at room temperature for 10 hours. To the reaction solution was added 500 ml of water under cooling with ice, and the resulting mixture was extracted with dichloromethane. The organic layer was washed with an aqueous solution of sodium hydrogen carbonate and then with water, and concentrated to obtain di(4-tert-amylphenyl)iodonium sulfate. The resulting sulfate was added to an excessive amount of the solution of tetramethylammonium pentafluorobenzenesulfonate described above. To the solution was added 500 ml of water, and the solution was extracted with dichloromethane. The organic layer was washed with a 5% aqueous solution of tetramethylammonium hydroxide and then with water, and concentrated to obtain di(4-tert-amylphenyl)iodonium pentafluorobenzenesulfonate of Compound (III-1).

(3) Synthesis of Acid-Decomposable Resin of (BP)

(3-1) Synthesis of Resin (B-21)

In 120 ml of butyl acetate were dissolved 32.4 g (0.2 mol) of p-acetoxystyrene and 7.01 g (0.07 mol) of tert-butyl methacrylate. To the solution were added three times each 0.033 g of azobisisobutyronitrile (AIBN) at an interval of 2.5 hours at 80° C. with stirring in a nitrogen gas stream and then the mixture was further stirred for 5 hours, whereby the polymerization reaction was conducted. The resulting reaction solution was poured into 1,200 ml of hexane to precipitate a white resin. The resin obtained was dried and then dissolved in 200 ml of methanol.

To the solution was added an aqueous solution prepared by dissolving 7.7 g (0.19 mol) of sodium hydroxide in 50 ml of water, and the mixture was refluxed by heating for one hour to hydrolyze the resin. Then, the reaction mixture was diluted by adding 200 ml of water and neutralized with hydrochloric acid to deposit a white resin. The resin was collected by filtration, washed with water, dried and then dissolved in 200 ml of tetrahydrofuran to prepare a solution. The solution was added dropwise to 5 liters of ultrapure water with vigorous stirring to reprecipitate. The reprecipitation operation was repeated three times. The resin thus obtained was dried in a vacuum dryer at 120° C. for 12 hours to obtain copoly(p-hydroxystyrene/tert-butyl methacrylate).

(3-2) Synthesis of Resin (B-3)

In 50 ml of pyridine was dissolved 10 g of poly(p-hydroxystyrene) (VP-8000 manufactured by Nippon Soda Co., Ltd.). To the solution was dropwise added 3.63 g of di-tert-butyl dicarbonate with stirring at room temperature. After stirring for 3 hours at room temperature, the reaction mixture was dropwise added to a solution containing 20 g of concentrated hydrochloric acid in one liter of ion-exchanged water. The powder thus deposited was collected by filtration, washed with water and dried to obtain Resin (B-3).

(3-3) Synthesis of Resin (B-32)

In 300 ml of toluene was dissolved 83.1 g (0.5 mol) of p-cyclohexylphenol, and to the solution were added 150 g of 2-chloroethyl vinyl ether, 25 g of sodium hydroxide, 5 g of tetrabutylammonium bromide and 60 g of triethylamine, followed by reacting at 120° C. for 5 hours. The reaction solution was washed with water, and the excess 2-chloroethyl vinyl ether and toluene were distilled off. The oil thus obtained was purified by distillation under a reduced pressure to obtain 4-cyclohexylphenoxyethyl vinyl ether.

In 80 ml of tetrahydrofuran were dissolved 20 g of poly(p-hydroxystyrene) (VP-8000 manufactured by Nippon Soda Co., Ltd.) and 6.5 g of 4-cyclohexylphenoxyethyl vinyl ether. To the solution was added 0.01 g of p-toluenesulfonic acid, followed by reacting at room temperature for 18 hours. The reaction solution was added dropwise to 5 liters of distilled water with vigorous stirring, and the powder thus deposited was collected by filtration and dried to obtain Polymer (B-32).

Other resins of component (BP) were synthesized in a similar manner. With the polymers for use in the examples described below, the weight average molecular weight and the molar ratio of repeating unit are shown below.

| Resin | Weight Average Molecular Weight | Molar Ratio of Repeating unit*) |
|---|---|---|
| (B-3) | 8,500 | 25/75 |
| (B-4) | 8,500 | 25/75 |
| (B-21) | 12,000 | 65/35 |
| (B-26) | 11,500 | 15/60/25 |
| (B-28) | 15,000 | 78/22 |
| (B-30) | 8,000 | 80/20 |
| (B-31) | 15,000 | 65/10/25 |
| (B-32) | 12,000 | 82/18 |

*)The molar ratio of repeating unit is indicated using the repeating units of the resins described in the specific examples of the resin of Component (BP) hereinbefore and the numerals in each polymer mean the molar ratio of the repeating unit in order from left to right.

(4) Synthesis of Alkali-Soluble Resin of (BN)

(4-1) Synthesis of Resin a-(29)

In 30 ml of 1-methoxy-2-propanol were dissolved 3.9 g (0.024 mol) of 4-acetoxystyrene and 0.8 g (0.006 mol) of 4-methoxystyrene, and while stirring the solution under a nitrogen gas stream, 70 ml of a 1-methoxy-2-propanol solution containing 50 mg of a polymerization initiator, i.e., 2,2'-azobis(2,4-dimethylvaleronitrile) (V-65 manufactured by Wako Pure Chemical Industries, Ltd.), 9.1 g (0.056 mol) of 4-acetoxystyrene and 1.9 g (0.014 mol) of 4-methoxystyrene was added dropwise thereto at 70° C. over a period of 2 hours. After 2 hours, 50 mg of the initiator was additionally added thereto and the reaction was further continued for 2 hours. Thereafter, the temperature was raised to 90° C. and the reaction solution was stirred for one hour. The reaction solution was allowed to cool and poured into one liter of ion-exchanged water with vigorous stirring to deposit a white resin. The resulting resin was dried and then dissolved in 100 ml of methanol. To the solution was added a 25% aqueous solution of tetramethylammonium hydroxide to hydrolyze the acetoxy group in the resin. Then, the solution was neutralized with an aqueous solution of hydrochloric acid to deposit a white resin. The resin was washed with ion-exchanged water and dried under a reduced pressure to obtain 11.6 g of Resin a-(29) according to the present invention.

A weight average molecular weight (Mw) of the resin measured by GPC and calculated in terms of polystyrene was 9,200 and degree of dispersion (Mw/Mn) was 2.2. As a result of determining a component ratio of the resin, it was found that a molar ratio of x/y was 80/20.

(4-2) Synthesis of Resin a-(39)

In 100 ml of acetone was dissolved 12.0 g of poly(4-hydroxystyrene) (Mw: 10,500; Mw/Mn: 1.2), and to the solution were added 2.0 g of pyridine and then 1.3 g of acetic anhydride, followed by reacting at 50° C. with stirring for 3 hours. The reaction solution was poured into one liter of ion-exchanged water with vigorous stirring to deposit a white resin. The resulting resin was dried under a reduced pressure to obtain 12.2 g of Resin a-(39) according to the present invention.

A weight average molecular weight (Mw) of the resin measured by GPC and calculated in terms of polystyrene was 11,400 and degree of dispersion (Mw/Mn) was 1.2. As a result of determining a component ratio of the resin, it was found that a molar ratio of x/y (4-hydroxystyrene/4-acetoxystyrene) was 88/12.

(4-3) Synthesis of Resin a-(91)

In 30 ml of 1-methoxy-2-propanol were dissolved 3.8 g (0.015 mol) of 2-[(4'-hydoxyphenyl)carbonyloxy]ethyl methacrylate, 1.0 g (0.009 mol) of 2-hydroxyethyl acrylate and 0.3 g (0.006 mol) of acrylonitrile, and while stirring the solution under a nitrogen gas stream, 70 ml of a 1-methoxy-2-propanol solution containing 50 mg of a polymerization initiator, i.e., 2,2'-azobis(2,4-dimethylvaleronitrile) (V-65 manufactured by Wako Pure Chemical Industries, Ltd.), 8.8 g (0.035 mol) of 2-[(4'-hydoxyphenyl)carbonyloxy]ethyl methacrylate, 2.4 g (0.021 mol) of 2-hydroxyethyl acrylate and 0.7 g (0.014 mol) of acrylonitrile was added dropwise thereto at 70° C. over a period of 2 hours. After 2 hours, 50 mg of the initiator was additionally added thereto and the reaction was further continued for 2 hours. Thereafter, the temperature was raised to 90° C. and the reaction solution was stirred for one hour. The reaction solution was allowed to cool and poured into one liter of ion-exchanged water with vigorous stirring to deposit a white resin. The resulting resin was dried under a reduced pressure to obtain 15.8 g of Resin a-(91) according to the present invention.

A weight average molecular weight (Mw) of the resin measured by GPC and calculated in terms of polystyrene was 11,000 and degree of dispersion (Mw/Mn) was 1.5. As a result of determining a component ratio of the resin, it was found that a molar ratio of x/y/z was 60/30/10.

Other resins of component (BN) according to the present invention were synthesized in a similar manner.

(5) Synthesis of Crosslinking Agent (5-1) Synthesis of Crosslinking Agent [HM-0]

In a flask were put one mol of p-aminophenol, one mol of sodium acetate and one liter of acetone, and to the mixture was added dropwise one mol of isobutyric chloride under cooling with ice. After 5 hours, the reaction mixture was poured into ice water to deposit crystals. The crystals were collected by filtration to obtain HM-0-X in a yield of 80%.

In a flask were put 0.8 mol of HM-0-X, 0.8 mol of potassium hydroxide, 500 ml of water and 4.8 mol of a 37% aqueous formalin solution, and the mixture was heated at 50° C. for 5 hours and then neutralized with acetic acid. The mixture was concentrated under a reduced pressure, and the resulting oily product was dissolved in a mixture of ethyl acetate and methanol (1/1) and separated by $SiO_2$ column chromatography to obtain the desired Crosslinking Agent [HM-0] ($L_1$=$L_2$=$CH_2OH$) as colorless crystals in the total yield of 50%.

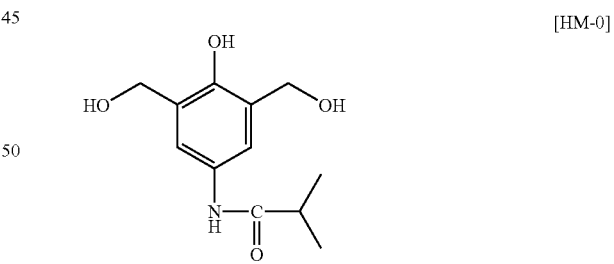

[HM-0]

(5-2) Synthesis of Crosslinking Agent [HM-1]

To a 10% aqueous solution of potassium hydroxide was added 20 g of 1-[α-methyl-α-(4-hydroxyphenyl)ethyl]-4-[α, α-bis(4-hydroxyphenyl)ethyl]benzene (Trisp-PA manufactured by Honshu Chemical Industry Co., Ltd.) with stirring to dissolve. While stirring the solution, 60 ml of a 37% aqueous formalin solution was gradually added thereto at room temperature over a period of 1 hour. After further stirring at room temperature for 6 hours, the solution was poured into a diluted aqueous sulfuric acid solution. The precipitates thus formed were collected by filtration, sufficiently washed with water, and recrystallized from 30 ml of methanol to obtain 20 g of white powder of phenol derivative (Crosslinking Agent [HM-1]) containing hydroxymethyl groups having the structure shown below. The purity thereof was 92% (determined by a liquid chromatography method).

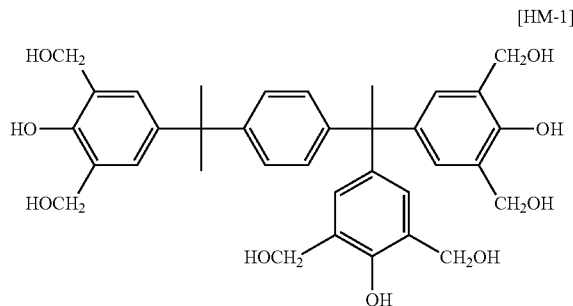

[HM-1]

(5-3) Synthesis of Crosslinking Agent [MM-1]

To one liter of methanol was added 20 g of the phenol derivative (Crosslinking Agent [HM-1]) having hydroxymethyl groups obtained above with heating and stirring to dissolve. To the solution was added 1 ml of concentrated sulfuric acid, and the mixture was refluxed by heating for 12 hours. After the completion of the reaction, the reaction solution was cooled and 2 g of potassium carbonate was added thereto. The mixture was sufficiently concentrated, and 300 ml of ethyl acetate was added thereto. The solution was washed with water and concentrated to dryness to obtained 22 g of phenol derivative (Crosslinking Agent [MM-1]) containing methoxymethyl groups having the structure shown below as a white solid. The purity thereof was 90% (determined by a liquid chromatography method).

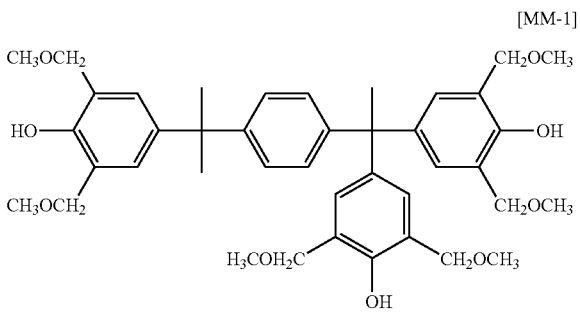

[MM-1]

Examples 101 to 118 and Comparative Examples 101 to 105

10—Application of resist composition

Each of the components shown in Table 2 below in an amount described below was dissolved in 26.0 g (in total) of the solvent(s) to prepare a solution of resist composition. In Table 2, when plural compounds are used in each component, a ratio thereof is indicated by weight.

| | |
|---|---|
| Acid-decomposable resin (BP) | 2.0 g |
| Acid generator | 0.20 g |
| Basic compound (if desired) | 0.0040 g |
| Surface active agent (if desired) | 0.0020 g |

The solution of resist composition was subjected to microfiltration using a membrane filter having a pore size of 0.1 μm to prepare a resist solution.

The resist solution was coated on a 6-inch silicon wafer using a spin coater (Mark 8 manufactured by Tokyo Electron Ltd.) and baked at 110° C. for 90 seconds to prepare a uniform film having a thickness of 0.30 μm.

TABLE 2

| | Resin (BP) | Acid Generator | Solvent | Basic Compound | Surface Active Agent |
|---|---|---|---|---|---|
| Example | | | | | |
| 101(119) | B-4 | A1-3/I-1 = 4/6 | S1/S3/S8 = 80/15/5 | (4) | W1 |
| 102(120) | B-32 | A1-4/I-9 = 2/3 | S1/S6 = 80/20 | (4) | W1 |
| 103(121) | B-26 | A1-15/I-18 = 2/1 | S1/S7 = 75/25 | (9) | W1 |
| 104(122) | B-21 | A1-13/II-1 = 1/1 | S1/S6/S10 = 65/20/15 | (1) | W5 |
| 105(123) | B-30 | A1-7/I-20 = 1/1 | S1/S9 = 90/10 | (2) | W1 |
| 106(124) | B-31 | A1-12/II-4f = 3/1 | S1/S11 = 80/20 | (6) | W2 |
| 107(125) | B-3 | A1-4/II-5C = 3/1 | S1/S3/S8 = 75/20/5 | (9) | W1 |
| 108(126) | B-26 | A1-13 | S1 | (3) | W1 |
| 109(127) | B-28 | BCFY | S1 | (7) | W3 |
| 110(128) | B-30 | A1-5 | S3 | (5) | W1 |
| 111(129) | B-31 | A1-6 | S1 | (9) | W5 |
| 112(130) | B-28 | A1-7 | S2 | (8) | W3 |
| 113(131) | B-30 | A1-8 | S7 | (9) | W4 |
| 114(132) | B-31 | A1-9 | S4 | (6) | W1 |
| 115(133) | B-26 | A1-12 | S8 | (10) | W1 |
| 116(134) | B-4 | A1-16/I-1 = 8/2 | S1 | (4) | W1 |
| 117(135) | B-4 | A1-17/I-1 = 8/2 | S1 | (4) | W1 |
| 118(136) | B-4 | A1-19/I-1 = 8/2 | S1 | (4) | W1 |
| Comparative Example | | | | | |
| 101(106) | B-4 | I-1 | S3 | (4) | W1 |
| 102(107) | B-32 | I-9 | S5 | (4) | W1 |
| 103(108) | B-26 | I-18 | S1 | (9) | W1 |
| 104(109) | B-21 | II-1 | S1 | (1) | W5 |
| 105(110) | B-31 | II-1 | S5 | (6) | W1 |

The abbreviations of components used in Table 2 are explained below.
Acid generator:
BCFY:

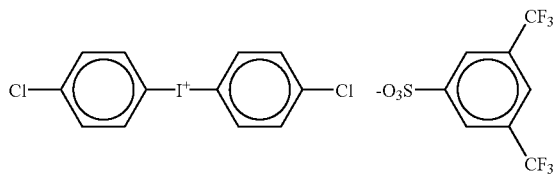

Basic Compounds:
(1): 1,8-Diazabicyclo[4.3.0]non-5-ene
(2): 2,6-Diisopropylaniline
(3): 4-Dimethylaminopyridine
(4): 2,4,5-Triphenylimidazole
(5): Piperazine
(6): 1,5-Diazabicyclo[4.3.0]non-5-ene
(7): 1,5-Diazabicyclo[2.2.2]octane TABLE 2-continued

| | Resin (BP) | Acid Generator | Solvent | Basic Compound | Surface Active Agent |
|---|---|---|---|---|---|

(8): Hexamethylenetetramine
(9): 1-Cyclohexyl-3-(2-morpholinomethyl)-2-thiourea (CHMETU)
(10): Phenylguanidine
Surface Active Agents:
W-1: Megafac F176 (manufactured by Dainippon Ink &Chemicals, Inc.) (fluorine-based)
W-2: Megafac R08 (manufactured by Dainippon Ink &Chemicals, Inc.) (fluorine- and silicon-based)
W-3: Polysiloxane polymer KP-341 (manufactured by Shin-Etsu Chemical Industry Co., Ltd.)
W-4: Polyoxyethylene phenyl ether
W-5: Troysol S-366 (manufactured by Troy Chemical Industries, Inc.)
Solvents:
S1: Propylene glycol monomethyl ether acetate
S2: Propylene glycol monomethyl ether propionate
S3: Ethyl lactate
S4: Butyl acetate
S5: 2-Heptanone
S6: Propylene glycol monomethyl ether
S7: Ethoxyethyl propionate
S8: γ-butyrolactone
S9: Ethylene carbonate
S10: Propylene carbonate
S11: Cyclohexanone
(2) Preparation and evaluation of resist pattern The resist film was subjected to electron beam irradiation using an electron beam imaging device (HL 750 manufactured by Hitachi, Ltd.; acceleration voltage: 50 KeV). After the irradiation, the resist film was baked at 110° C. for 90 seconds, immersed in a 2.38% by weight aqueous solution of tetramethylammonium hydroxide (TMAH) for 60 seconds to develop, rinsed with water for 30 seconds and dried. The pattern thus obtained was evaluated in the following manner:

(2-1) Sensitivity

The minimum irradiation energy necessary for resolving 0.15 μm-line (line:space=1:1) was designated as the sensitivity.

(2-2) Resolution

Limiting resolution (line and space being separately resolved) at the irradiation energy for obtaining the sensitivity described above was designated as the resolution.

(2-3) Pattern Profile

A cross-sectional shape of 0.14 μm-line pattern at the irradiation energy for obtaining the sensitivity described above was observed using a scanning electron microscope.

The results of evaluation obtained are shown in Table 3 below.

TABLE 3

(Evaluation with Electron Beam (50 KeV))

| | Resolution (μm) | Sensitivity (μC/cm$^2$) | Pattern Profile |
|---|---|---|---|
| Example | | | |
| 101 | 0.060 | 3.0 | Rectangle |
| 102 | 0.060 | 3.0 | Rectangle |
| 103 | 0.065 | 3.0 | Rectangle |
| 104 | 0.060 | 3.0 | Rectangle |
| 105 | 0.065 | 3.0 | Rectangle |
| 106 | 0.070 | 2.5 | Rectangle |
| 107 | 0.075 | 2.5 | Rectangle |
| 108 | 0.075 | 2.0 | Rectangle |
| 109 | 0.075 | 2.0 | Rectangle |

TABLE 3-continued (Evaluation with Electron Beam (50 KeV))

| | Resolution (μm) | Sensitivity (μC/cm$^2$) | Pattern Profile |
|---|---|---|---|
| 110 | 0.075 | 2.5 | Rectangle |
| 111 | 0.080 | 2.0 | Rectangle |
| 112 | 0.075 | 2.5 | Rectangle |
| 113 | 0.075 | 5.0 | Rectangle |
| 114 | 0.080 | 5.5 | Rectangle |
| 115 | 0.080 | 2.0 | Rectangle |
| 116 | 0.065 | 2.0 | Rectangle |
| 117 | 0.070 | 2.5 | Rectangle |
| 118 | 0.065 | 2.5 | Rectangle |
| Comparative Example | | | |
| 101 | 0.12 | 9.0 | Round top |
| 102 | 0.12 | 9.5 | Round top |
| 103 | 0.12 | 8.5 | Round top |
| 104 | 0.13 | 8.5 | Round top |
| 105 | 0.13 | 9.5 | Round top |

Examples 116 to 130 and Comparative Examples 106 to 110

A resist solution was prepared using the components shown in Table 2 above in a same manner as in Example 101. The resist solution was coated on a 6-inch silicon wafer using a spin coater (Mark 8 manufactured by Tokyo Electron Ltd.) and baked at 110° C. for 90 seconds to prepare a uniform film having a thickness of 0.30 μm.

The resist film was subjected to electron beam irradiation using an electron beam imaging device (HL 750 manufactured by Hitachi, Ltd.; acceleration voltage: 100 KeV). The treatment after the irradiation and the evaluation were conducted in the same manner as in Example 101.

The results of evaluation obtained are shown in Table 4 below.

TABLE 4

(Evaluation with Electron Beam (100 KeV))

| | Resolution (μm) | Sensitivity (μC/cm$^2$) | Pattern Profile |
|---|---|---|---|
| Example | | | |
| 119 | 0.050 | 6.0 | Rectangle |
| 120 | 0.050 | 5.0 | Rectangle |
| 121 | 0.055 | 6.0 | Rectangle |
| 122 | 0.055 | 6.0 | Rectangle |
| 123 | 0.055 | 6.0 | Rectangle |
| 124 | 0.050 | 5.0 | Rectangle |
| 125 | 0.050 | 5.0 | Rectangle |
| 126 | 0.065 | 5.0 | Rectangle |
| 127 | 0.060 | 6.0 | Rectangle |
| 128 | 0.065 | 5.0 | Rectangle |
| 129 | 0.065 | 5.0 | Rectangle |
| 130 | 0.065 | 5.0 | Rectangle |
| 131 | 0.065 | 5.0 | Rectangle |
| 132 | 0.060 | 6.0 | Rectangle |
| 133 | 0.065 | 5.0 | Rectangle |
| 134 | 0.050 | 5.5 | Rectangle |
| 135 | 0.050 | 5.5 | Rectangle |
| 136 | 0.055 | 6.0 | Rectangle |
| Comparative Example | | | |
| 106 | 0.11 | 13.0 | Round top |
| 107 | 0.11 | 13.0 | Round top |

TABLE 4-continued (Evaluation with Electron Beam (100 KeV))

| | Resolution (μm) | Sensitivity (μC/cm²) | Pattern Profile |
|---|---|---|---|
| 108 | 0.11 | 13.0 | Round top |
| 109 | 0.12 | 14.0 | Round top |
| 110 | 0.12 | 15.0 | Round top |

From the results shown in Tables 3 and 4, it can be seen that the positive resist composition of the present invention exhibits high sensitivity, high resolution and rectangular pattern profile and has excellent properties.

Examples 137 to 138 and Comparative Example 111

Using each of the resist solutions for Examples 101 and 102 and Comparative Example 101, a resist film was prepared in the same manner as in Example 101 except for changing the thickness of the resist film to 0.25 μm. The resist film was subjected to open-frame-exposure using an EUV beam (wavelength: 13 nm) while changing the exposure energy amount 0.5 mJ each from 0 to 5.0 mJ, and baked at 110° C. for 90 seconds. Then, using a 2.38% by weight aqueous solution of tetramethylammonium hydroxide (TMAH), dissolution speed at each exposure amount was measured to obtain a sensitivity curve. On the sensitivity curve, an exposure amount at which the dissolution speed was saturated was designated as sensitivity. Also, a dissolution contrast (γ value) was determined from a gradient of the sensitivity curve. As the γ value is larger, the dissolution contrast is better. The results obtained are shown in Table 5 below.

TABLE 5

(Evaluation with EUV)

| Example | Composition | Sensitivity (mJ/cm²) | γ Value |
|---|---|---|---|
| 137 | Example 101 | 3.0 | 9.5 |
| 138 | Example 102 | 2.0 | 10.5 |
| Comparative Example 111 | Comparative Example 101 | >5.0 | 6.5 |

From the results shown in Table 5, it can be seen that the positive resist composition of the present invention exhibits high sensitivity and high resolution and has excellent properties in the evaluation with EUV in comparison with the resist composition of Comparative Example.

Examples 201 to 214 and Comparative Examples 201 to 205

(1) Application of Resist Composition

Each of the components shown in Table 6 below in an amount described below was dissolved in 18.0 g (in total) of the solvent(s) to prepare a solution of negative resist composition.

| | |
|---|---|
| Alkali-soluble resin (BN) | 2.0 g |
| Acid generator in total | 0.20 g |
| Crosslinking agent (C) in total | 0.35 g |
| Basic compound (if desired) | 0.0080 g |
| Surface active agent (if desired) | 0.0040 g |

The solution of negative resist composition was filtered using a Teflon filter having a pore size of 0.1 μm, then coated on a silicon wafer subjected to a hexamethyldisilazane treatment using a spin coater (Mark 8 manufactured by Tokyo Electron Ltd.) and dried by heating at 110° C. for 90 seconds on a vacuum hot plate to prepare a resist film having a thickness of 0.3 μm.

TABLE 6

| | Resin (BN) | Crosslinking Agent (C) | Acid Generator | Solvent | Basic Compound | Surface Active Agent |
|---|---|---|---|---|---|---|
| Example | | | | | | |
| 201 | a-(2) | B-2 | A1-3/II-4f = 3/2 | S1/S3 = 80/20 | (4) | W1/W2 = 2/1 |
| 202 | a-(1) | B-2/MM-1 = 1/2 | A1-4/I-9 = 2/3 | S1/S6 = 80/20 | (4) | W1 |
| 203 | a-(93) | B-5 | A1-15/I-17 = 2/1 | S1/S7 = 75/25 | (9) | W1/W5 = 2/1 |
| 204 | a-(29) | B-17 | A1-13/I-37C = 1/1 | S1/S6/S10 = 65/20/15 | (1) | W1 |
| 205 | a-(57) | MM-1 | A1-7 | S1/S9 = 90/10 | (2) | W1 |
| 206 | a-(27) | B-3 | A1-1 | S1/S11 = 80/20 | (6) | W2 |
| 207 | a-(1) | B-4 | A1-12 | S1 | (3) | W1 |
| 208 | a-(57) | MM-1 | A1-20 | S3 | (5) | W1 |
| 209 | a-(93) | B-7 | BCFY | S1 | (9) | W5 |
| 210 | a-(30) | B-2 | A1-4 | S2 | (8) | W3 |
| 211 | a-(27) | MM-1 | A1-8 | S7 | (9) | W4 |
| 212 | a-(39) | B-11 | A1-3 | S4 | (6) | W1 |
| 213 | a-(91) | HM-0 | A1-5 | S8 | (7) | W1 |
| 214 | a-(32) | B-5/MM-1 = 1/1 | A1-14 | S6 | (1) | W1 |
| 215 | a-(2) | B-2 | A1-16/II-4f = | S1/S3 = | (4) | W1 |

TABLE 6-continued

| | | | | 3/2 | 80/20 | | |
|---|---|---|---|---|---|---|---|
| 216 | a-(2) | B-2 | A1-17/II-4f = 3/2 | S1/S3 = 80/20 | (4) | W1 |
| 217 | a-(2) | B-2 | A1-19/II-4f = 3/2 | S1/S3 = 80/20 | (4) | W1 |
| Comparative Example | | | | | | |
| 201 | a-(2) | B-2 | I-1 | S1/S3 = 80/20 | (4) | W1/W2 = 2/1 |
| 202 | a-(1) | B-2/MM-1 = 1/1 | I-9 | S1/S6 = 80/20 | (4) | W1 |
| 203 | a-(93) | B-5 | I-17 | S1/S2 = 75/25 | (9) | W1/W5 = 2/1 |
| 204 | a-(30) | B-1 | PAG-1 | S1 | (3) | W5 |
| 205 | a-(91) | B-17 | PAG-2 | S5 | (2) | W1 |

The composition (molar ratio) and molecular weight of each of Resins a-(1), a-(2), a-(3), a-(25), a-(27), a-(29), a-(30), a-(31), a-(32), a-(35), a-(39), a-(57), a-(91) and a-(93) shown in Table 6 are as follows:

| | | | |
|---|---|---|---|
| a-(1): | Mw = 15,000 | Mw/Mn = 1.1 | |
| a-(2): | Mw = 9,000 | Mw/Mn = 1.2 | |
| a-(3): | Mw = 8,000 | Mw/Mn = 1.3 | |
| a-(25): | x/y = 70/30 | Mw = 16,000 | Mw/Mn = 1.5 |
| a-(27): | x/y = 80/20 | Mw = 9,500 | Mw/Mn = 1.5 |
| a-(29): | x/y = 80/20 | Mw = 9,200 | Mw/Mn = 2.2 |
| a-(30): | x/y = 80/20 | Mw = 12,000 | Mw/Mn = 1.2 |
| a-(31): | x/y = 90/10 | Mw = 8,500 | Mw/Mn = 1.3 |
| a-(32): | x/y = 75/25 | Mw = 9,000 | Mw/Mn = 1.2 |
| a-(35): | x/y = 75/25 | Mw = 20,000 | Mw/Mn = 2.1 |
| a-(39): | x/y = 88/12 | Mw = 11,400 | Mw/Mn = 1.2 |
| a-(57): | x/y = 95/5 | Mw = 5,000 | Mw/Mn = 1.2 |
| a-(91): | x/y/z = 60/30/10 | Mw = 11,000 | Mw/Mn = 1.5 |
| a-(93): | x/y = 85/15 | Mw = 9,300 | Mw/Mn = 1.1 |

The abbreviations of components used in Table 6 are explained below.

Acid generator:
BCFY:

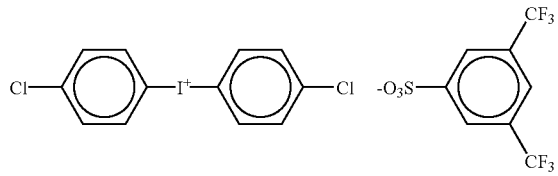

PAG-1:

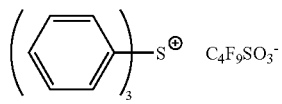

PAG-2

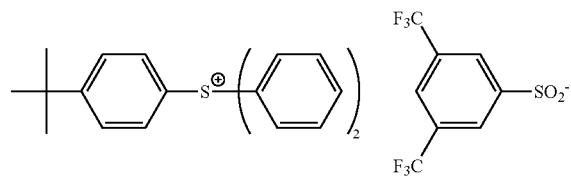

Basic Compounds:
(1): 1,8-Diazabicyclo[4.3.0]non-5-ene
(2): 2,6-Diisopropylaniline
(3): 4-Dimethylaminopyridine
(4): 2,4,5-Triphenylimidazole
(5): Piperazine
(6): 1,5-Diazabicyclo[4.3.0]non-5-ene
(7): Phenylguanidine
(8): Hexamethylenetetramine
(9): CHMETU Surface Active Agents:
W-1: Megafac F176 (manufactured by Dainippon Ink & Chemicals, Inc.) (fluorine-based)
W-2: Megafac R08 (manufactured by Dainippon Ink & Chemicals, Inc.) (fluorine- and silicon-based)

TABLE 6-continued

W-3: Polysiloxane polymer KP-341 (manufactured by Shin-Etsu Chemical Industry Co., Ltd.)
W-4: Polyoxyethylene phenyl ether
W-5: Troysol S-366 (manufactured by Troy Chemical Industries, Inc.)
Solvents:
S1: Propylene glycol monomethyl ether acetate
S2: Propylene glycol monomethyl ether propionate
S3: Ethyl lactate
S4: Butyl acetate
S5: 2-Heptanone
S6: Propylene glycol monomethyl ether
S7: Ethoxyethyl propionate
S8: γ-butyrolactone
S9: Ethylene carbonate
S10: Propylene carbonate
S11: Cyclohexanone
(2) Preparation and evaluation of resist pattern The resist film was subjected to electron beam irradiation using an electron beam imaging device (HL 750 manufactured by Hitachi, Ltd.; acceleration voltage: 50 KeV). After the irradiation, the resist film was heated by a vacuum hot plate at 110° C. for 60 seconds, immersed in a 2.38% by weight aqueous solution of tetramethylammonium hydroxide (TMAH) for 60 seconds to develop, rinsed with water for 30 seconds and dried. A cross-sectional shape of 0.15 μm-line (line:space=1:1) pattern formed was observed using a scanning electron microscope.

The minimum irradiation energy necessary for resolving 0.20 μm-line (line:space=1:1) was designated as the sensitivity.

Limiting resolution (line and space being separately resolved) at, the irradiation energy for obtaining the sensitivity described above was designated as the resolution. When the 0.20 μm-line (line:space=1:1) could not be resolved, limiting resolution was designated as the resolution.

The results of evaluation obtained are shown in Table 7 below.

TABLE 7

| | Resolution (μm) | Sensitivity (μC/cm$^2$) | Pattern Profile |
|---|---|---|---|
| Example | | | |
| 201 | 0.065 | 4.0 | Rectangle |
| 202 | 0.070 | 5.0 | Rectangle |
| 203 | 0.065 | 4.5 | Rectangle |
| 204 | 0.070 | 4.5 | Rectangle |
| 205 | 0.075 | 6.5 | Rectangle |
| 206 | 0.075 | 8.0 | Rectangle |
| 207 | 0.085 | 5.0 | Rectangle |
| 208 | 0.075 | 6.0 | Rectangle |
| 209 | 0.080 | 5.0 | Rectangle |
| 210 | 0.085 | 4.5 | Rectangle |
| 211 | 0.075 | 6.0 | Rectangle |
| 212 | 0.085 | 6.0 | Rectangle |
| 213 | 0.080 | 6.5 | Rectangle |
| 214 | 0.080 | 5.5 | Slightly round top |
| 215 | 0.065 | 5.5 | Rectangle |
| 216 | 0.070 | 5.5 | Rectangle |
| 217 | 0.070 | 6.0 | Rectangle |
| Comparative Example | | | |
| 201 | 0.12 | 12 | Round top |
| 202 | 0.13 | 10 | Round top |
| 203 | 0.12 | 11.5 | Round top |
| 204 | 0.13 | 12 | Round top |

TABLE 7-continued

| | Resolution (μm) | Sensitivity (μC/cm$^2$) | Pattern Profile |
|---|---|---|---|
| 205 | 0.13 | 10.5 | Round top |

From the results shown in Table 7, it can be seen that the negative resist composition of the present invention exhibits high sensitivity, high resolution and rectangular pattern profile and has excellent properties.

In case of using an X-ray imaging device for exposure, similar results were obtained.

According to the present invention, a positive or negative resist composition for an electron beam, EUV or X-ray, which is excellent in sensitivity and resolution and provides rectangular profile, can be provided.

The entire disclosure of each and every foreign patent application from which the benefit of foreign priority has been claimed in the present application is incorporated herein by reference, as if fully set forth herein.

While the invention has been described in detail and with reference to specific embodiments thereof, it will be apparent to one skilled in the art that various changes and modifications can be made therein without departing from the spirit and scope thereof.

What is claimed is:

1. A positive resist composition for an electron beam, EUV or X-ray comprising (A1) a compound that has a reduction potential higher than that of diphenyl iodonium salt and generates an acid upon irradiation of an actinic ray or radiation and (BP) a polymer that is insoluble or hardly soluble in an aqueous alkali solution but becomes soluble in the aqueous alkali solution by the action of an acid, wherein the polymer (BP) comprises a repeating unit derived from hydroxystyrene and is a polymer having a structural unit containing a group represented by formula (X1) or (X2) shown below:

$$-O-\underset{R_{2b}}{\overset{R_{1b}}{\underset{|}{C}}}-O-\left(\underset{R_{4b}}{\overset{R_{3b}}{\underset{|}{C}}}\right)_m-Z \quad (X1)$$

-continued

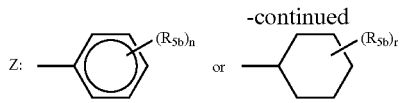

wherein $R_{1b}$ and $R_{2b}$, which may be the same or different, each represent a hydrogen atom or an alkyl group; $R_{3b}$ and $R_{4b}$, which may be the same or different, each represent a hydrogen atom, an alkyl group which may have a substituent or a cycloalkyl group which may have a substituent; $R_{5b}$ represents an alkyl group which may have a substituent, a cycloalkyl group which may have a substituent, an aryl group which may have a substituent or an aralkyl group which may have a substituent; m represents an integer of from 1 to 20; n represents an integer of from 0 to 5; and r represents an integer of from 0 to 11;

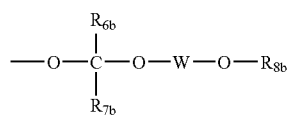

(X2)

wherein $R_{6b}$ and $R_{7b}$, which may be the same or different, each represent a hydrogen atom or an alkyl group; W represents a divalent organic group; and $R_{8b}$ represents an alkyl group which may have a substituent, a cycloalkyl group which may have a substituent, an aryl group which may have a substituent or an aralkyl group which may have a substituent.

2. The positive resist composition for an electron beam, EUV or X-ray as claimed in claim 1, wherein the compound of (A1) that has a reduction potential higher than that of diphenyl iodonium salt and generates an acid upon irradiation of an actinic ray or radiation is a compound represented by formula (1), (2) or (3) shown below:

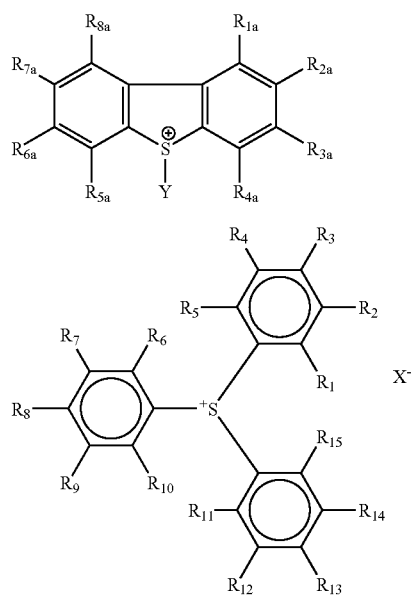

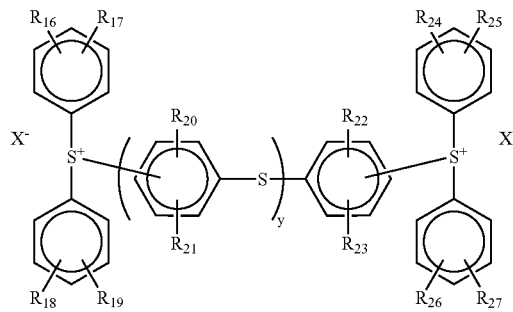

wherein Y represents an aryl group which may have a substituent or an alkyl group which may have a substituent; $R_{1a}$ to $R_{8a}$ each independently represent a hydrogen atom, a halogen atom, a nitro group, a cyano group, a carboxy group, an alkyl group which may have a substituent or a cycloalkyl group which may have a substituent; $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group; $R_{16}$ to $R_{27}$ each independently represent a hydrogen atom, a nitro group, a cyano group, a trifluoromethyl group or a halogen atom; y represents 0 or 1; and $X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

3. The resist composition for an electron beam, EUV or X-ray as claimed in claim 2, wherein the compound (A1) is a compound represented by formula (3) in which y represents 0.

4. A pattern-forming method which comprises
  (A) coating the resist composition of claim 3 on a substrate;
  (B) exposing the coated resist composition using an electron beam, EUV or X-Ray; and
  (C) developing the exposed resist composition.

5. The positive resist composition for an electron beam, EUV or X-ray as claimed in claim 2 wherein Y represents an aryl group having an electron attracting substituent or an alkyl group having an electron attracting substituent.

6. The positive resist composition for an electron beam, EUV or X-ray as claimed in claim 5, wherein the electron attracting substituent is selected from the group consisting of chlorine, bromine, iodine, a cyano group and a nitro group.

7. A pattern-forming method which comprises
  (A) coating the resist composition of claim 6 on a substrate;
  (B) exposing the coated resist composition using an electron beam, EUV or X-Ray; and
  (C) developing the exposed resist composition.

8. A pattern-forming method which comprises
(A) coating the resist composition of claim 5 on a substrate;
(B) exposing the coated resist composition using an electron beam, EUV or X-Ray; and
(C) developing the exposed resist composition.

9. The positive resist composition for an electron beam, EUV or X-ray as claimed in claim 2, wherein at least one of $R_{1a}$ to $R_{8a}$ represents an alkyl group having an electron attracting substituent or a cycloalkyl group having an electron attracting substituent, or at least one of $R_{1a}$ to $R_{8a}$ is an electron attracting substituent.

10. The positive resist composition for an electron beam, EUV or X-ray as claimed in claim 9, wherein the electron attracting substituent is selected from the group consisting of chlorine, bromine, iodine, a cyano group and a nitro group.

11. A pattern-forming method which comprises
(A) coating the resist composition of claim 10 on a substrate;
(B) exposing the coated resist composition using an electron beam, EUV or X-Ray; and
(C) developing the exposed resist composition.

12. A pattern-forming method which comprises
(A) coating the resist composition of claim 9 on a substrate;
(B) exposing the coated resist composition using an electron beam, EUV or X-Ray; and
(C) developing the exposed resist composition.

13. A pattern-forming method which comprises
(A) coating the resist composition of claim 2 on a substrate;
(B) exposing the coated resist composition using an electron beam, EUV or X-Ray; and
(C) developing the exposed resist composition.

14. The positive resist composition for an electron beam, EUV or X-ray as claimed in claim 1, which further comprises (A2) a compound that generates an acid upon irradiation of an actinic ray or radiation and has a structure represented by any one of formulae (I) to (III) shown below:

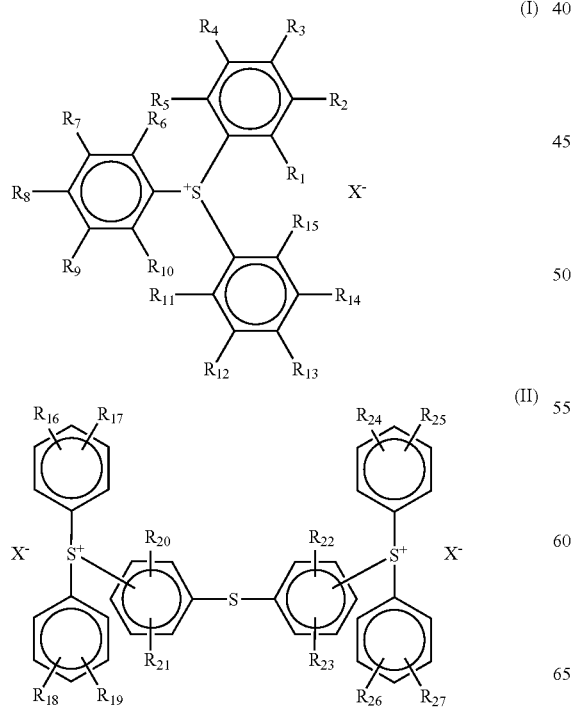

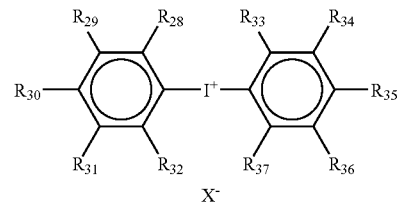

wherein $R_1$ to $R_{37}$, which may be the same or different, each represent a hydrogen atom, an alkyl group, an alkoxy group, a hydroxy group, a halogen atom or a group of —S—$R_{38}$; $R_{38}$ represents an alkyl group or an aryl group; and $X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

15. A pattern-forming method which comprises
(A) coating the resist composition of claim 14 on a substrate;
(B) exposing the coated resist composition using an electron beam, EUV or X-Ray; and
(C) developing the exposed resist composition.

16. The positive resist composition for an electron beam, EUV or X-ray as claimed in claim 1, which further comprises at least one compound selected from (A3) a compound that generates a carboxylic acid containing a fluorine atom upon irradiation of an actinic ray or radiation and (A4) a compound that generates a carboxylic acid free from a fluorine atom upon irradiation of an actinic ray or radiation.

17. The positive resist composition for an electron beam, EUV or X-ray as claimed in claim 16, wherein the compound of (A3) that generates a carboxylic acid containing a fluorine atom upon irradiation of an actinic ray or radiation is a compound represented by any one of formulae (IF) to (IIIF) shown below:

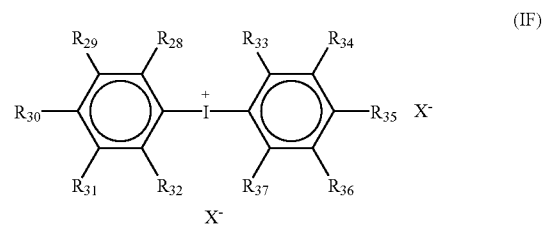

-continued

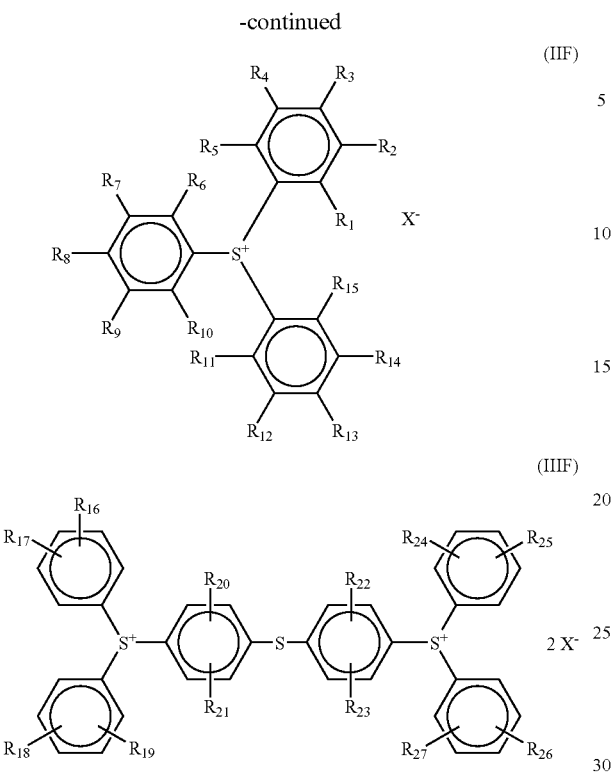

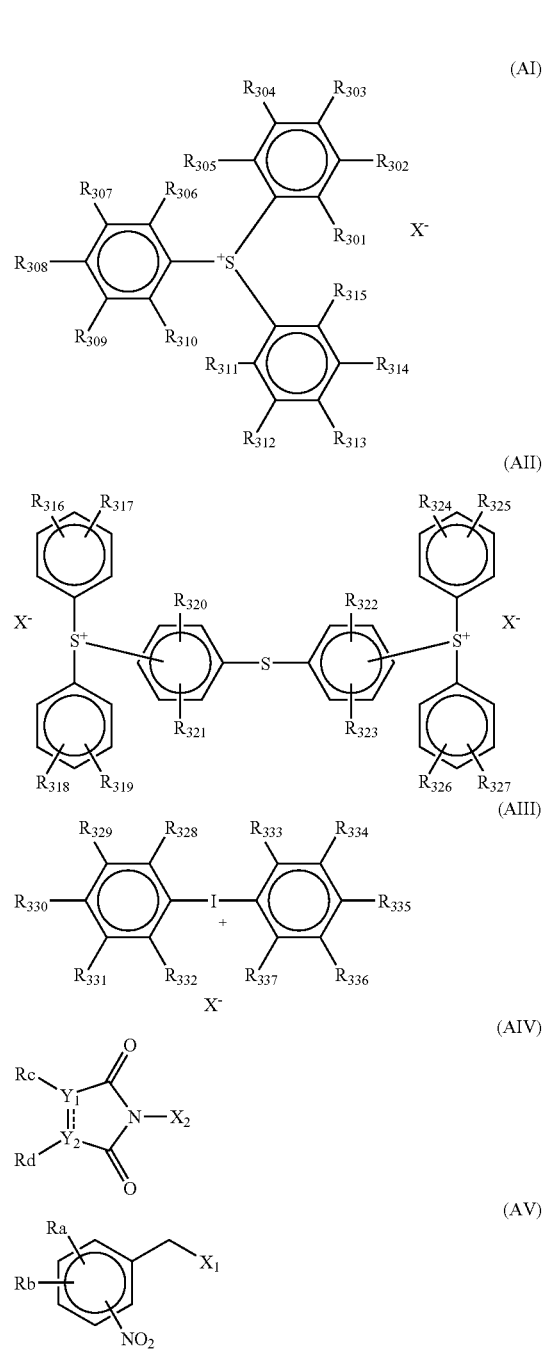

wherein $R_1$ to $R_{37}$ each independently represent a hydrogen atom, a straight chain, branched or cyclic alkyl group, a straight chain, branched or cyclic alkoxy group, a hydroxy group, a halogen atom or a group of —S—$R_{38}$; $R_{38}$ represents a straight chain, branched or cyclic alkyl group or an aryl group; and $X^-$ represents an anion of an aliphatic or aromatic carboxylic acid substituted with at least one fluorine atom.

18. A pattern-forming method which comprises (A) coating the resist composition of claim 17 on a substrate;

(B) exposing the coated resist composition using an electron beam, EUV or X-Ray; and (C) developing the exposed resist composition.

19. The positive resist composition for an electron beam, EUV or X-ray as claimed in claim 16, wherein the compound of (A4) that generates a carboxylic acid free from a fluorine atom upon irradiation of an actinic ray or radiation is a compound represented by any one of formulae (AI) to (AV) shown below:

wherein $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$; $R_0$ represents a straight chain, branched or cyclic alkyl group or an aryl group; $R_a$ and $R_b$ each independently represent a hydrogen atom, a nitro group, a halogen atom, an alkyl group which may have a substituent or an alkoxy group which may have a substituent; $R_c$ and $R_d$ each independently represent a halogen atom, an alkyl group which may have a substituent or an aryl group which may have a substituent, or $R_c$ and $R_d$ may be combined with each other to form an aromatic ring or a monocyclic or polycyclic hydrocarbon ring (the ring may contain an oxygen atom or a nitrogen atom); $Y_1$ and $Y_2$ each represent a carbon atom, and the $Y_1$-$Y_2$ bond may be a single bond or a double bond; $X^-$ represents an anion of at least one of carboxylic acid compounds represented by formulae shown below; and $X_1$ and $X_2$ each independently represent an ester group formed at the carboxy group of at least one of the carboxylic acid compounds represented by formulae shown below:

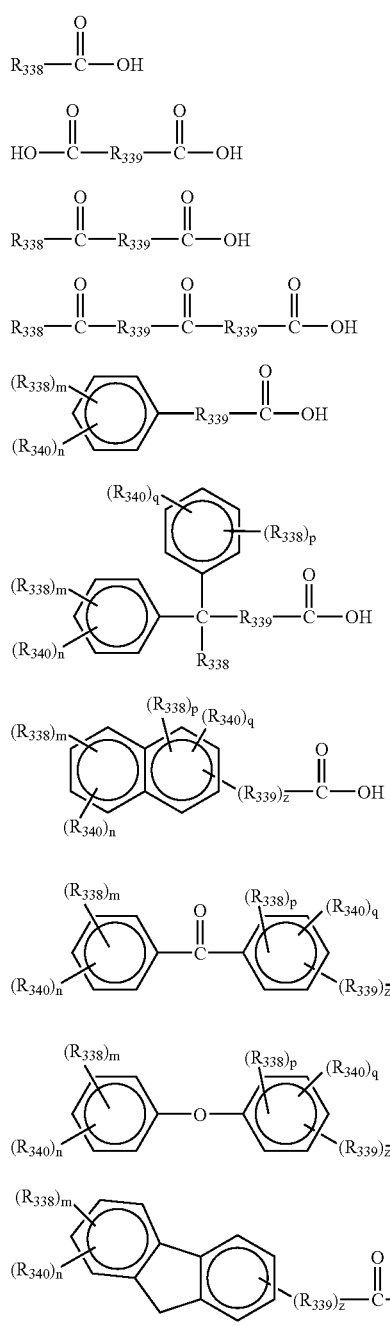

wherein $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 1 to 20 carbon atoms, a straight chain, branched or cyclic alkynyl group having from 1 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms; $R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 1 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxyalkylene group having from 2 to 20 carbon atoms; the plural $R_{338}$'s and $R_{339}$'s may be the same or different from each other; $R_{340}$ represents a hydroxy group or a halogen atom; the plural $R_{340}$'s may be the same or different from each other; and m, n, p and q each independently represent an integer of from 0 to 3, provided that $m+n \leqq 5$ and $p+q \leqq 5$; and z represents 0 or 1.

20. A pattern-forming method which comprises
(A) coating the resist composition of claim 19 on a substrate;
(B) exposing the coated resist composition using an electron beam, EUV or X-Ray; and
(C) developing the exposed resist composition.

21. A pattern-forming method which comprises
(A) coating the resist composition of claim 16 on a substrate;
(B) exposing the coated resist composition using an electron beam, EUV or X-Ray; and
(C) developing the exposed resist composition.

22. The resist composition for an electron beam, EUV or X-ray as claimed in claim 1, which further comprises an organic basic compound containing a structure represented by the following formula (A), (B), (C), (D) or (E):

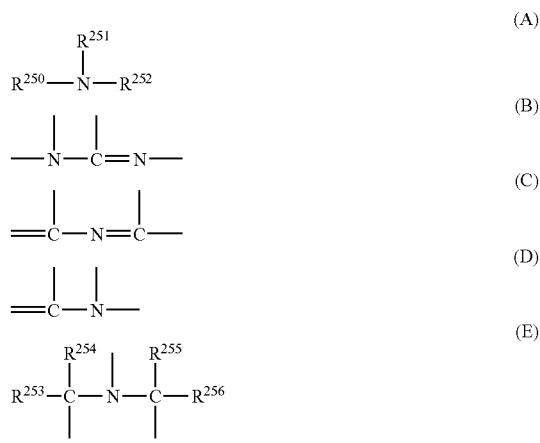

wherein $R^{250}$, $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be combined with each other to form a ring; and $R^{253}$, $R^{254}$, $R^{255}$ and $R^{256}$, which may be the same or different, each represent an alkyl group having from 1 to 6 carbon atoms.

23. A pattern-forming method which comprises
(A) coating the resist composition of claim 22 on a substrate;
(B) exposing the coated resist composition using an electron beam, EUV or X-Ray; and
(C) developing the exposed resist composition.

24. The resist composition for an electron beam, EUV or X-ray as claimed in claim 1, which further comprises a fluorine-based and/or silicon-based surface active agent.

25. A pattern-forming method which comprises
(A) coating the resist composition of claim 24 on a substrate;
(B) exposing the coated resist composition using an electron beam, EUV or X-Ray; and
(C) developing the exposed resist composition.

26. A pattern-forming method which comprises
(A) coating the resist composition of claim 1 on a substrate;
(B) exposing the coated resist composition using an electron beam, EUV or X-Ray; and
(C) developing the exposed resist composition.

27. A negative resist composition for an electron beam, EUV or X-ray comprising (A1) a compound that has a reduction potential higher than that of diphenyl iodonium salt and generates an acid upon irradiation of an actinic ray or radiation, (BN) an alkali-soluble resin, (C) a crosslinking agent crosslinking by the action of an acid, and (A2) a compound that generates an acid upon irradiation of an actinic ray or radiation and has a structure represented by any one of formulae (I) to (III) shown below:

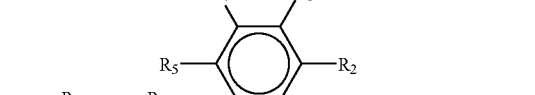

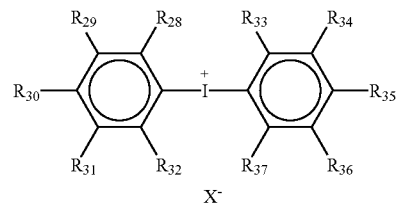

wherein $R_1$ to $R_{37}$, which may be the same or different, each represent a hydrogen atom, a straight chain, branched or cyclic alkyl group, a straight chain, branched or cyclic alkoxy group, a hydroxy group, a halogen atom or a group of —S—$R_{38}$; $R_{38}$ represents a straight chain, branched or cyclic alkyl group or an aryl group; and $X^-$ represents an anion of a benzenesulfonic acid, a naphthalenesulfonic acid or an anthracenesulfonic acid, having at least one member selected from a fluorine atom, a straight chain, branched or cyclic alkyl group substituted with at least one fluorine atom, a straight chain, branched or cyclic alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

28. The negative resist composition for an electron beam, EUV or X-ray as claimed in claim 27, wherein the compound of (A1) that has a reduction potential higher than that of diphenyl iodonium salt and generates an acid upon irradiation of an actinic ray or radiation is a compound represented by formula (1), (2) or (3) shown below:

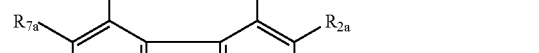

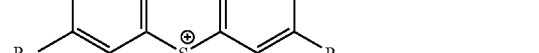

-continued (3)

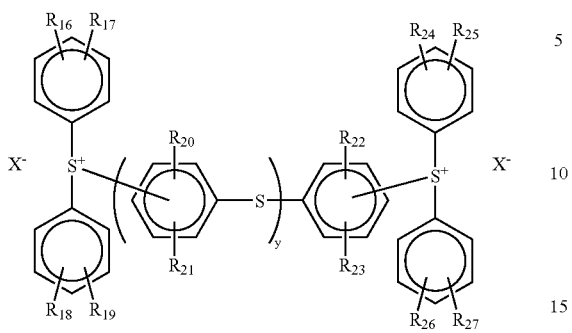

wherein Y represents an aryl group which may have a substituent or an alkyl group which may have a substituent; $R_{1a}$ to $R_{8a}$ each independently represent a hydrogen atom, a halogen atom, a nitro group, a cyano group, a carboxy group, an alkyl group which may have a substituent or a cycloalkyl group which may have a substituent; $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group; $R_{16}$ to $R_{27}$ each independently represent a hydrogen atom, a nitro group, a cyano group, a trifluoromethyl group or a halogen atom; y represents 0 or 1; and $X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

29. A pattern-forming method which comprises
(A) coating the resist composition of claim 28 on a substrate;
(B) exposing the coated resist composition using an electron beam, EUV or X-Ray; and
(C) developing the exposed resist composition.

30. The negative resist composition for an electron beam, EUV or X-ray as claimed in claim 27, which further comprises at least one compound selected from (A3) a compound that generates a carboxylic acid containing a fluorine atom upon irradiation of an actinic ray or radiation and (A4) a compound that generates a carboxylic acid free from a fluorine atom upon irradiation of an actinic ray or radiation.

31. A pattern-forming method which comprises
(A) coating the resist composition of claim 30 on a substrate;
(B) exposing the coated resist composition using an electron beam, EUV or X-Ray; and
(C) developing the exposed resist composition.

32. The negative resist composition for an electron beam, EUV or X-ray as claimed in claim 27, wherein the crosslinking agent of (C) crosslinking by the action of an acid is at least one compound selected from compounds represented by formulae (2) to (4) shown below and alkoxymethylated melamine compounds:

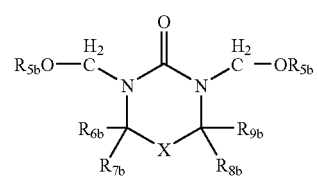

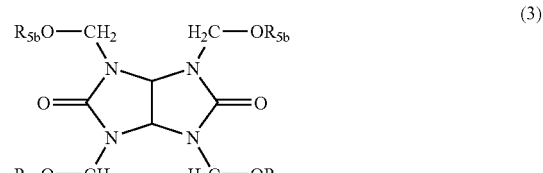

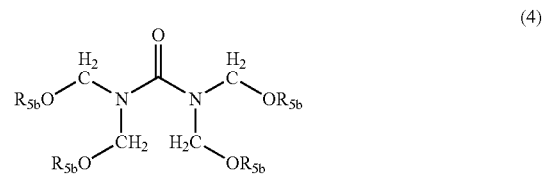

wherein, $R_{5b}$'s each independently represents a hydrogen atom, an alkyl group or an acyl group; $R_{6b}$ to $R_{9b}$ each independently represent a hydrogen atom, a hydroxy group, an alkyl group or an alkoxy group; and X represents a single bond, a methylene group or an oxygen atom.

33. A pattern-forming method which comprises
(A) coating the resist composition of claim 32 on a substrate;
(B) exposing the coated resist composition using an electron beam, EUV or X-Ray; and
(C) developing the exposed resist composition.

34. The negative resist composition for an electron beam, EUV or X-ray as claimed in claim 27, wherein the crosslinking agent of (C) crosslinking by the action of an acid is a compound selected from phenol derivatives having from 1 to 6 benzene rings and two or more hydroxymethyl groups and/or alkoxymethyl groups connected to any of the benzene rings per molecule.

35. A pattern-forming method which comprises
(A) coating the resist composition of claim 34 on a substrate;
(B) exposing the coated resist composition using an electron beam, EUV or X-Ray; and
(C) developing the exposed resist composition.

36. The negative resist composition for an electron beam, EUV or X-ray as claimed in claim 27, wherein the alkali-soluble resin of (BN) is a resin containing a repeating unit represented by the following formula (a):

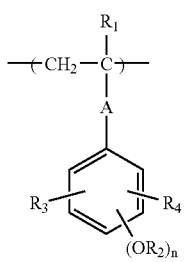

(a)

wherein $R_1$ represents a hydrogen atom, a halogen atom, a cyano group, an alkyl group which may have a substituent or a haloalkyl group which may have a substituent; $R_2$ represents a hydrogen atom, an alkyl group which may have a substituent, a cycloalkyl group which may have a substituent, an aryl group which may have a substituent, an aralkyl group which may have a substituent or an acyl group which may have a substituent; $R_3$ and $R_4$, which may be the same or different, each represent a hydrogen atom, a halogen atom, a cyano group, an alkyl group which may have a substituent, a cycloalkyl group which may have a substituent, an alkenyl group which may have a substituent, an aralkyl group which may have a substituent or an aryl group which may have a substituent; A represents a single bond, an alkylene group which may have a substituent, an alkenylene group which may have a substituent, a cycloalkylene group which may have a substituent, an arylene group which may have a substituent, —O—, —SO$_2$—, —O—CO—R$_5$—, —CO—O—R$_6$— or —CO—N(R$_7$)—R$_8$—; R$_5$, R$_6$ and R$_8$, which may be the same or different, each represent a single bond, an alkylene group which may have a substituent, an alkenylene group which may have a substituent, a cycloalkylene group which may have a substituent, an arylene group which may have a substituent, a divalent group formed by combining the above-described alkylene, alkenylene, cycloalkylene or arylene group and at least one member selected from an ether structure, an ester structure, an amido structure, a urethane structure and a ureido structure; R$_7$ represents a hydrogen atom, an alkyl group which may have a substituent, a cycloalkyl group which may have a substituent, an aralkyl group which may have a substituent or an aryl group which may have a substituent; n represents an integer of from 1 to 3; or plural R$_2$'s, R$_2$ and R$_3$ or R$_2$ and R$_4$ may be combined with each other to form a ring.

37. A pattern-forming method which comprises
(A) coating the resist composition of claim 36 on a substrate;
(B) exposing the coated resist composition using an electron beam, EUV or X-Ray; and
(C) developing the exposed resist composition.

38. A pattern-forming method which comprises
(A) coating the resist composition of claim 27 on a substrate;
(B) exposing the coated resist composition using an electron beam, EUV or X-Ray; and
(C) developing the exposed resist composition.

39. A positive resist composition for an electron beam, EUV or X-ray comprising:
(A1) a compound that has a reduction potential higher than that of diphenyl iodonium salt and generates an acid upon irradiation of an actinic ray or radiation and is represented by formula (1), (2) or (3) shown below, and
(A2) a compound that generates an acid upon irradiation of an actinic ray or radiation and has a structure represented by any one of formulae (I) to (III) shown below:

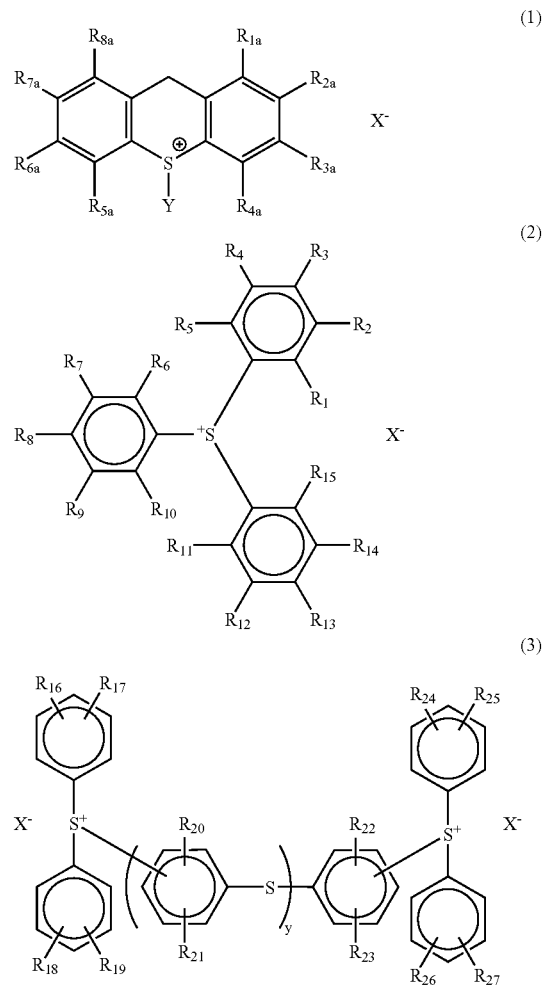

wherein Y represents an aryl group which may have a substituent or an alkyl group which may have a substituent; $R_{1a}$ to $R_{8a}$ each independently represent a hydrogen atom, a halogen atom, a nitro group, a cyano group, a carboxy group, an alkyl group which may have a substituent or a cycloalkyl group which may have a substituent; $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group; $R_{16}$ to $R_{27}$ each independently represent a hydrogen atom, a nitro group, a cyano group, a trifluoromethyl group or a halogen atom; y represents 0 or 1; and X$^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom, and wherein in formula (1) at least one electron attracting substituent is present as a substituent of Y, as one of $R_{1a}$ to $R_{8a}$, or on a substituent of $R_{1a}$ to $R_{8a}$, and (BP) a polymer that is insoluble or hardly soluble in an aqueous alkali solution but becomes soluble in the aqueous alkali solution by the action of an acid, wherein the polymer (BP) comprises a repeating unit derived from hydroxystyrene and is a polymer having a structural unit containing a tertiary ester group that is decomposed by the action of an acid;

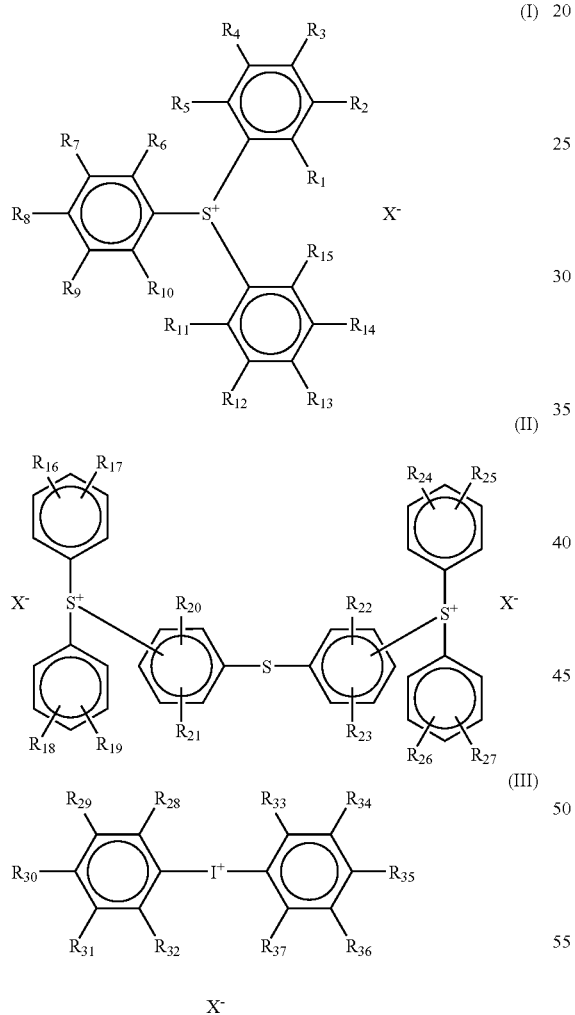

wherein $R_1$ to $R_{37}$, which may be the same or different, each represent a hydrogen atom, an alkyl group, an alkoxy group, a hydroxy group, a halogen atom or a group of —S—$R_{38}$; $R_{38}$ represents an alkyl group or an aryl group; and $X^-$ represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom.

40. The positive resist composition for an electron beam, EUV or X-ray as claimed in claim 39, which further comprises at least one compound selected from (A3) a compound that generates a carboxylic acid containing a fluorine atom upon irradiation of an actinic ray or radiation and (A4) a compound that generates a carboxylic acid free from a fluorine atom upon irradiation of an actinic ray or radiation.

41. The positive resist composition for an electron beam, EUV or X-ray as claimed in claim 40, wherein the compound of (A3) that generates a carboxylic acid containing a fluorine atom upon irradiation of an actinic ray or radiation is a compound represented by any one of formulae (IF) to (IIIF) shown below:

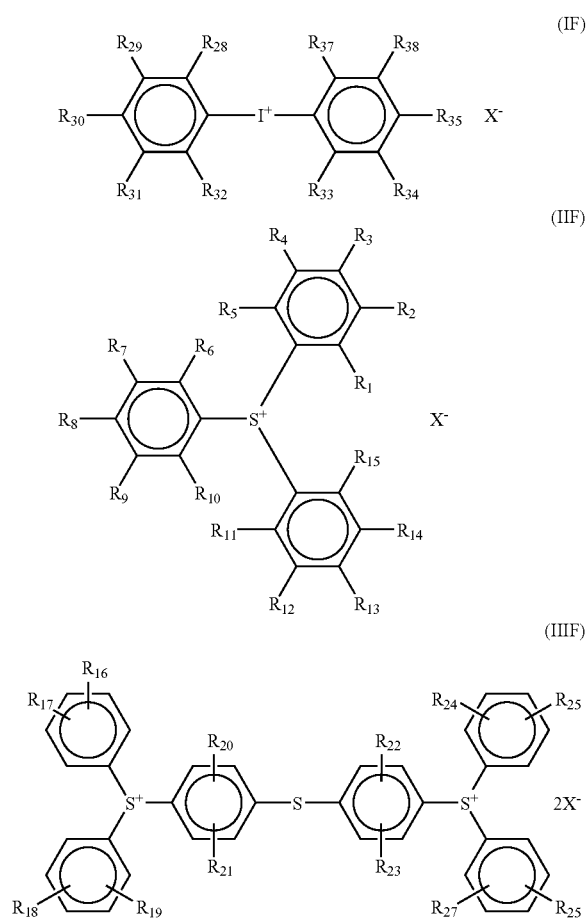

wherein $R_1$ to $R_{37}$ each independently represent a hydrogen atom, a straight chain, branched or cyclic alkyl group, a straight chain, branched or cyclic alkoxy group, a hydroxy group, a halogen atom or a group of —S—$R_{38}$; $R_{38}$ represents a straight chain, branched or cyclic alkyl group or an aryl group; and X⁻ represents an anion of an aliphatic or aromatic carboxylic acid substituted with at least one fluorine atom.

42. A pattern-forming method which comprises (A) coating the resist composition of claim 41 on a substrate;

(B) exposing the coated resist composition using an electron beam, EUV or X-Ray; and (C) developing the exposed resist composition.

43. The positive resist composition for an electron beam, EUV or X-ray as claimed in claim 40, wherein the compound of (A4) that generates a carboxylic acid free from a fluorine atom upon irradiation of an actinic ray or radiation is a compound represented by any one of formulae (AI) to (AV) shown below:

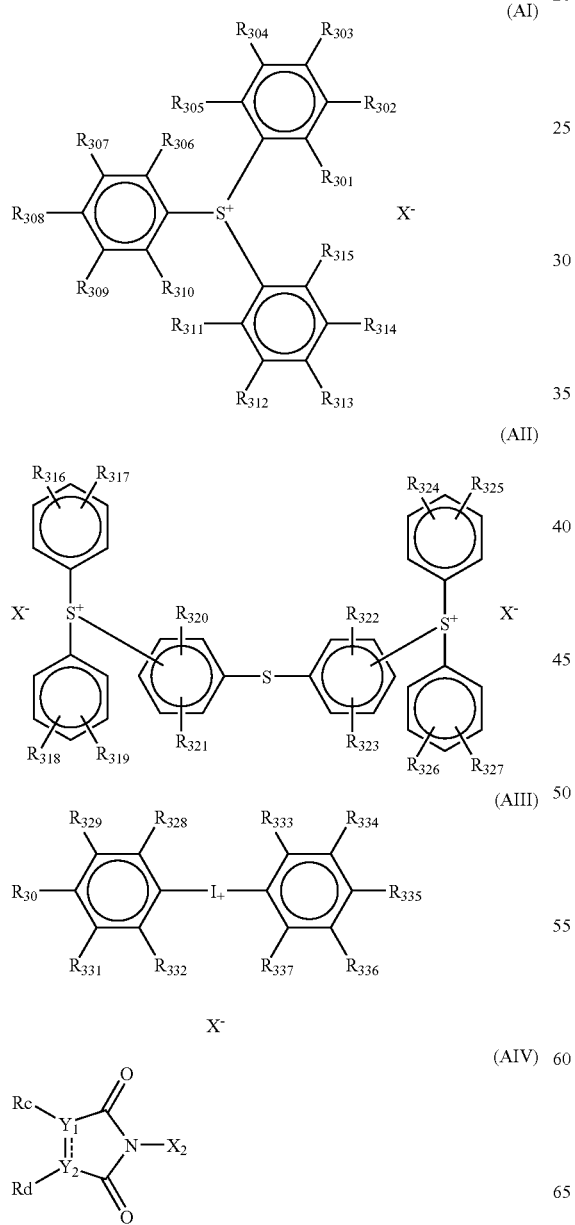

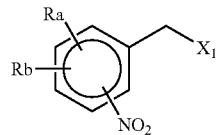

wherein $R_{301}$ to $R_{337}$ each independently represent a hydrogen atom, a straight chain, branched or cyclic alkyl group, a straight chain, branched or cyclic alkoxy group, a hydroxy group, a halogen atom or a group of —S—$R_0$; $R_0$ represents a straight chain, branched or cyclic alkyl group or an aryl group; $R_a$ and $R_b$ each independently represent a hydrogen atom, a nitro group, a halogen atom, an alkyl group which may have a substituent or an alkoxy group which may have a substituent; $R_c$ and $R_d$ each independently represent a halogen atom, an alkyl group which may have a substituent or an aryl group which may have a substituent, or $R_c$ and $R_d$ may be combined with each other to form an aromatic ring or a monocyclic or polycyclic hydrocarbon ring (the ring may contain an oxygen atom or a nitrogen atom); $Y_1$ and $Y_2$ each represent a carbon atom, and the $Y_1$-$Y_2$ bond may be a single bond or a double bond; X⁻ represents an anion of at least one of carboxylic acid compounds represented by formulae shown below; and $X_1$ and $X_2$ each independently represent an ester group formed at the carboxy group of at least one of the carboxylic acid compounds represented by formulae shown below:

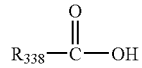

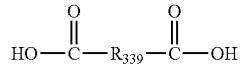

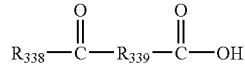

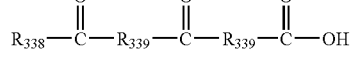

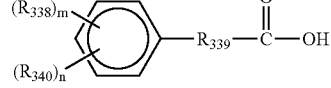

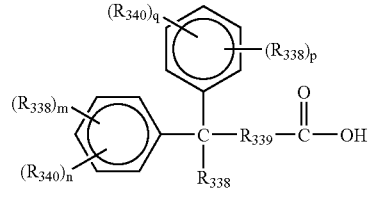

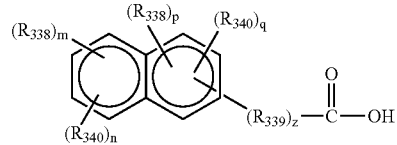

-continued

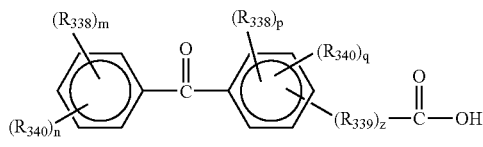
(C8)

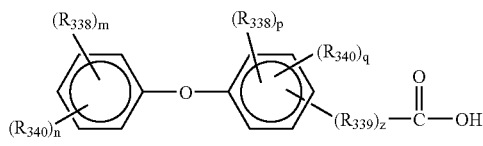
(C9)

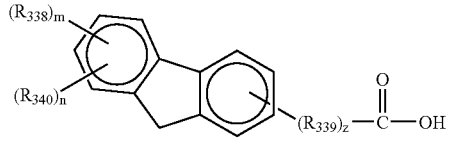
(C10)

wherein $R_{338}$ represents a straight chain, branched or cyclic alkyl group having from 1 to 30 carbon atoms (wherein the alkyl group may contain an oxygen atom or a nitrogen atom in the chain thereof), a straight chain, branched or cyclic alkenyl group having from 1 to 20 carbon atoms, a straight chain, branched or cyclic alkynyl group having from 1 to 20 carbon atoms, a straight chain, branched or cyclic alkoxy group having from 1 to 20 carbon atoms, the above alkyl group in which at least a part of the hydrogen atoms is substituted with a halogen atom and/or a hydroxy group, the above alkenyl group in which at least a part of the hydrogen atoms is substituted with a halogen atom and/or a hydroxy group or a substituted or unsubstituted aryl group having from 6 to 20 carbon atoms; $R_{339}$ represents a single bond, a straight chain, branched or cyclic alkylene group having from 1 to 20 carbon atoms (wherein the alkylene group may contain an oxygen atom or a nitrogen atom in the chain thereof), a straight chain, branched or cyclic alkenylene group having from 1 to 20 carbon atoms, the above alkylene group in which at least a part of the hydrogen atoms is substituted with a halogen atom and/or a hydroxy group, the above alkenylene group in which at least a part of the hydrogen atoms is substituted with a halogen atom and/or a hydroxy group or an alkoxyalkylene group having from 2 to 20 carbon atoms; the plural $R_{338}$'s and $R_{339}$'s may be the same or different from each other; $R_{340}$ represents a hydroxy group or a halogen atom; the plural $R_{340}$'s may be the same or different from each other; and m, n, p and q each independently represent an integer of from 0 to 3, provided that $m+n \leqq 5$ and $p+q \leqq 5$; and z represents 0 or 1.

44. A pattern-forming method which comprises
(A) coating the resist composition of claim 43 on a substrate;
(B) exposing the coated resist composition using an electron beam, EUV or X-Ray; and
(C) developing the exposed resist composition.

45. A pattern-forming method which comprises
(A) coating the resist composition of claim 40 on a substrate;
(B) exposing the coated resist composition using an electron beam, EUV or X-Ray; and
(C) developing the exposed resist composition.

46. The resist composition for an electron beam, EUV or X-ray as claimed in claim 39, which further comprises an organic basic compound containing a structure represented by the following formula (A), (B), (C), (D) or (E):

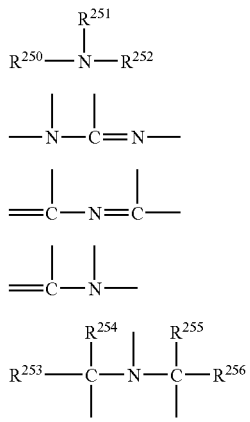

wherein $R^{250}$, $R^{251}$ and $R^{252}$, which may be the same or different, each represent a hydrogen atom, an alkyl group having from 1 to 6 carbon atoms, an aminoalkyl group having from 1 to 6 carbon atoms, a hydroxyalkyl group having from 1 to 6 carbon atoms or a substituted or unsubstituted aryl group having from 6 to 20 carbon atoms, or $R^{251}$ and $R^{252}$ may be combined with each other to form a ring; and $R^{253}$, $R^{254}$, $R^{255}$ and $R^{256}$, which may be the same or different, each represent an alkyl group having from 1 to 6 carbon atoms.

47. A pattern-forming method which comprises
(A) coating the resist composition of claim 46 on a substrate;
(B) exposing the coated resist composition using an electron beam, EUV or X-Ray; and
(C) developing the exposed resist composition.

48. The resist composition for an electron beam, EUV or X-ray as claimed in claim 39, which further comprises a fluorine-based and/or silicon-based surface active agent.

49. A pattern-forming method which comprises
(A) coating the resist composition of claim 48 on a substrate;
(B) exposing the coated resist composition using an electron beam, EUV or X-Ray; and
(C) developing the exposed resist composition.

50. The resist composition for an electron beam, EUV or X-ray as claimed in claim 39, wherein y represents 0.

51. A pattern-forming method which comprises
(A) coating the resist composition of claim 50 on a substrate;
(B) exposing the coated resist composition using an electron beam, EUV or X-Ray; and
(C) developing the exposed resist composition.

52. The positive resist composition for an electron beam, EUV or X-ray as claimed in claim 39, wherein the electron attracting substituent is selected from the group consisting of chlorine, bromine, iodine, a cyano group and a nitro group.

53. A pattern-forming method which comprises
(A) coating the resist composition of claim 52 on a substrate;
(B) exposing the coated resist composition using an electron beam, EUV or X-Ray; and
(C) developing the exposed resist composition.

54. A pattern-forming method which comprises
(A) coating the resist composition of claim 39 on a substrate;
(B) exposing the coated resist composition using an electron beam, EUV or X-Ray; and
(C) developing the exposed resist composition.

55. A positive resist composition for an electron beam, EUV or X-ray comprising (A1) a compound that has a reduction potential higher than that of diphenyl iodonium salt and generates an acid upon irradiation of an actinic ray or radiation and is represented by formula (1) or (2) shown below:

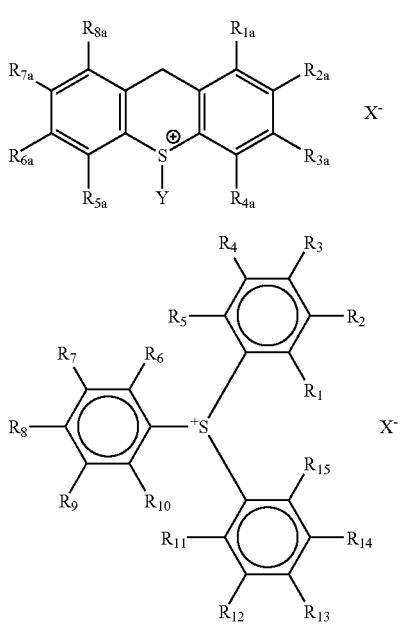

wherein Y represents an aryl group which may have a substituent or an alkyl group which may have a substituent; $R_{1a}$ to $R_{8a}$ each independently represent a hydrogen atom, a halogen atom, a nitro group, a cyano group, a carboxy group, an alkyl group which may have a substituent or a cycloalkyl group which may have a substituent; $R_1$ to $R_{15}$ each independently represent a hydrogen atom, a nitro group, a cyano group or a trifluoromethyl group, provided that at least two of $R_1$ to $R_{15}$ are groups selected from a nitro group, a cyano group and a trifluoromethyl group; and X⁻ in formula (2) represents an anion of an alkylsulfonic acid, a benzenesulfonic acid, a naphthalenesulfonic acid or an anthracenesulfonic acid, having at least one member selected from a fluorine atom, an alkyl group substituted with at least one fluorine atom, an alkoxy group substituted with at least one fluorine atom, an acyl group substituted with at least one fluorine atom, an acyloxy group substituted with at least one fluorine atom, a sulfonyl group substituted with at least one fluorine atom, a sulfonyloxy group substituted with at least one fluorine atom, a sulfonylamino group substituted with at least one fluorine atom, an aryl group substituted with at least one fluorine atom, an aralkyl group substituted with at least one fluorine atom and an alkoxycarbonyl group substituted with at least one fluorine atom, and wherein in formula (1) at least one electron attracting substituent is present as a substituent of Y, as one of $R_{1a}$ to $R_{8a}$, or on a substituent of $R_{1a}$ to $R_{8a}$ and the electron attracting substituent is selected from the group consisting of chlorine, bromine, iodine, a cyano group and a nitro group, and in formula (1) X⁻ represents an anion of an alkylsulfonic acid having from 4 to 20 carbon atoms in the alkyl group, an aromatic sulfonic acid containing a benzene ring or a naphthalene ring, a fluorinated alkylsulfonic acid having from 4 to 12 carbon atoms in the alkyl group, and a fluorinated aromatic sulfonic aid containing a benzene ring or a naphthalene ring, and (BP) a polymer that is insoluble or hardly soluble in an aqueous alkali solution but becomes soluble in the aqueous alkali solution by the action of an acid, wherein the polymer (BP) comprises a repeating unit derived from hydroxystyrene and is a polymer having a structural unit containing a tertiary ester group that is decomposed by the action of an acid.

56. A pattern-forming method which comprises
(A) coating the resist composition of claim 55 on a substrate;
(B) exposing the coated resist composition using an electron beam, EUV or X-Ray; and
(C) developing the exposed resist composition.

* * * * *